United States Patent
Onishi et al.

(10) Patent No.: US 7,042,046 B2
(45) Date of Patent: May 9, 2006

(54) SUPER-JUNCTION SEMICONDUCTOR DEVICE AND METHOD OF MANUFACTURING THE SAME

(75) Inventors: Yasuhiko Onishi, Nagano (JP); Tatsuhiko Fujihira, Nagano (JP); Katsunori Ueno, Nagano (JP); Susumu Iwamoto, Nagano (JP); Takahiro Sato, Nagano (JP); Tatsuji Nagaoka, Nagano (JP)

(73) Assignee: Fuji Electric Device Technology Co., Ltd., (JP)

( * ) Notice: Subject to any disclaimer, the term of this patent is extended or adjusted under 35 U.S.C. 154(b) by 50 days.

(21) Appl. No.: 10/925,407

(22) Filed: Aug. 25, 2004

(65) Prior Publication Data

US 2005/0017292 A1    Jan. 27, 2005

Related U.S. Application Data

(62) Division of application No. 10/735,501, filed on Dec. 12, 2003, which is a division of application No. 09/781,066, filed on Feb. 9, 2001, now Pat. No. 6,724,042.

(30) Foreign Application Priority Data

Feb. 9, 2000   (JP)   ............................. 2000-032160
Nov. 24, 2000  (JP)   ............................. 2000-357970

(51) Int. Cl.
  *H01L 29/76*  (2006.01)
  *H01L 23/58*  (2006.01)
(52) U.S. Cl. ............... 257/328; 257/339; 257/342; 257/401; 257/409; 257/495
(58) Field of Classification Search ............. 257/328, 257/329, 339, 342, 401, 409, 490, 494, 495
See application file for complete search history.

(56) References Cited

U.S. PATENT DOCUMENTS 4,754,310 A    6/1988   Coe   .......................... 357/13

(Continued)

FOREIGN PATENT DOCUMENTS

EP          0053854      2/1986

(Continued)

OTHER PUBLICATIONS

"Theory of Semiconductor Superjunction Devices"; Tatsuhiko Fujihira; Jpn. J. Appl. Phys. vol. 36 (1997), Part 1 No. 10, Oct. 1997; pp. 6254-6262.

*Primary Examiner*—Kenneth Parker
*Assistant Examiner*—Matthew E. Warren
(74) *Attorney, Agent, or Firm*—Rossi, Kimms & McDowell, LLP

(57) ABSTRACT

Disclosed is a semiconductor device facilitating a peripheral portion thereof with a breakdown voltage higher than the breakdown voltage in the drain drift layer without employing a guard ring or field plate. A preferred embodiment includes a drain drift region with a first alternating conductivity type layer formed of n drift current path regions and p partition regions arranged alternately with each other, and a breakdown withstanding region with a second alternating conductivity type layer formed of n regions and p regions arranged alternately with each other, the breakdown withstanding region providing no current path in the ON-state of the device and being depleted in the OFF-state of the device. Since depletion layers expand in both directions from multiple pn-junctions into n regions and p regions in the OFF-state of the device, the adjacent areas of p-type base regions, the outer area of the semiconductor chip and the deep area of the semiconductor chip are depleted. Thus, the breakdown voltage of breakdown withstanding region is higher than the breakdown voltage of drain drift region.

2 Claims, 30 Drawing Sheets

U.S. PATENT DOCUMENTS

| | | | |
|---|---|---|---|
| 5,141,889 A | 8/1992 | Terry et al. | 437/31 |
| 5,183,769 A | 2/1993 | Rutter et al. | 438/138 |
| 5,216,275 A | 6/1993 | Chen | 257/493 |
| 5,286,655 A | 2/1994 | Tsunoda | 437/6 |
| 5,292,672 A | 3/1994 | Akiyama et al. | 437/31 |
| 5,438,215 A | 8/1995 | Tihanyi | 257/401 |
| 5,798,554 A | 8/1998 | Grimaldi et al. | 257/329 |
| 6,081,009 A | 6/2000 | Neilson | 257/341 |
| 6,097,063 A | 8/2000 | Fujihira | 257/339 |
| 6,184,555 B1 | 2/2001 | Tihanyi et al. | 257/342 |
| 6,198,141 B1 | 3/2001 | Yamazaki et al. | 257/404 |
| 6,207,994 B1 | 3/2001 | Rumennik et al. | 257/342 |
| 6,274,904 B1 | 8/2001 | Tihanyi | 257/329 |
| 6,300,171 B1 | 10/2001 | Frisina | 438/140 |
| 6,307,246 B1 | 10/2001 | Nitta et al. | 257/493 |
| 6,475,864 B1 | 11/2002 | Sato et al. | 438/268 |
| 6,551,909 B1 | 4/2003 | Fujihira | 438/510 |
| 6,677,626 B1 | 1/2004 | Shindou et al. | 257/266 |
| 2001/0028083 A1 | 10/2001 | Onishi et al. | 257/328 |
| 2001/0046739 A1 | 11/2001 | Miyasaka et al. | 438/268 |

FOREIGN PATENT DOCUMENTS

| | | |
|---|---|---|
| JP | 54-22179 A | 2/1979 |
| JP | 1-93169 A | 4/1989 |
| JP | 401272158 A | 10/1989 |
| JP | 3-105975 A | 5/1991 |
| JP | 10-223896 A | 8/1998 |
| JP | 2000-40822 A | 2/2000 |
| JP | 2001-332726 A | 11/2001 |

SUPER-JUNCTION SEMICONDUCTOR DEVICE AND METHOD OF MANUFACTURING THE SAME

This application is a DIV of Ser. No. 10/735,501 filed on Dec. 12, 2003, which is a DIV of Ser. No. 09/781,066 filed on Feb. 9, 2001 now U.S. Pat No. 6,724,042.

FIELD OF THE INVENTION

The present invention relates to vertical power semiconductor devices that facilitate a high breakdown voltage and a high current capacity, such as MOSFET (insulated gate field effect transistors), IGBT (conductivity-modulation-type MOSFET), bipolar transistors and diodes. The present invention relates also to the method of manufacturing such semiconductor devices.

DESCRIPTION OF RELATED ART

Semiconductor devices may be roughly classified as lateral devices that arrange electrodes on a major surface, or vertical devices that distribute electrodes on both major surfaces facing opposite to each other. When a vertical semiconductor device is ON, a drift current flows in the thickness direction of the semiconductor chip (vertical direction). When the vertical semiconductor device is OFF, the depletion layers caused by applying a reverse bias voltage expand also in the vertical direction.

FIG. 28 is a cross sectional view of a conventional planar-type n-channel vertical MOSFET. Referring to FIG. 28, the vertical MOSFET includes an $n^+$-type drain layer 11 with low electrical resistance, a drain electrode 18 in electrical contact with $n^+$-type drain layer 11, a highly resistive $n^-$-type drain drift layer 12 on $n^+$ drain layer 11, p-type base regions 13 formed selectively in the surface portion of $n^-$-type drain drift layer 12, a heavily doped $n^+$-type source region 14 formed selectively in p-type base region 13, a heavily doped $p^+$-type contact region 19 formed selectively in p-type base region 13, a gate insulation film 15 on the extended portion of p-type base region 13 extended between $n^+$-type source region 14 and n-type drain drift layer 12, a gate electrode layer 16 on gate insulation film 15, and a source electrode 17 in electrical contact commonly with $n^+$-type source regions 14 and $p^+$-type contact regions 19.

In the vertical semiconductor device shown in FIG. 28, highly resistive $n^-$-type drain drift layer 12 works as a region for making a drift current flow vertically when the MOSFET is in the ON-state. In the OFF-state of the MOSFET, n-type drain drift layer 12 is depleted by the depletion layers expanding from the pn-junctions between drain drift layer 12 and p-type base regions 13 to obtain a high breakdown voltage. Thinning highly resistive $n^-$-type drain drift layer 12, that is shortening the drift current path, is effective for substantially reducing the on-resistance (resistance between the drain and the source) of the MOSFET, since the drift resistance is lowered in the ON-state of the device. However, when the drift current path in $n^-$-type drain drift layer 12 is shortened, the space between the drain and the source, into that the depletion layers expand from the pn-junctions between p-type base regions 13 and n-type drain drift layer 12 in the OFF-state of the device, is narrowed and the electric field strength in the depletion layers soon reaches the maximum (critical) value for silicon. Therefore, breakdown is caused before the voltage between the drain and the source reaches the designed breakdown voltage of the device.

A high breakdown voltage is obtained by thickening $n^-$-type drain drift layer 12. However, a thick $n^-$-type drain drift layer 12 inevitably causes high on-resistance and loss increase. In short, there exists a tradeoff relation between the on-resistance (current capacity) and the breakdown voltage of the MOSFET. The tradeoff relation exists in other semiconductor devices, such as IGBT, bipolar transistors and diodes, which include a drift layer.

European Patent 0 053 854, U.S. Pat. No. 5,216,275, U.S. Pat. No. 5,438,215, Japanese Unexamined Laid Open Patent Application H09(1997)-266311 and Japanese Unexamined Laid Open Patent Application H10(1998)-223896 disclose semiconductor devices, which include an alternating conductivity type drift layer formed of heavily doped vertical n-type regions and vertical p-type regions alternately laminated horizontally with each other.

FIG. 29 is a cross sectional view of the vertical MOSFET disclosed in U.S. Pat. No. 5,216,275. Referring to FIG. 29, the vertical MOSFET of FIG. 29 is different from the vertical MOSFET of FIG. 28 in that the vertical MOSFET of FIG. 29 includes an alternating conductivity type drain drift layer 22, that is not a single-layered one but formed of n drift current path regions 22a and p partition regions 22b alternately laminated horizontally with each other. Even when the impurity concentrations in the alternating conductivity type layer are high, the alternating conductivity type layer facilitates obtaining a high breakdown voltage, since depletion layers expand laterally from the pn-junctions extending vertically across the alternating conductivity type layer in the OFF-state of the device, completely depleting drain drift layer 22.

Hereinafter, the semiconductor device including an alternating conductivity type drain drift layer will be referred to as the super-junction semiconductor device.

In the super-junction semiconductor device, a high breakdown voltage is obtained in the alternating conductivity type drain drift layer beneath p-type base regions 13 (an active region of the device) formed in the surface portion of the semiconductor chip. However, the electric field strength in the depletion layers soon reaches the maximum (critical) value for silicon in the circumferential region of the alternating conductivity type drain drift layer (the peripheral region of the device), since the depletion layers from the pn-junction between drain drift layer 22 and the outermost p-type base region 13 does not completely expand outward nor to the bottom of the semiconductor chip. Therefore, the local breakdown voltage in the peripheral region of drain drift layer 22, that is the local breakdown voltage in the peripheral region of the device, is not high enough.

The conventional guard ring formed for controlling the depletion electric field on the peripheral surface portion of the device or the conventional field plate structure formed for controlling the depletion electric field on the insulation film may be used to obtain a high local breakdown voltage in the peripheral region of the device adjacent to the outermost p-type base region 13. It is difficult, however, to optimize the integral structure integrating the alternating conductivity type drain drift layer 22 for obtaining a higher breakdown voltage and the conventional guard ring or the conventional field plate for obtaining a certain local breakdown voltage in the peripheral region of the device. In other words, it is difficult to correct the depletion electric field by an external means added from outside such as the integral structures described above. The reliability of semiconductor device having such an external means for correcting depletion electric field is not high. Since the deep portion of the device spaced apart from the guard ring is not depleted, the local breakdown voltage in the peripheral region of the device is not so high as the breakdown voltage in the drain drift layer 22. Therefore, the conventional guard ring or the conventional field plate is not effective to provide the entire device structure with a high breakdown voltage nor to fully utilize the functions of the alternating conductivity type drain drift layer. It is also necessary to employ the steps of forming masks for realizing the integral structure, implanting impurity, driving the implanted impurity atoms, depositing metal films, patterning the deposited metal films and such additional steps for manufacturing the super-junction semiconductor device.

SUMMARY OF THE INVENTION

It is an object of the present invention to provide a super-junction semiconductor device that facilitates providing the peripheral region thereof with a breakdown voltage higher than the breakdown voltage in the drain drift layer without employing a guard ring or field plate.

It is still another object of the invention to provide the manufacturing methods suitable for manufacturing the super-junction semiconductor devices described above.

To achieve this and other objects of the present invention, a semiconductor device comprises a semiconductor chip having a first major surface and a second major surface opposing the first major surface; an active region on a side of the first major surface; a layer of a first conductivity type on a side of the second major surface, the layer of the first conductivity type exhibiting relatively low electrical resistance; a first main electrode electrically connected to the active region; a second main electrode electrically connected to the layer of the first conductivity type; a drain drift region between the active region and the layer of the first conductivity type, the drain drift region providing a vertical drift current path in the ON-state of the device and being depleted in the OFF-state of the device; and a breakdown withstanding region around the drain drift region and between the first major surface and the layer of the first conductivity type, the breakdown withstanding region providing no current path in the ON-state of the device and being depleted in the OFF-state of the device, the breakdown withstanding region comprising an alternating conductivity type layer comprising first regions of the first conductivity type and second regions of a second conductivity type, the first regions and the second regions being arranged alternately with each other.

According to another aspect of the present invention, a semiconductor device comprises a semiconductor chip having a first major surface and a second major surface opposing the first major surface; an active region on a side of the first major surface; a layer of a first conductivity type on a side of the second major surface, the layer of the first conductivity type exhibiting relatively low electrical resistance; a first main electrode electrically connected to the active region; a second main electrode electrically connected to the layer of the first conductivity type; a drain drift region between the active region and the layer of the first conductivity type, the drain drift region providing a vertical drift current path in the ON-state of the device and being depleted in the OFF-state of the device; and a breakdown withstanding region around the drain drift region and between the first major surface and the layer of the first conductivity type, the breakdown withstanding region providing no current path in the ON-state of the device and being depleted in the OFF-state of the device, the breakdown withstanding region comprising a highly resistive region doped with an impurity of the first conductivity type and an impurity of the second conductivity type.

According to yet another aspect of the present invention, there is a method of manufacturing a semiconductor device. The method comprises (a) growing a highly resistive first epitaxial layer of a first conductivity type on a semiconductor substrate of the first conductivity type, the semiconductor substrate exhibiting relatively low electrical resistance; (b) selectively implanting an impurity of the first conductivity type into the first epitaxial layer through first windows and an impurity of a second conductivity type into the first epitaxial layer through second windows, the first windows and the second windows being arranged alternately with each other and spaced apart from each other regularly; (c) growing a highly resistive second epitaxial layer of the first conductivity type on the first epitaxial layer; (d) repeating the steps (b) and (c); and (e) thermally driving the implanted impurities from the diffusion centers thereof, whereby to connect unit diffusion regions of the same conductivity type vertically and whereby to form the first alternating conductivity type layer and the second alternating conductivity type layer.

According to yet another aspect of the present invention, there is a method of manufacturing a semiconductor device. The method comprises (a) growing a highly resistive first epitaxial layer of a first conductivity type on a semiconductor substrate with low electrical resistance; (b) implanting an impurity of the first conductivity type into the entire surface portion of the first epitaxial layer and selectively implanting an impurity of a second conductivity type into the first epitaxial layer through windows spaced apart from each other regularly; (c) growing a highly resistive second epitaxial layer of the first conductivity type on the first epitaxial layer; (d) repeating the steps (b) and (c); and (e) thermally driving the implanted impurities, whereby to connect unit diffusion regions of the second conductivity type vertically and whereby to form the first alternating conductivity type layer and the second alternating conductivity type layer.

BRIEF DESCRIPTION OF THE DRAWINGS

The accompanying drawings, which are incorporated in and which constitute a part of this specification, illustrate embodiments of the invention. Throughout the drawings, corresponding parts are labeled with corresponding reference numbers.

DESCRIPTION OF THE PREFERRED EMBODIMENTS

The present invention will now be described with reference to the accompanied drawing figures which illustrate the preferred embodiments of the invention. In the following, the n-type layer (n layer) or the n-type region (n region) is a layer or a region in which electrons are the majority carriers. The p-type layer (p layer) or the p-type region (p region) is a layer or a region in which holes are the majority carriers. The $n^+$-type region ($n^+$ region) or the $p^+$-type region ($p^+$ region) is a region doped relatively heavily. The $n^-$-type region ($n^-$ region) or the $p^-$-type region ($p^-$ region) is a region doped relatively lightly.

In the preferred embodiments, the breakdown withstanding region (the peripheral region or the circumferential region) surrounding the drain drift region of a semiconductor device is formed of an alternating conductivity type layer or a highly resistive layer, wherein an impurity of a first conductivity type and an impurity of a second conductivity type are doped such that the resulting carrier concentration in the highly resistive layer is zero or almost zero.

First Embodiment

Figure 1A:
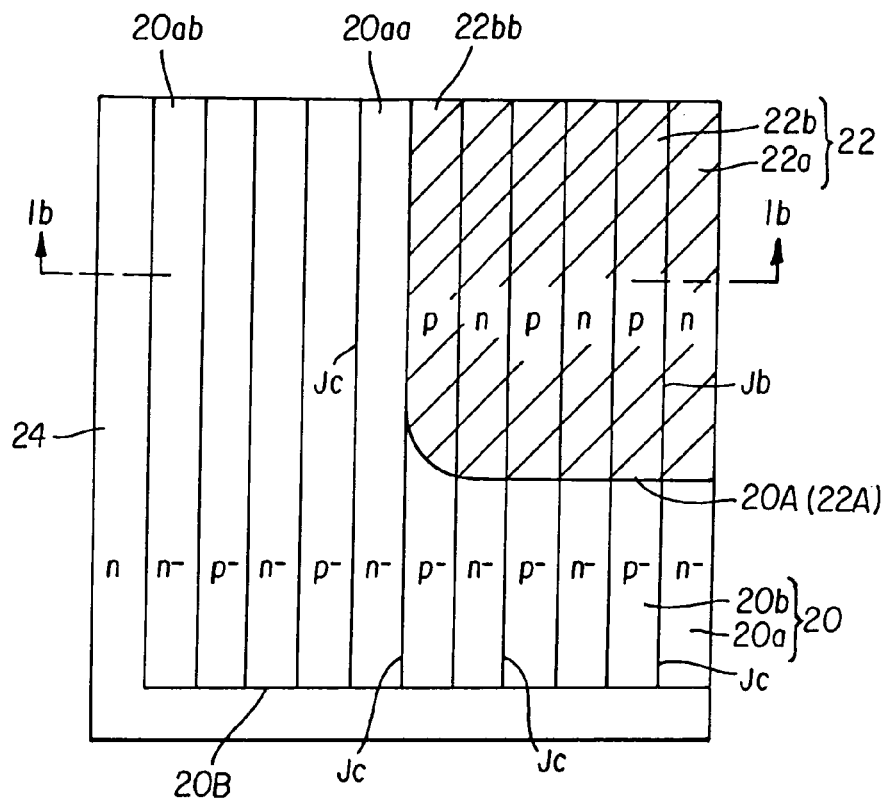
FIG. 1(a) is a horizontal cross sectional view showing a drain drift region and a breakdown withstanding region of an n-channel vertical MOSFET according to the first embodiment of the invention.
Figure 1B:
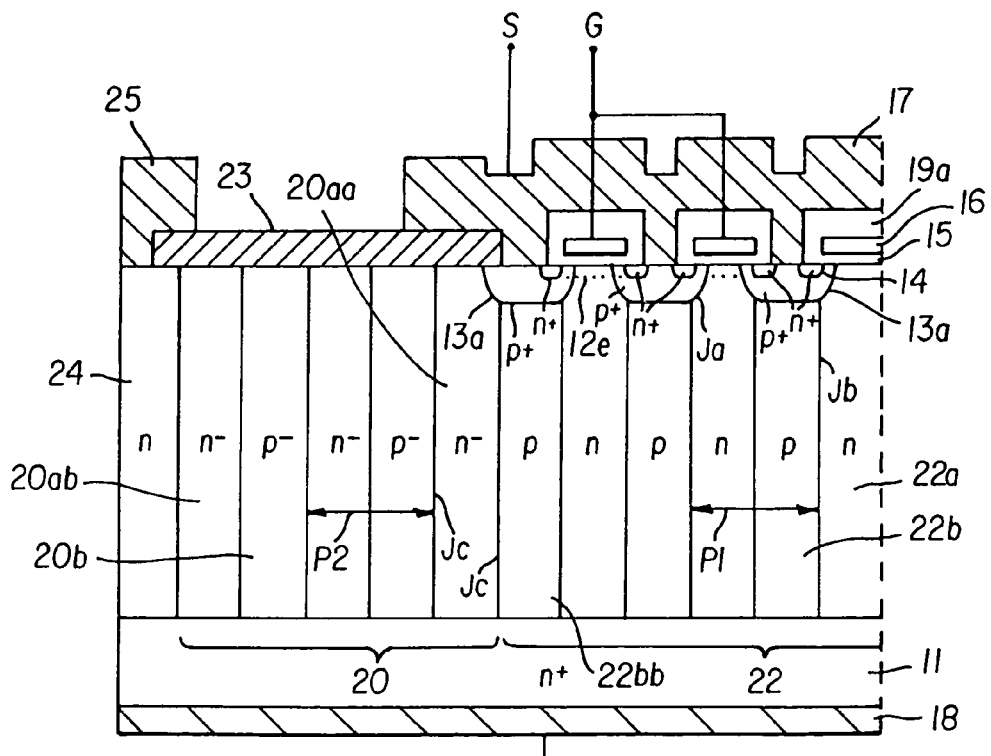
FIG. 1(b) is the vertical cross sectional view along 1(b)—1(b) of FIG. 1(a).

FIG. 1(a) is a horizontal cross sectional view showing a drain drift region and a breakdown withstanding region of a vertical super-junction MOSFET according to a first embodiment of the invention. FIG. 1(b) is the vertical cross sectional view along 1(b)—1(b) of FIG. 1(a). In FIG. 1(a), a quarter part of the drain drift region is illustrated by hatching. In these figures, the alternating conductivity type layers are mainly illustrated for the ease of understanding.

Referring to FIG. 1(b), the n-channel vertical MOSFET includes an $n^+$-type drain layer ($n^+$-type drain contact layer) 11; a drain electrode 18 in electrical contact with $n^+$ drain layer 11; a drain drift region 22 including a first alternating conductivity type layer on $n^+$ drain layer 11; heavily doped p-type base regions (p-type well region) 13a, which constitute an active region of the device, formed selectively in the surface portion of drain drift region 22; a heavily doped $n^+$-type source region 14 formed selectively in p-type base region 13a; a gate insulation film 15 on the semiconductor chip; a polysilicon gate electrode layer 16 on gate insulation film 15; and a source electrode 17 in electrical contact with $n^+$-type source regions 14 and p-type base regions 13a through contact holes bored through an interlayer insulation film 19a. The $n^+$-type source region 14 is formed in the surface portion of the p-type base region 13a, constituting a double-diffusion-type MOS structure. Although not shown in FIGS. 1(a) and 1(b), gate wiring metal films are in electrical contact with gate electrode layers 16.

As described below, the first alternating conductivity type layer in drain drift region 22 is a laminate formed by epitaxially growing n-type layers on a substrate (n+ drain layer 11). The first alternating conductivity type layer includes n drift current path regions 22a and p partition regions 22b. The n drift current path regions 22a and p partition regions 22b extend vertically (in parallel to the thickness direction of the semiconductor chip) and alternately laminated horizontally with each other. In the first embodiment, the upper end of n drift current path region 22a reaches a channel region 12e in the surface portion of the semiconductor chip, and the lower end of n drift current path region 22a is in contact with n+ drain layer 11. The upper end of p partition region 22b is in contact with the well bottom of p-type base region 13a, and the lower end of p partition region 22b is in contact with n+ drain layer 11. The width P1 of a pair of n drift current path region 22a and p-type partition region 22b may be much thinner than that of the illustrated pair of n-type drift current path region and p-type partition region. In this case, it is preferable to extend the boundary between n drift current path regions 22a and p partition regions 22b in perpendicular to the horizontal extending direction of p-type base regions 13a.

A second alternating conductivity type layer formed of n− regions 20a and p− regions 20b is in a breakdown withstanding region (peripheral region of the device) 20 outside vertical drain drift region 22 and between the semiconductor chip surface and n+ drain layer 11. The n− regions 20a and p− regions 20b are extended vertically and alternately laminated horizontally with each other. The pitch of repeating P2, at that a pair of n− region 20a and p− region 20b is repeated is the same with the pitch of repeating P1, at that a pair of n drift current path region 22a and p partition region 22b is repeated. However, the second alternating conductivity type layer in breakdown withstanding region 20 is doped more lightly than the first alternating conductivity type layer in drain drift region 22. Therefore, the resistance of the second alternating conductivity type layer is higher than the resistance of the first alternating conductivity type layer. In FIGS. 1(a) and 1(b), n− regions 20a and p− regions 20b are extended almost in parallel to n drift current path regions 22a and p partition regions 22b. Alternatively, n− regions 20a and p− regions 20b may be extended in perpendicular or obliquely to n drift current path regions 22a and p partition regions 22b. In FIGS. 1(a) and 1(b), the second alternating conductivity type layer in breakdown withstanding region 20 has a laminate (multi-layer) structure. Since breakdown withstanding region 20 does not provide any current path, the regions of any one conductivity type in the second alternating conductivity type layer may be shaped as a three-dimensional lattice, a dimensional network or a honeycomb. The regions of the same conductivity type may be connected with each other or spaced apart from each other.

An inner plane 20A, on that the end faces of n− regions 20a and p− regions 20b of breakdown withstanding region 20 are arranged alternately, is bonded to the plane 22A, on that the end faces of n drift current path regions 22a and p partition regions 22b of drain drift region 22 are arranged alternately. The boundary plane of the innermost n−region 20aa is bonded to the boundary plane of the outermost p partition region 22bb.

An insulation film 23 such as a thermally oxidized film or a phosphate-silicate glass (PSG) film is formed on the second alternating conductivity type layer in breakdown withstanding region 20 to protect and to stabilize the surface of breakdown withstanding region 20. Source electrode 17 is above gate electrodes 16 with interlayer insulation film 19a interposed therebetween and extended onto insulation film 23 to work as a field plate.

An n-type surrounding region 24, exhibiting low electrical resistance and extending in the thickness direction of the semiconductor chip, is arranged around the second alternating conductivity type layer in breakdown withstanding region 20. As shown in FIG. 1(a), the boundary plane of n-type surrounding region 24 is in contact with the boundary plane of the outermost n− region 20ab of the second alternating conductivity type layer and an outer plane 20B, on that the end faces of n− regions 20a and p− regions 20b are arranged alternately. The upper end of n-type surrounding region 24 is in contact with a peripheral electrode 25, the potential thereof is the same with the potential of drain electrode 18, and the lower end of n-type surrounding region 24 is in contact with n+ drain layer 11.

The n-channel vertical MOSFET shown in FIGS. 1(a) and (b) operates in the following manner. When a certain positive voltage is applied to gate electrodes 16, the MOSFET is brought into its ON-state, and inversion layers are created in the surface portions of p-type base regions 13a beneath the respective gate electrodes 16. Electrons are injected from source regions 14 to channel regions 12e via the inversion layers. The injected electrons reach n+ drain layer 11 via drift current path regions 22a, connecting drain electrode 18 and source electrode layer 17 electrically.

When the positive voltage applied to gate electrodes 16 is removed, the MOSFET is brought into its OFF-state. The inversion layers in the surface portions of p-type base regions 13a vanish, electrically disconnecting drain electrode 18 and source electrode layer 17 from each other. When the reverse bias voltage (the voltage between the source and the drain) is high in the OFF-state of the MOSFET, depletion layers expand from the pn-junctions Ja between p-type base regions 13a and channel regions 12e into p-type base regions 13a and channel regions 12e, depleting p-type base regions 13a and channel regions 12e. Since partition regions 22b in drain drift region 22 are electrically connected to source electrode 17 via p-type base regions 13a and drift current path regions 22a in drain drift region 22 are electrically connected to drain electrode 18 via n+ drain layer 11, depletion layers expand also from the pn-junctions Jb between partition regions 22b and drift current path regions 22a to partition regions 22b and drift current path regions 22a, accelerating the depletion of drain drift region 22. Since drain drift region 22 is provided with a high breakdown voltage as described above, drain drift region 22 can be doped heavily and a high current capacity is obtained in drain drift region 22.

As described above, the second alternating conductivity type layer is in breakdown withstanding region 20 outside drain drift region 22. The p− regions 20b in the second alternating conductivity type layer extended from p partition regions 22b of the first alternating conductivity type layer are electrically connected to source electrode 17 via p-type base region 13a. The p− regions 20b not connected to any partition region 22b are floated and work as deeply extended guard rings. The n− regions 20a of the second alternating conductivity type layer are electrically connected to drain electrode 18 via n+ drain layer 11. Due to the structure described above, breakdown withstanding region 20 is depleted almost across the thickness of the second alternating conductivity type layer by the depletion layers expanding from the pn-junctions Jc in the second alternating conductivity type layer. The structure described above facilitates depleting not only the surface side area of drain drift region 22 on the side of breakdown withstanding region 20 as the conventional guard ring structure or the conventional field plate structure does but also the outer area of breakdown withstanding region 20 and the substrate side area of breakdown withstanding region 20. Therefore, the structure described above facilitates relaxing the electric field strength in breakdown withstanding region 20 and obtaining a high breakdown voltage. Thus, a super-junction semiconductor device exhibiting a high breakdown voltage is realized.

According to the first embodiment, the second alternating conductivity type layer is doped more lightly than the first alternating conductivity type layer. Therefore, the resistance of the second alternating conductivity type layer is higher than that of the first alternating conductivity type layer. Since the second alternating conductivity type layer is depleted more quickly than the first alternating conductivity type layer, the breakdown withstanding reliability is high. When the pitch of repeating P2 in the second alternating conductivity type layer is narrower than the pitch of repeating P1 in the first alternating conductivity type layer, the breakdown withstanding reliability is further improved.

An n-type surrounding region 24 with low resistance surrounds the side faces of the second alternating conductivity type layer. The n-type surrounding region 24 works as a channel stopper for preventing inversion layers from being created in the surface portion of the second alternating conductivity type layer. Since the n-type surrounding region 24 covers outer plane 20B, on that the end faces of $n^-$ regions 20a and $p^-$ regions 20b of breakdown withstanding region 20 are arranged alternately, the side faces of the second alternating conductivity type layer are not exposed outside as the dicing planes of the semiconductor chip and the circumferential area of the second alternating conductivity type layer is biased at the drain potential. Therefore, the dielectric breakdown voltage of the device is stabilized and the quality of the device is improved. The n-type surrounding region 24 does not always surround the side faces of the semiconductor chip. The n-type surrounding region 24 may be formed as an isolation means for isolating semiconductor devices in a semiconductor chip from each other.

The alternating conductivity type layer in the breakdown withstanding region is doped more lightly than the alternating conductivity type layer in the drain drift region.

The pitch of repeating in the breakdown withstanding region, at that a pair of the first region and the second region is repeated, is narrower than the pitch of repeating in the drain drift region, at that a pair of the drift current path region and the partition region is repeated.

The first regions and the second regions of the alternating conductivity type layer in the breakdown withstanding region are extended vertically in the thickness direction of the semiconductor chip, and the first regions and the second regions are laminated alternately with each other.

The first regions and the second regions of the alternating conductivity type layer in the breakdown withstanding region are continuous diffusion layers, therein the impurity concentrations are uniform.

Alternatively, at least either the first regions or the second regions of the alternating conductivity type layer in the breakdown withstanding region are formed of unit diffusion regions scattered in the thickness direction of the semiconductor chip and to connect the unit diffusion regions vertically with each other.

When the boundary planes between the drift current path regions and the partition regions extend vertically and in parallel to each other, the boundary planes between the first regions and the second regions of the breakdown withstanding region may be extended almost in parallel to, in almost in perpendicular to, or obliquely to the boundary planes between the drift current path regions and the partition regions.

The boundary planes between the first regions and the second regions of the breakdown withstanding region extend almost in parallel to the boundary planes between the drift current path regions and the partition regions of the drain drift region; the plane, thereon the end faces of the first regions and the second regions are arranged alternately, is bonded to the plane, thereon the end faces of the drift current path regions and the partition regions are arranged alternately; and the boundary plane of the innermost first region is bonded to the boundary plane of the outermost partition region.

The drain drift region includes a first transient region, therein the widths of the drift current path regions and the partition regions are decreasing gradually toward the breakdown withstanding region such that the width of the outermost partition region is the same with the width of the innermost first region of the first conductivity type in contact with the outermost partition region.

The breakdown withstanding includes a second transient region, therein the widths of the first regions and the second regions are increasing gradually toward the drain drift region such that the width of the innermost first region is the same with the width of the outermost partition region in contact with the innermost first region.

Preferably, the first transient region or the second transient region is below the edge portion of the first main electrode.

Alternatively, the boundaries between the first regions and the second regions of the breakdown withstanding region extend almost in perpendicular to the boundaries between the drift current path regions and the partition regions of the drain drift region; the plane, thereon the end faces of the first regions and the second regions of the breakdown withstanding region are arranged alternately, is bonded to the boundary plane of the outermost partition region; and the plane, thereon the end faces of the drift current path regions and the partition regions are arranged alternately, is bonded to the boundary plane of the innermost first region of the breakdown withstanding region.

The alternating conductivity type layer of the breakdown withstanding region includes a first alternating conductivity type section including the first regions and the second regions, the boundary planes therebetween extend almost in parallel to the boundary planes between the drift current path regions and the partition regions of the drain drift region, and a second alternating conductivity type section including the first regions and the second regions, the boundary planes therebetween extend in perpendicular to the boundary planes between the drift current path regions and the partition regions of the drain drift region.

The plane, thereon the end faces of the first regions and the second regions of the first alternating conductivity type section are arranged alternately, is bonded to the plane, thereon the end faces of the drift current regions and the partition regions of the drain drift region are arranged alternately; and the plane, thereon the end faces of the first regions and the second regions of the second alternating conductivity type section are arranged alternately, is bonded to the boundary plane of the outermost partition region of the drain drift region.

The alternating conductivity type layer of the breakdown withstanding region further includes a third alternating conductivity type section in the corner portion of the breakdown withstanding region defined by the first alternating conductivity type section and the second alternating conductivity type section; the third alternating conductivity type section including the first regions and the second regions extended in parallel to the first regions and the second regions of the first alternating conductivity type section or the second alternating conductivity type section; and the plane, thereon the end faces of the first regions and the second regions of the third alternating conductivity type section are arranged alternately, is bonded to the innermost second region of the second alternating conductivity type section or the first alternating conductivity type section.

In other words, the alternating conductivity type layer of the breakdown withstanding region includes a first alternating conductivity type section including the first regions and the second regions, the boundary planes therebetween extend almost in parallel to the boundary planes between the drift current path regions and the partition regions of the drain drift region; and a second alternating conductivity type section including the first regions and the second regions, the boundary planes therebetween extend almost in perpendicular to the boundary planes between the drift current path regions and the partition regions of the drain drift region, and the plane, thereon end faces of the first regions and the second regions of the first alternating conductivity type section or the second alternating conductivity type section are arranged alternately, is bonded to the boundary plane of the innermost second region of the second alternating conductivity type section or the first alternating conductivity type section.

The semiconductor device further includes a highly resistive region filling the space between the first regions and the second regions, the first regions and the second regions being columnar, and the highly resistive region being doped with an impurity of the first conductivity type and an impurity of the second conductivity type.

The semiconductor device further includes one or more voltage equalizing rings of the second conductivity type on the first major surface, the one or more voltage equalizing rings surrounding the drain drift region, and the one or more voltage equalizing rings connecting the second regions with each other.

Preferably, the impurity concentration in the one or more voltage equalizing rings is higher than the impurity concentration in the second region of the second conductivity type.

At least either the first regions or the second regions of the alternating conductivity type layer in the breakdown withstanding region are unit diffusion regions scattered in the thickness direction of the semiconductor chip and spaced apart from each other.

The method of manufacturing the MOSFET according to the first embodiment will now be described with reference to FIGS. 2(a) through 2(d).

Figure 2A:
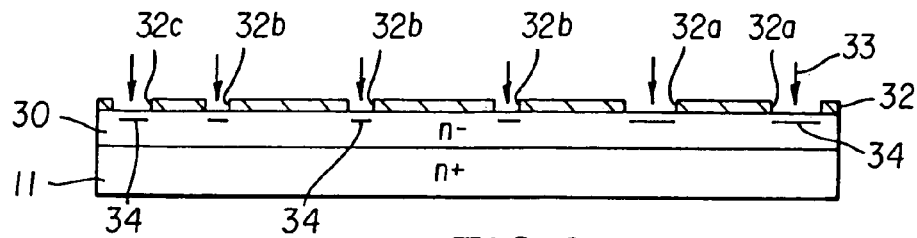
FIGS. 2(a) through 2(d) are cross sectional views for explaining a method of manufacturing the MOSFET according to the first embodiment of the invention.

Referring to FIG. 2(a), a highly resistive first n-type epitaxial layer 30 is laminated on an n-type semiconductor substrate with low electrical resistance, that will be n+ drain layer 11.

Then, a resist mask 32 is formed on the first epitaxial layer 30. Resist mask 32 has windows for ion implantation 32a, 32b and 32c bored by photolithography in the respective areas corresponding to drain drift region 22, breakdown withstanding region 20 and n-type surrounding region 24. Windows 32a, 32b and 32c are formed at the same pitch of repeating. Window 32b for forming breakdown withstanding region 20 is narrower than window 32a for forming drain drift region 22.

Phosphorus ions 33 as an n-type impurity are irradiated through windows 32a, 32b and 32c to implant phosphorus atoms 34 into the surface portions of the first epitaxial layer 30 beneath windows 32a, 32b and 32c. The maximum concentration points (diffusion centers) of phosphorus atoms 34 are located at the depth from the surface of n-type epitaxial layer 30 corresponding to the average range of phosphorus ions 33.

Figure 2B:
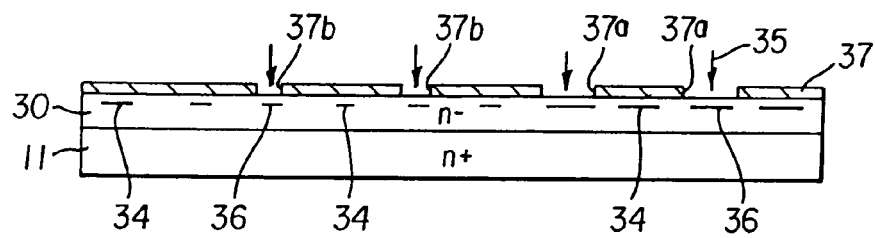

Referring to FIG. 2(b), resist mask 32 is removed. A resist mask having windows 37a and 37b for ion implantation is formed on the first epitaxial layer 30. Windows 37a and 37b are arranged at the pitch of repeating same with the pitch of repeating between windows 32a and 32b and positioned at the midpoints between windows 32a and 32b. Window 37b for forming breakdown withstanding region 20 is narrower than window 37a for forming drain drift region 22.

Boron ions 35 as a p-type impurity are irradiated through windows 37a and 37b to implant boron atoms 36 in the surface portion of epitaxial layer 30 beneath windows 37a and 37b. The maximum concentration points (diffusion centers) of boron atoms 36 are located at the depth from the surface of epitaxial layer 30 corresponding to the average range of boron ions 35. Any of the steps of phosphorus ion implantation described with reference to FIG. 2(a) and boron ion implantation described with reference to FIG. 2(b) may be conducted in advance.

Figure 2C:
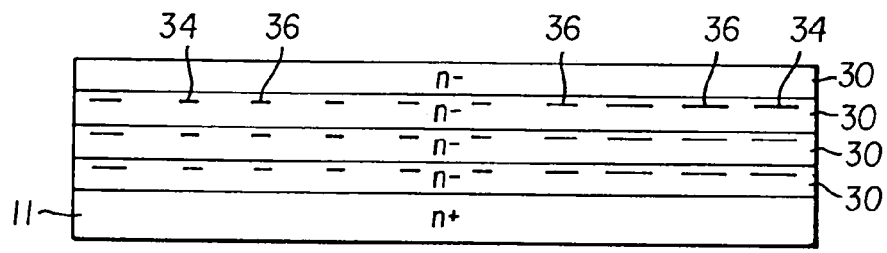

Referring to FIG. 2(c), the steps of epitaxial layer growth and selective ion implantation are repeated multiple times considering the required breakdown voltage class. The windows for the succeeding steps of selectively implanting ions of one conductivity type are located at the preceding window positions. As exemplarily shown in FIG. 2(c), a fourth epitaxial layer 30 for upward diffusion is laminated on the laminate formed of the first through third epitaxial layers 30, 30 and 30. It is preferable for all the epitaxial layers to have the same thickness.

Figure 2D:
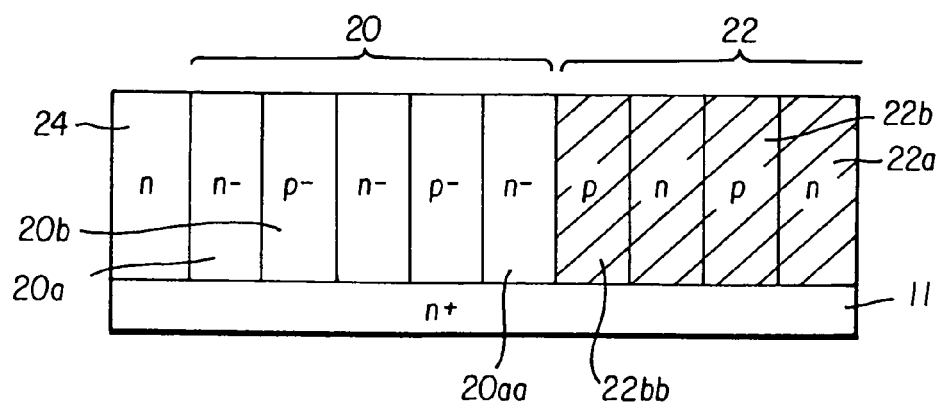

Referring to FIG. 2(d), n drift current path regions 22a and p partition regions 22b in drain drift region 22, n− regions 20a and p− regions 20b in breakdown withstanding region 20, and n-type surrounding region 24 are formed simultaneously by thermally driving all the implanted phosphorus atoms 34 and boron atoms 36 simultaneously from the respective diffusion centers and by connecting the vertically aligned unit diffusion regions around the respective diffusion centers. Since these vertical regions are formed by connecting the vertically aligned unit diffusion regions with each other vertically, the pn-junctions are almost flat when the thermal drive is conducted sufficiently. The impurity atoms in each vertical region distribute around the diffusion centers thereof, thereat the impurity concentration is the highest. It is not always necessary for the pn-junctions to be flat. A higher breakdown voltage is obtained when the pn-junctions in breakdown withstanding region 20 are serpentine or when the unit diffusion regions in breakdown withstanding region 20 are not connected with each other, since wider pn-junctions in the second alternating conductivity type layer in breakdown withstanding region 20 are more favorable to promote depletion.

Then, the active region of the device including p-type base regions 13a is formed on the fourth epitaxial layer 30, resulting in a double-diffusion-type MOSFET. The method described above, that forms alternating conductivity type layers including unit diffusion regions connected vertically with each other and n-type surrounding region 24 by thermally driving the impurities doped in the epitaxial layers at once such that the unit diffusion regions are connected vertically with each other, manufactures super-junction semiconductor devices much more easily than the conventional manufacturing method, that grows epitaxial layers in the trenches dug in a semiconductor substrate.

The typical dimensions and impurity concentrations of the layers and regions in the MOSFET with the breakdown voltage of 600 V class are as follows. The resistivity of $n^+$ drain layer 11 is 0.01 Ωcm. The thickness of $n^+$ drain layer 11 is 350 µm. The impurity concentrations in drift current path region 22a and partition region 22b are $2 \times 10^{15}$ cm$^{-3}$. The thickness of drift current path region 22a and the thickness of partition region 22b are 50 µm. The width of drift current path region 22a and the width of partition region 22b are 5 µm. The impurity concentration in the second alternating conductivity type layer in breakdown withstanding region 20 is $5 \times 10^{14}$ cm$^{-3}$. The area of ion implantation (the area of the widow for ion implantation) for forming the second alternating conductivity type layer in breakdown withstanding region 20 is a quarter the area of ion implantation (the area of the widow for ion implantation) for forming the first alternating conductivity type layer in drain drift region 22.

Figure 3:
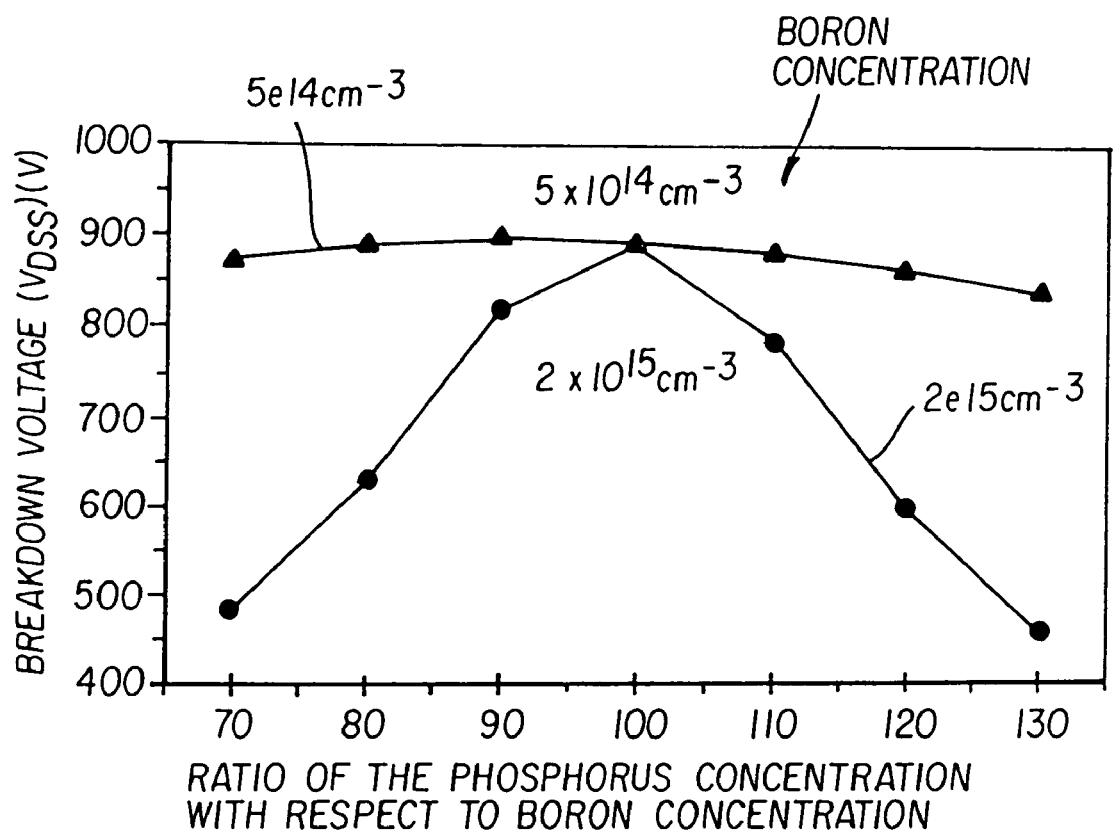
FIG. 3 is a set of curves simulating the relations between the breakdown voltage and the ratio of the phosphorus concentration and the boron concentration in the alternating conductivity type layer with the boron concentration as a parameter.

FIG. 3 is a set of curves simulating the relations between the breakdown voltage and the ratio of the phosphorus concentration and the boron concentration in the alternating conductivity type layer with the boron concentration as a parameter. In FIG. 3, the horizontal axis represents the ratio of the phosphorus concentration with respect to the boron concentration. The phosphorus concentration is the same with the boron concentration at 100% on the horizontal axis. The phosphorus concentration is more than the boron concentration at more than 100% of the horizontal axis. The phosphorus concentration is less than the boron concentration at less than 100% of the horizontal axis. The vertical axis represents the breakdown voltage $V_{DSS}$.

When the boron concentrations in the first alternating conductivity type layer in drain drift region 22 and the second conductivity type layer in breakdown withstanding region 20 are the same $2 \times 10^{15}$ cm$^{-3}$, the breakdown voltage is 880 V at the phosphorus concentration of $2 \times 10^{15}$ cm$^{-3}$. When the manufacturing method described above in connection with the first embodiment is employed, an impurity concentration distribution with the maximum concentrations at the diffusion centers is caused. In other words, impurity concentration variations are caused. In the phosphorus concentration range between 70% and 130%, the breakdown voltage changes by 400 V. When the boron concentration is low $5 \times 10^{14}$ cm$^{-3}$, the breakdown voltage is 880 V at the phosphorus concentration of $2 \times 10^{14}$ cm$^{-3}$. And, the breakdoxvn voltage changes by only 20 V in the phosphorus concentration range between 70% and 130%. Under the ideal condition, under that the born concentration and the phosphorus concentration are the same, the breakdown voltage is independent of the impurity concentrations. However, the breakdown voltage is affected by the concentration ratio of the impurities of the opposite conductivity types. As the impurity concentrations are lower, the breakdown voltage is less dependent of the ratio of the impurity concentrations. Considering that the breakdown voltage is constant 880 V irrespective of whether the boron concentration is $2 \times 10^{15}$ cm$^{-3}$ or $5 \times 10^{14}$ cm$^{-3}$, it is concluded that a sufficiently high breakdown voltage higher than the breakdown voltage (880V) of the first alternating conductivity type layer in drain drift region 22 is obtained in the second alternating conductivity type layer in breakdown withstanding region 20. Therefore, the breakdown voltage of the device depends on the breakdown voltage of the first alternating conductivity type layer in drain drift region 22. Even when the pitches of repeating P1 and P2 are the same and the impurity concentrations in the first and second alternating conductivity type layers are the same, the strength of the depletion electric field in the second alternating conductivity type layer is lower than the strength of the depletion electric field in the first alternating conductivity type layer. The strength of the depletion electric field is lower in the second alternating conductivity type layer than in the first alternating conductivity type layer due to the extra length, by that the curved electric line of force extending from the well side face of p-type base tegion 13a to $n^+$ drain layer 11 is longer than the straight electric line of force extending from the well bottom face of p-type base region 13a to $n^+$ drain layer 11. Since a breakdown voltage higher than that in drain drift region 22 is obtained for breakdown withstanding region 20 by forming breakdown withstanding region 20 of an alternating conductivity type layer even when drain drift region 22 is formed of an alternating conductivity type layer, the structure of the first alternating conductivity type layer in drain drift region 22 is optimized easily, the design freedoms for designing a super-junction semiconductor device is increased, and, therefore, the development of the super-junction semiconductor device is facilitated.

Second Embodiment

Figure 4A:
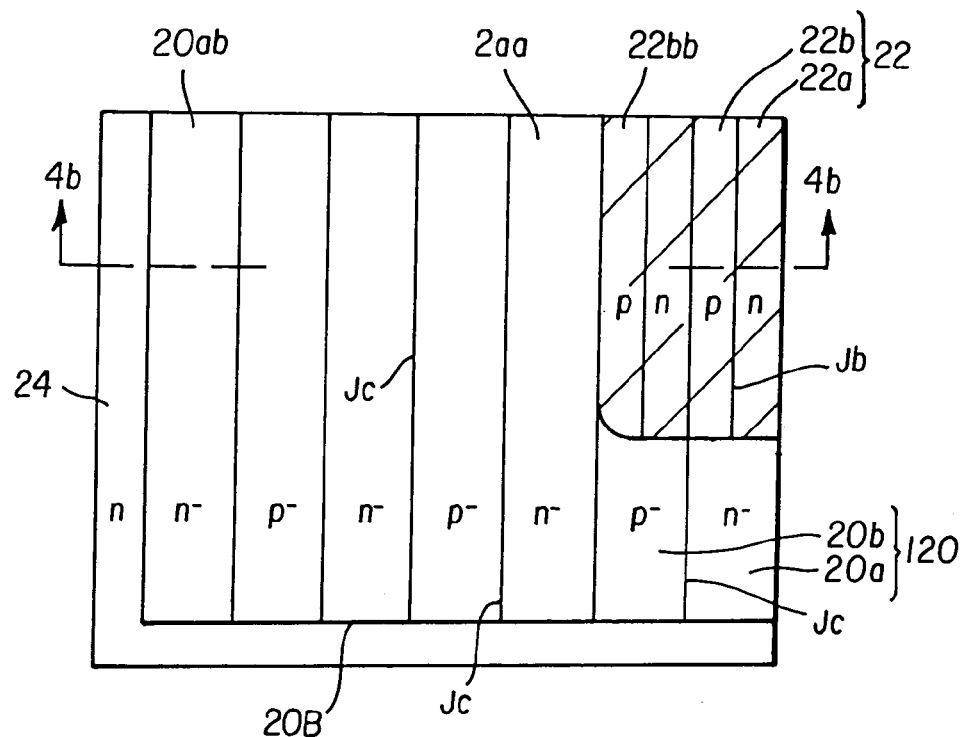
FIG. 4(a) is a horizontal cross sectional view showing a drain drift region and a breakdown withstanding region of a vertical super-junction MOSFET according to the second embodiment of the invention.
Figure 4B:
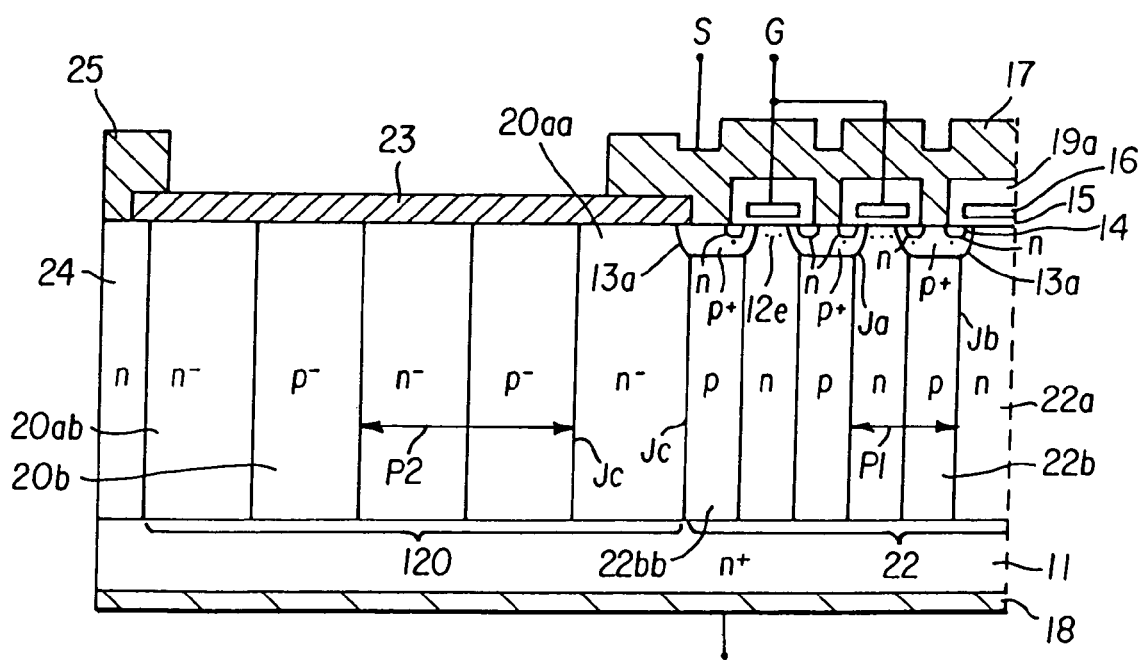
FIG. 4(b) is the vertical cross sectional view along 4(b)—4(b) of FIG. 4(a).

FIG. 4(a) is a horizontal cross sectional view showing a drain drift region and a breakdown withstanding region of a vertical super-junction MOSFET according to a second embodiment of the invention. FIG. 4(b) is the vertical cross sectional view along 4(b)—4(b) of FIG. 4(a). In FIG. 4(a), a quarter part of the drain drift region is illustrated by hatching. In FIGS. 4(a) and 4(b), the same reference numerals as used in FIGS. 1(a) and 1(b) are used to designate the same constituent elements and their duplicated explanations are omitted for clarity.

The MOSFET shown in FIGS. 4(a) and 4(b) is different from the MOSFET shown in FIGS. 1(a) and 1(b) in that the pitch of repeating P2, at that a pair of $n^-$ region 20a and $p^-$ region 20b is repeated in a breakdown withstanding region 120 is wider than the pitch of repeating P1, at that a pair of n drift current path region 22a and p partition region 22b in drain drift region 22 is repeated in drain drift region 22. Since the impurity concentration in the second alternating conductivity type layer in breakdown withstanding region 120 is lower than the impurity concentration in the first alternating conductivity type layer in drain drift region 22, the breakdown voltage of the second alternating conductivity type layer in breakdown withstanding region 120 is higher than the breakdown voltage of the first alternating conductivity type layer in drain drift region 22. Therefore, the breakdown voltage of the device is determined by the breakdown voltage of the drift drain region breakdown withstanding region.

Now the method of manufacturing the MOSFET according to the second embodiment will be described with reference to FIGS. 5(a) through 5(d).

Figure 5A:
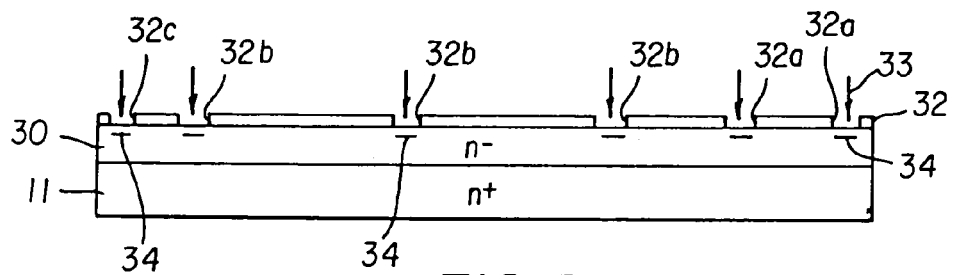
FIGS. 5(a) through 5(d) are cross sectional views for explaining the method of manufacturing the MOSFET according to the second embodiment of the invention.

Referring to FIG. 5(a), a highly resistive first n-type epitaxial layer 30 is laminated on an n-type semiconductor substrate with low electrical resistance, that will be $n^+$ drain layer 11.

Then, a resist mask 32 is formed on the first epitaxial layer 30. Resist mask 32 has windows for ion implantation 32a, 32b and 32c bored by photolithography in the respective areas corresponding to drain drift region 22, breakdown withstanding region 120 and n-type surrounding region 24 with low electrical resistance. The pitch of repeating between windows 32b for forming breakdown withstanding region 20 is wider than the pitch of repeating between windows 32a for forming drain drift region 22.

Phosphorus ions 33 as an n-type impurity are irradiated through windows 32a, 32b and 32c to implant phosphorus atoms 34 into the surface portions of the first epitaxial layer 30 beneath windows 32a, 32b and 32c. The maximum concentration points (diffusion centers) of phosphorus atoms 34 are located at the depth from the surface of n-type epitaxial layer 30 corresponding to the average range of phosphorus ions 33.

Figure 5B:
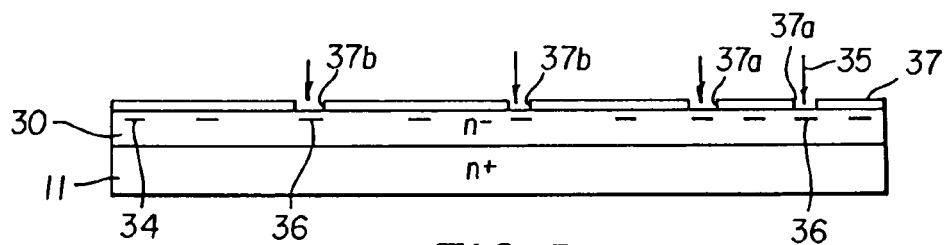

Referring to FIG. 5(b), resist mask 32 is removed. A resist mask 37 having windows 37a and 37b for ion implantation is formed on the first epitaxial layer 30. Windows 37a and 37b are positioned at the midpoints between windows 32a and 32b. The pitch of repeating between windows 37b for forming breakdown withstanding region 120 is wider than the pitch of repeating between the windows 37a for forming drain drift region 22.

Boron ions 35 as a p-type impurity are irradiated through windows 37a and 37b to implant boron atoms 36 in the surface portion of epitaxial layer 30 beneath windows 37a and 37b. The maximum concentration points (diffusion centers) of boron atoms 36 are located at the depth from the surface of epitaxial layer 30 corresponding to the average range of boron ions 35. Any of the steps of phosphorus ion implantation described with reference to FIG. 5(a) and boron ion implantation described with reference to FIG. 5(b) may be conducted in advance.

Figure 5C:
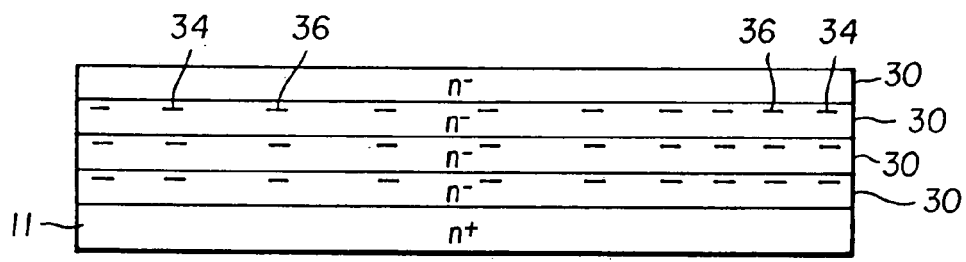

Referring to FIG. 5(c), the steps of epitaxial layer growth and selective ion implantation are repeated multiple times considering the required breakdown voltage class. The windows for the succeeding steps of selectively implanting ions of one conductivity type are located at the preceding window positions. As exemplarily shown in FIG. 5(c), a fourth epitaxial layer 30 for upward diffusion is laminated on the laminate formed of the first through third epitaxial layers 30, 30 and 30. It is preferable for all the epitaxial layers to have the same thickness.

Figure 5D:
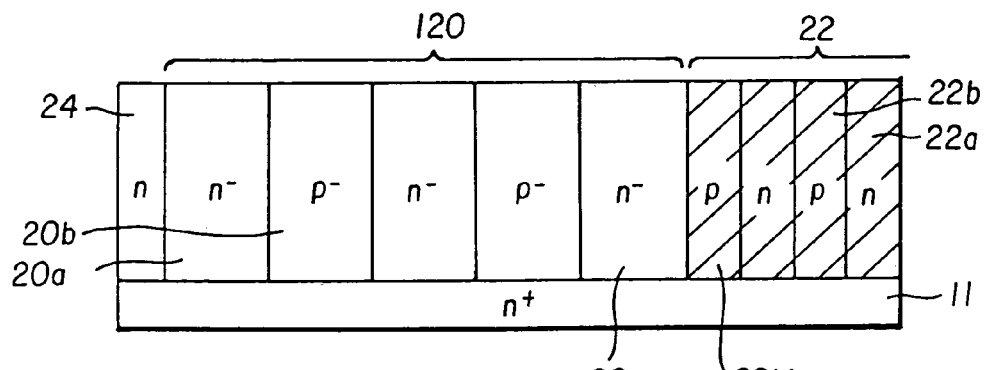

Referring to FIG. 5(d), n drift current path regions 22a and p partition regions 22b in drain drift region 22, n⁻ regions 20a and p⁻ regions 20b in breakdown withstanding region 120, and n-type surrounding region 24 are formed simultaneously by thermally driving all the implanted phosphorus atoms 34 and boron ions 36 simultaneously from the respective diffusion centers and by connecting the vertically aligned unit diffusion regions around the respective diffusion centers. Since these vertical regions are formed by connecting the vertically aligned unit diffusion regions with each other vertically, the pn-junctions are almost flat when the thermal drive is conducted sufficiently. The impurity atoms in each vertical region distribute around the diffusion centers thereof, thereat the impurity concentration is the highest. It is not always necessary for the pn-junctions to be flat. A higher breakdown voltage is obtained when the pn-junctions in breakdown withstanding region 120 are serpentine or when the unit diffusion regions in breakdown withstanding region 120 are not connected with each other, since wider pn-junctions in the second alternating conductivity type layer in breakdown withstanding region 120 are more favorable to promote depletion.

Then, the active region of the device including p-type base regions 13a is formed on the fourth epitaxial layer 30, resulting in a double-diffusion-type MOSFET. The method described above, that forms alternating conductivity type layers including unit diffusion regions connected vertically with each other and n-type surrounding region 24 by thermally driving the impurities doped in the epitaxial layers at once such that the unit diffusion regions are connected vertically with each other, manufactures super-junction semiconductor devices much more easily than the conventional manufacturing method, that grows epitaxial layers in the trenches dug in a semiconductor substrate.

The semiconductor device further includes a surrounding region of the first conductivity type between the first major surface and the layer of the first conductivity type, the surrounding region surrounding the breakdown withstanding region, and the surrounding region exhibiting low electrical resistance.

The semiconductor device further includes a peripheral electrode on the surrounding region, the peripheral electrode being on the side of the first major surface.

The semiconductor device further includes a channel stopper region of the first conductivity type on the surrounding region, and the channel stopper region being on the side of the first major surface.

Preferably, the surrounding region is wider than the drift current path region.

Preferably, the width of the surrounding region is wider than the spacing between the partition regions.

An insulation film is formed on the first major surface of the breakdown withstanding region.

Third Embodiment

Figure 6:
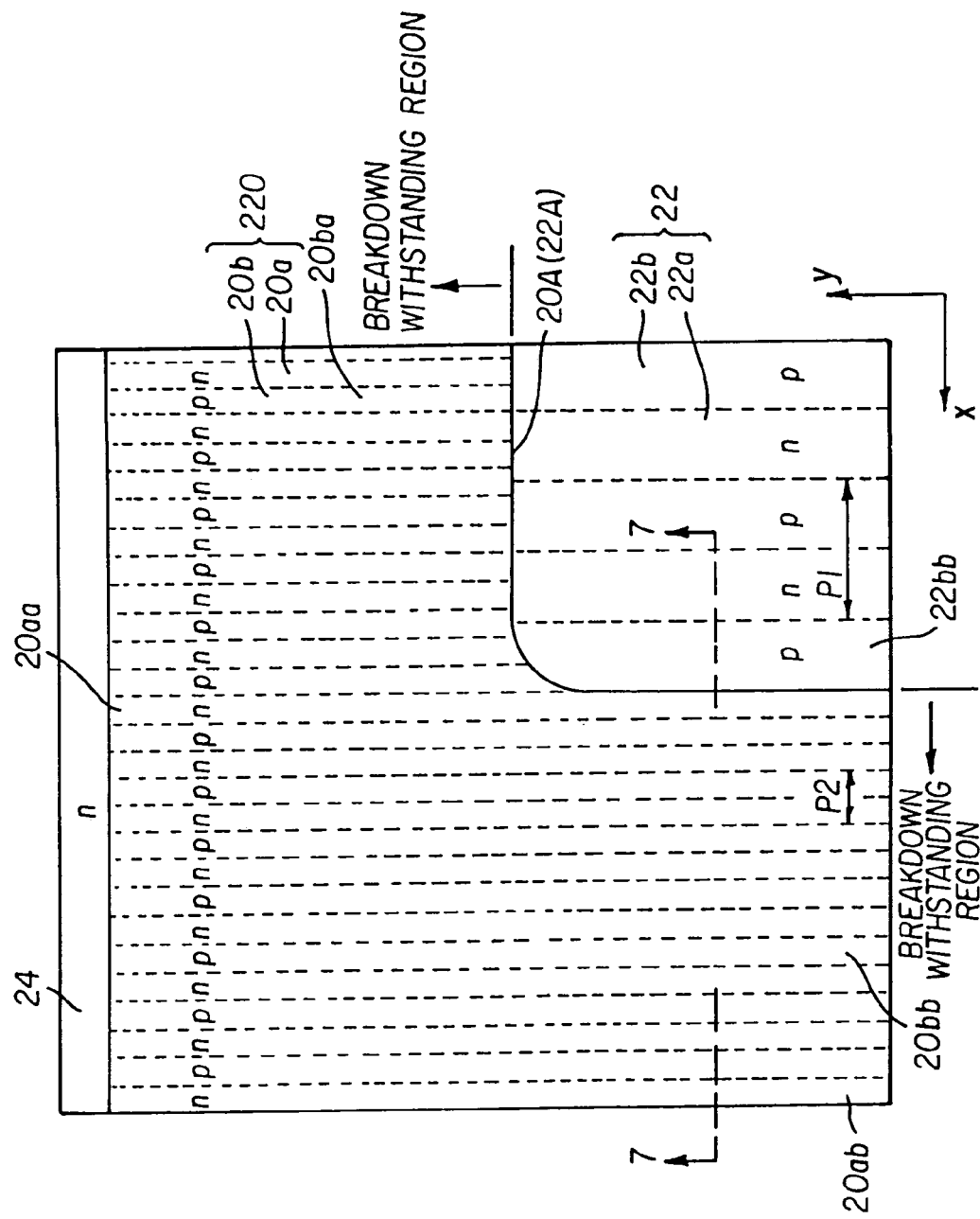
FIG. 6 is a horizontal cross sectional view showing a drain drift region and a breakdown withstanding region of a vertical super-junction MOSFET according to the third embodiment of the invention.
Figure 7:
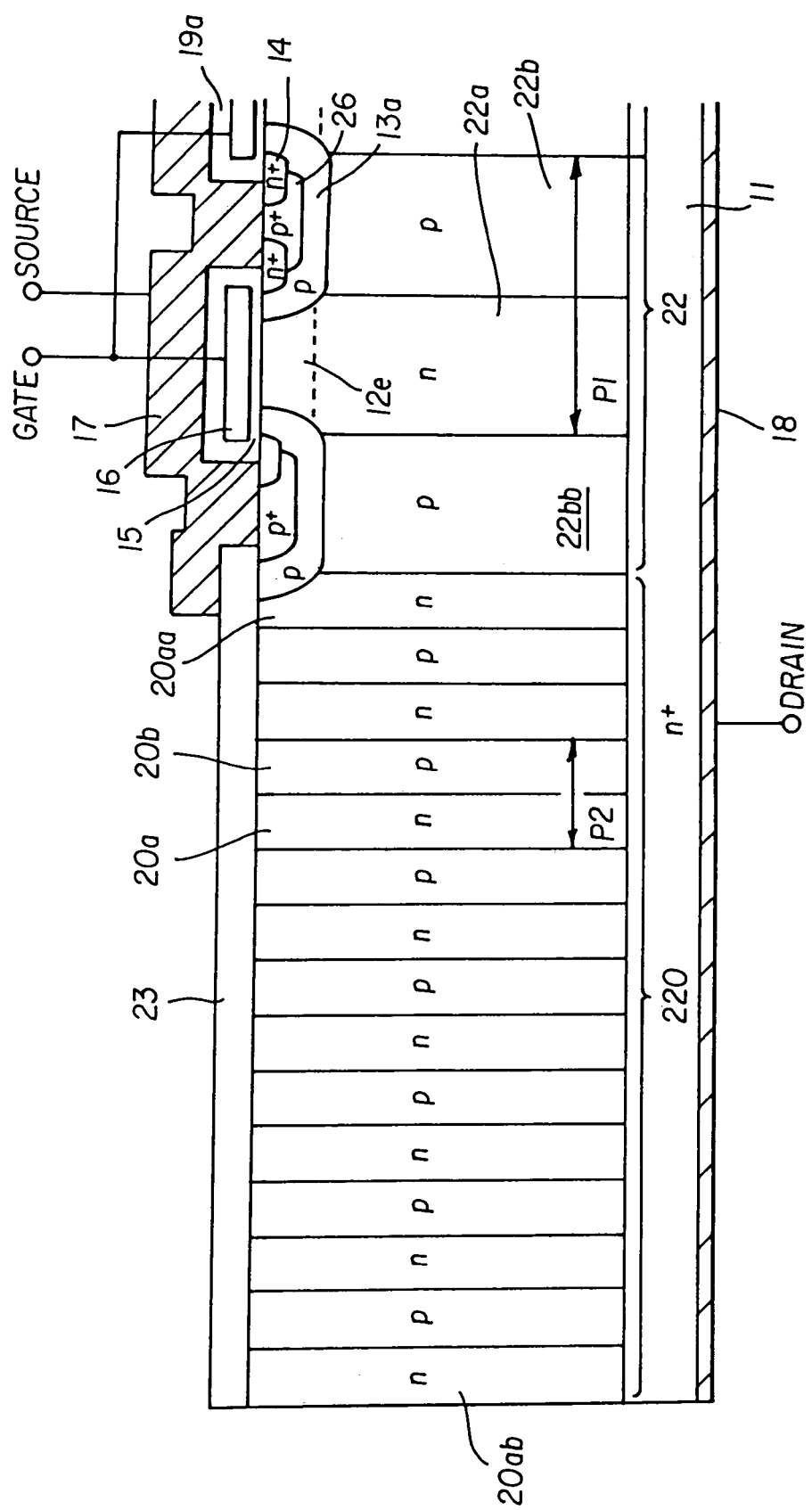
FIG. 7 is the vertical cross sectional view along 7—7 of FIG. 6.

FIG. 6 is a horizontal cross sectional view showing a drain drift region and a breakdown withstanding region of a vertical super-junction MOSFET according to a third embodiment of the invention. FIG. 7 is the vertical cross sectional view along 7—7 of FIG. 6. In FIG. 6, a quarter part of the drain drift region is illustrated by hatching. In FIGS. 6 and 7, the same reference numerals as used in FIGS. 1(a) and 1(b) are used to designate the same constituent elements and their duplicated explanations are omitted for clarity.

The MOSFET shown in FIGS. 6 and 7 is different from the MOSFET shown in FIGS. 1(a) and 1(b) in that the pitch of repeating P2, at that a pair of n⁻ region 20a and p⁻ region 20b is repeated in a breakdown withstanding region 220 is narrower than the pitch of repeating P1, at that a pair of n drift current path region 22a and p partition region 22b in drain drift region 22 is repeated in drain drift region 22, in that the impurity concentration in the second alternating conductivity type layer in breakdown withstanding region 220 is the same with the impurity concentration in the first alternating conductivity type layer in drain drift region 22, in that any peripheral electrode 25 is not deposited on surrounding region 24, in that the conductivity type of base regions 13a is not p⁺-type but p-type, i.e. the impurity concentration in base regions 13a according to the third embodiment is lower than the impurity concentration in base regions 13a according to the first embodiment, and in that a p⁺-type contact region 26 is formed to compensate the low impurity concentration in base regions 13a according to the third embodiment.

When the pitch of repeating and the impurity concentration in the first alternating conductivity type layer in drain drift region 22 are the same with the pitch of repeating and the impurity concentration in the second alternating conductivity type layer in breakdown withstanding region 220, p regions 20ba, the inner end faces 20A thereof are connected to p-type base regions 13a, are depleted by the depletion layers expanding in the Y-direction under the voltage of around 50 V between the source and the drain and work as highly resistive layers to bear the breakdown voltage. The p regions 20bb, extending in parallel to the boundary planes in drain drift region 22 and the end faces thereof are not connected to p-type base regions 13a, are floating and work only as guard rings to relax the surface electric field. Since the electric field reaches the critical value before the depletion layers expand sufficiently into p regions 20bb, it is difficult to obtain a high breakdown voltage.

In FIGS. 6 and 7, the impurity concentration in the first alternating conductivity type layer in drain drift region 22 is the same with the impurity concentration in the second alternating conductivity type layer in breakdown withstanding region 220. However, the pitch of repeating in the second alternating conductivity type layer in breakdown withstanding region 220 is narrower than the pitch of repeating in the first alternating conductivity type layer in drain drift region 22. In this case, more depletion layers are involved for the unit length in the second alternating conductivity type layer than in the first alternating conductivity type layer, and the nominal impurity concentration is lower in the second alternating conductivity type layer than in the first alternating conductivity type layer. Therefore, the depletion layers expand easily in the X-direction in the second alternating conductivity type layer and a high breakdown voltage is obtained. Since the depletion layer width based on the diffusion potential is wider as the impurity concentration in the second alternating conductivity type layer is lower and since the nominal impurity concentration in the second alternating conductivity type layer is reduced, a higher breakdown voltage is obtained more easily. The pitch of repeating P2 for the second alternating conductivity type layer is narrowed more than the pitch of repeating P1 for the first alternating conductivity type layer by narrowing the pitch between windows 32b or 37b more than the pitch between windows 32a or 37a in FIGS. 5(a) and 5(b).

The depletion layer width W based on the diffusion potential of the second alternating conductivity type layer in breakdown withstanding region 220 is expressed by the following relational expression with the impurity concentration Na in n⁻ region 20a of the second alternating conductivity type layer, the impurity concentration Nd in n region 20b, the carrier concentration ni in the intrinsic semiconductor, the charge q of an electron, the dielectric permeability εs of the semiconductor, the Boltzmann constant k, and the absolute temperature T.

$$W=\{2\epsilon s/q\ [(Na+Nd)/(NaNd)]kT/q\ \ln(NaNd)/ni^2\}^{1/2}$$

Since the entire second alternating conductivity type layer in breakdown withstanding region 220 is depleted when the sum of the width of n region 20a and the width of p region 20b in the second alternating conductivity type layer is small, the second alternating conductivity type layer in breakdown withstanding region 220 works as a highly resistive layer, although the second alternating conductivity type layer contains many p-type impurity atoms and many n-type impurity atoms. The same effects are obtained in the inactive region other than the breakdown withstanding region.

The p-type base region 13a, electrically connected to source electrode 17 via p⁺-type contact region 26 according to the third embodiment, facilitates preventing latching up from causing. Although any peripheral electrode 25 is not on n-type surrounding region 24 with low electrical resistance in the MOSFET according to the third embodiment, the entire n-type surrounding region 24 is kept at the drain potential, since n-type surrounding region 24 is connected to n⁺ drain layer 11.

The first windows and the second windows for forming the second alternating conductivity type layer in the breakdown withstanding region are narrower than the first windows and the second windows for forming the first alternating conductivity type layer in the drain drift region.

The pitch of repeating, thereat a pair of the first window and the second window is repeated for forming the second alternating conductivity type layer in the breakdown withstanding region is wider than the pitch of repeating, thereat a pair of the first window and the second window is repeated for forming the first alternating conductivity type layer in the drain drift region.

Fourth Embodiment

Figure 8:
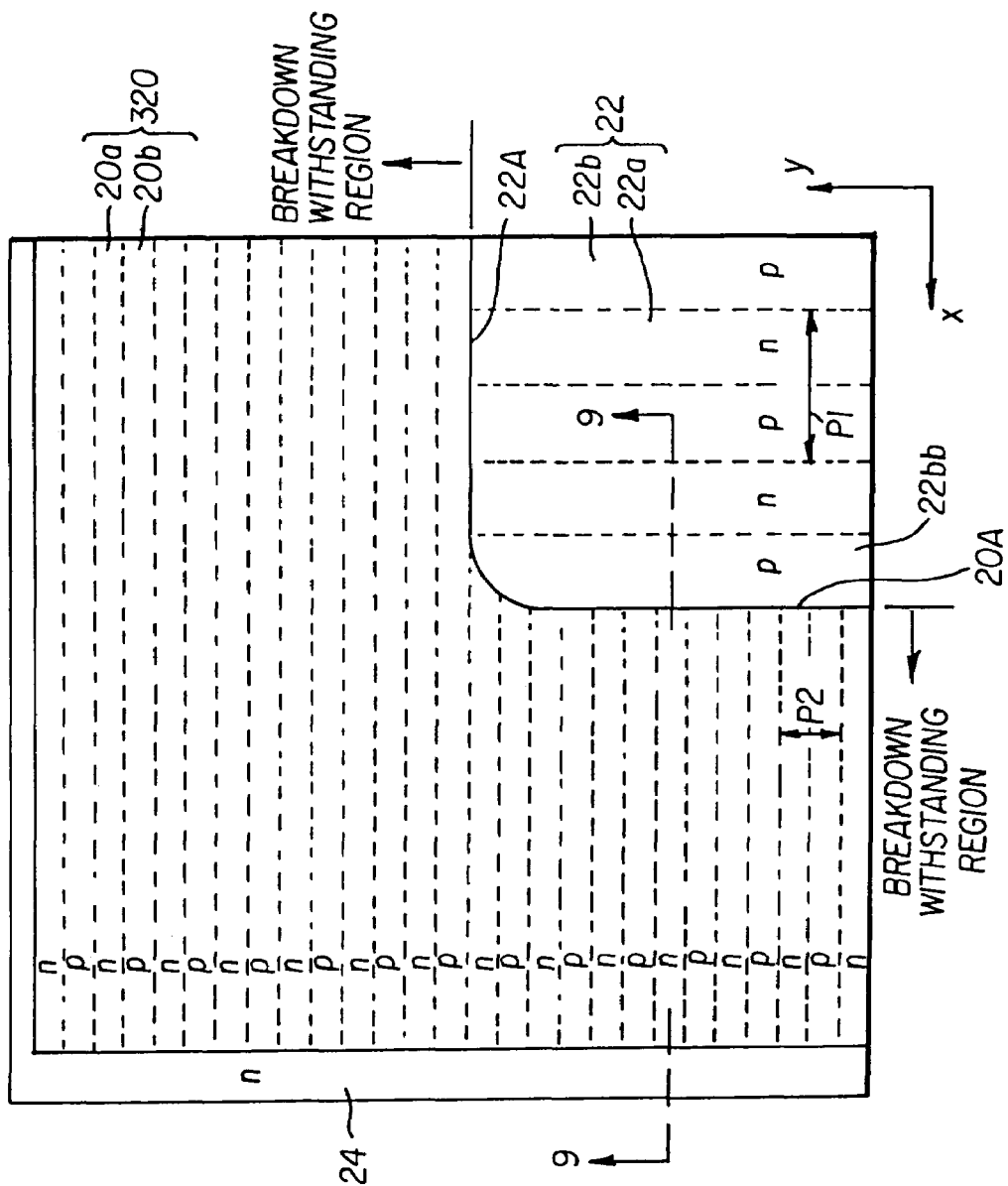
FIG. 8 is a horizontal cross sectional view showing a drain drift region and a breakdown withstanding region of a vertical super-junction MOSFET according to the fourth embodiment of the invention.
Figure 9:
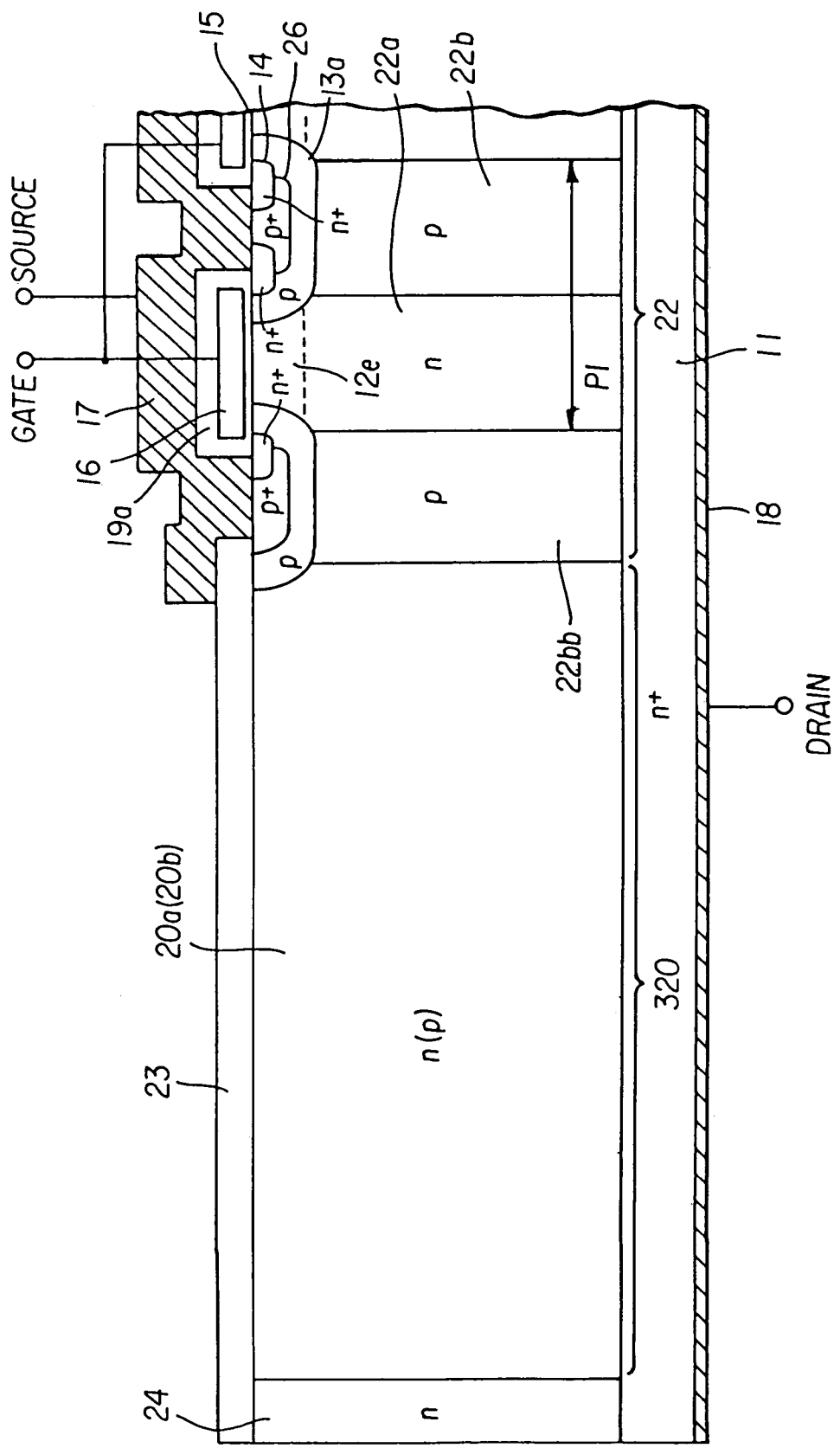
FIG. 9 is the vertical cross sectional view along 9—9 of FIG. 8.

FIG. 8 is a horizontal cross sectional view showing a drain drift region and a breakdown withstanding region of a vertical super-junction MOSFET according to a fourth embodiment of the invention. FIG. 9 is the vertical cross sectional view along 9—9 of FIG. 8 In FIG. 8, a quarter part of the drain drift region is illustrated. In FIGS. 8 and 9, the same reference numerals as used in FIGS. 6 and 7 are used to designate the same constituent elements and their duplicated explanations are omitted for clarity.

The MOSFET according to the fourth embodiment shown in FIGS. 8 and 9 is different from the MOSFET according to the third embodiment shown in FIGS. 6 and 7 in that n regions 20a and the p regions 20b in the second alternating conductivity type layer in a breakdown withstanding region 320 extend almost in perpendicular to the n drift current path regions 22a and p partition regions 22b in the first alternating conductivity type layer in a drain drift region 22 in the MOSFET according to the fourth embodiment. An inner plane 20A, on that the end faces of n regions 20a and p regions 20b are arranged alternately, is connected to the boundary plane of the outermost p partition region 22bb (the end face of p-type base region 13a). An outer plane 22A, on that the end faces of n drift current path regions 22a and p partition regions 22b are arranged alternately, is connected to the boundary plane of the innermost n region 20aa of breakdown withstanding region 320. The MOSFET according to the fourth embodiment exhibits the same effects with those the MOSFET according to the third embodiment does, since the pitch of repeating P2 in second alternating conductivity type layer in breakdown withstanding region 320 is narrower than the pitch of repeating P1 in the first alternating conductivity type layer in drain drift region 22 in the MOSFET according to the fourth embodiment.

The windows for forming the second alternating conductivity type layer in the breakdown withstanding region are narrower than the windows for forming the first alternating conductivity type layer in the drain drift region, and the pitch of repeating, thereat the windows are repeated for forming the second alternating conductivity type layer in the breakdown withstanding region, is narrower than the pitch of repeating, thereat the windows are repeated for forming the first alternating conductivity type layer in the drain drift region.

Fifth Embodiment

Figure 10:
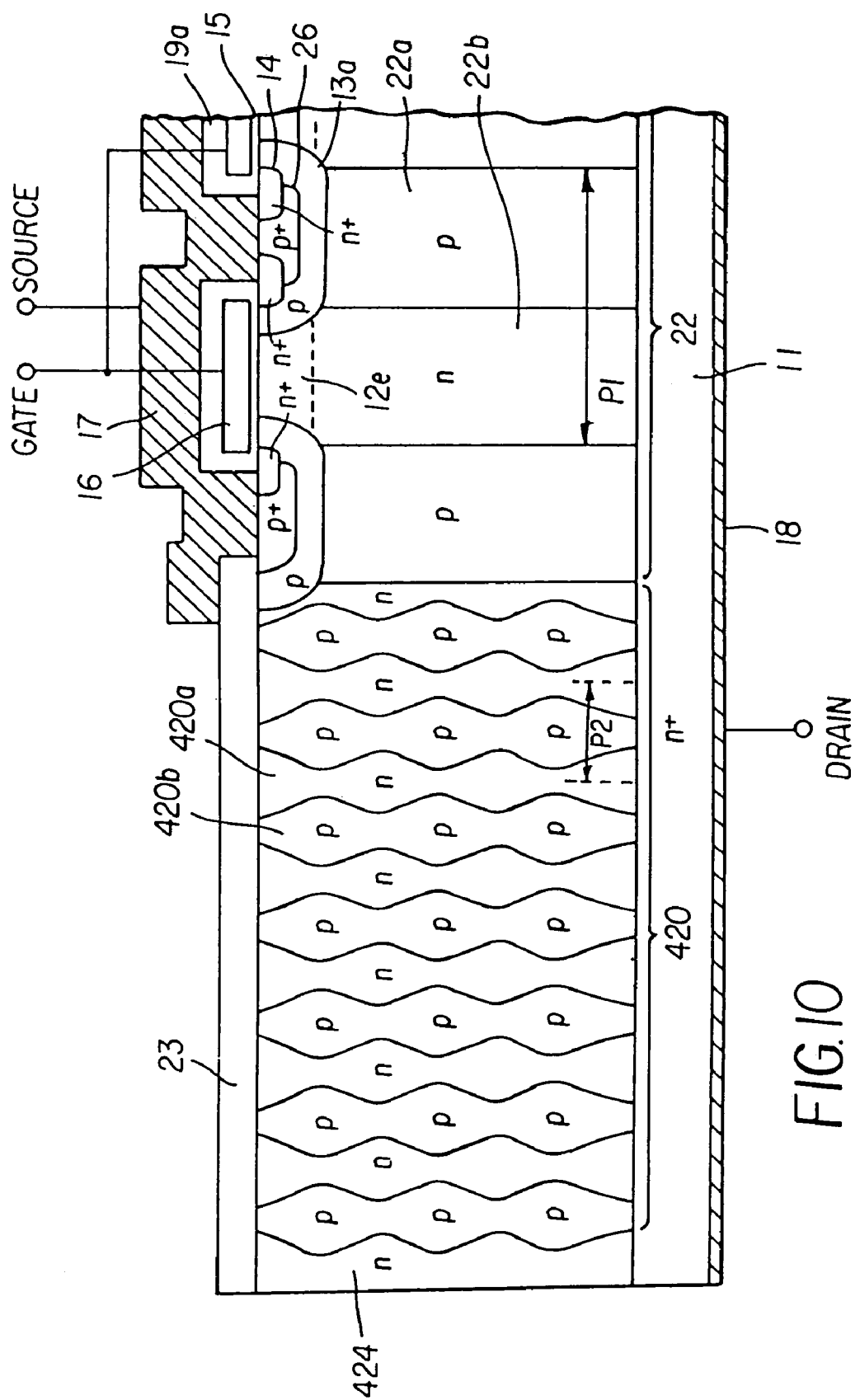
FIG. 10 is a vertical cross sectional view showing a drain drift region and a breakdown withstanding region of a vertical super-junction MOSFET according to the fifth embodiment of the invention.

FIG. 10 is a vertical cross sectional view showing a drain drift region and a breakdown withstanding region of a vertical super-junction MOSFET according to a fifth embodiment of the invention. In FIG. 10, the same reference numerals as used in FIG. 7 are used to designate the same constituent elements and their duplicated explanations are omitted for clarity.

In the MOSFET according to the fifth embodiment, the pn-junctions between vertical n-type regions 420a and vertical p-type regions 420b in a breakdown withstanding region 420 are serpentine. The inner side face of an n-type surrounding region 424 is also serpentine. The n-type regions 420a and p-type regions 420b as described above are formed by driving from separately located diffusion centers to connect unit diffusion regions aligned vertically. Flat pn-junctions between n-type regions 420a and p-type regions 420b formed as described in connection with the foregoing embodiments do not pose any problem. Breakdown withstanding region 420 does not provide any current path but works as a breakdown withstanding structure in the OFF-state of the device. Since a wider pn-junction area is obtained in breakdown withstanding region 420 and the pn-junction area in the unit volume of breakdown withstanding region 420 is wide when the pn-junctions in breakdown withstanding region 420 are serpentine, the serpentine pn-junctions facilitate depleting the entire breakdown withstanding region 420 uniformly and densely. Therefore, the serpentine pn-junctions facilitate obtaining a higher breakdown voltage. The serpentine pn-junctions are formed without adding any step to the manufacturing processes described in connection with the first through fourth embodiments.

Now the method of manufacturing the MOSFET according to the fifth embodiment will be described with reference to FIGS. 11(a) through 11(e).

Figure 11A:
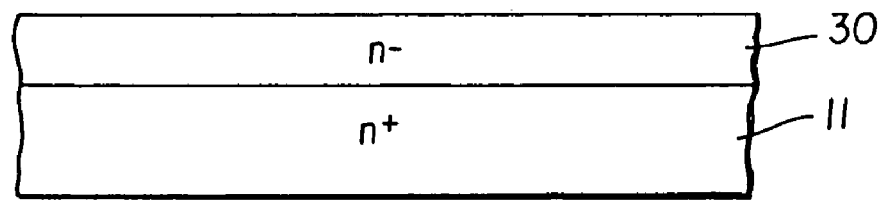
FIGS. 11(a) through 11(e) are cross sectional views for explaining a method of manufacturing the MOSFET according to the fifth embodiment of the invention.

Referring to FIG. 11(a), a first highly-resistive n-type epitaxial layer 30 is formed on an n-type semiconductor substrate with low resistance, that will be an n+ drain layer 11.

Figure 11B:
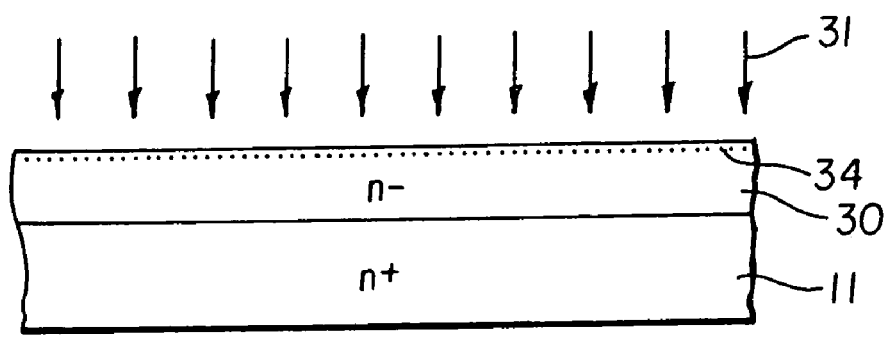

Referring to FIG. 11(b), phosphorus ions 33 are irradiated onto the entire surface of the first n-type epitaxial layer 30 to implant phosphorus atoms 34 in the surface portion of the first epitaxial layer 30.

Figure 11C:
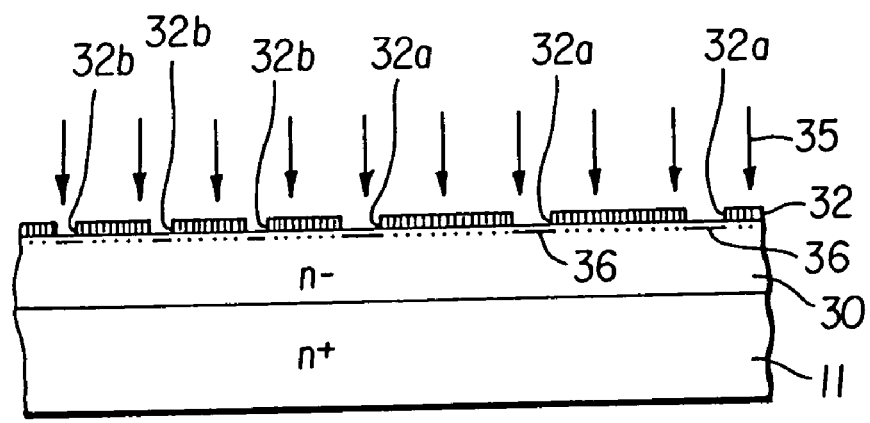

Referring to FIG. 11(c), a resist mask 32 is formed on the first epitaxial layer 30. Resist mask 32 has windows for ion implantation 32a and 32b bored by photolithography in the respective areas corresponding to drain drift region 22, breakdown withstanding region 420 and n-type surrounding region 24. Window 32b for forming breakdown withstanding region 420 is narrower than window 32a for forming drain drift region 22. The pitch of repeating between windows 32b is narrower than the pitch of repeating between windows 32a. The boron ions 35 as a p-type impurity are irradiated through windows 32a, and 32b to implant boron atoms 36 into the surface portions of the first epitaxial layer 30 beneath windows 32a and 32b.

Figure 11D:
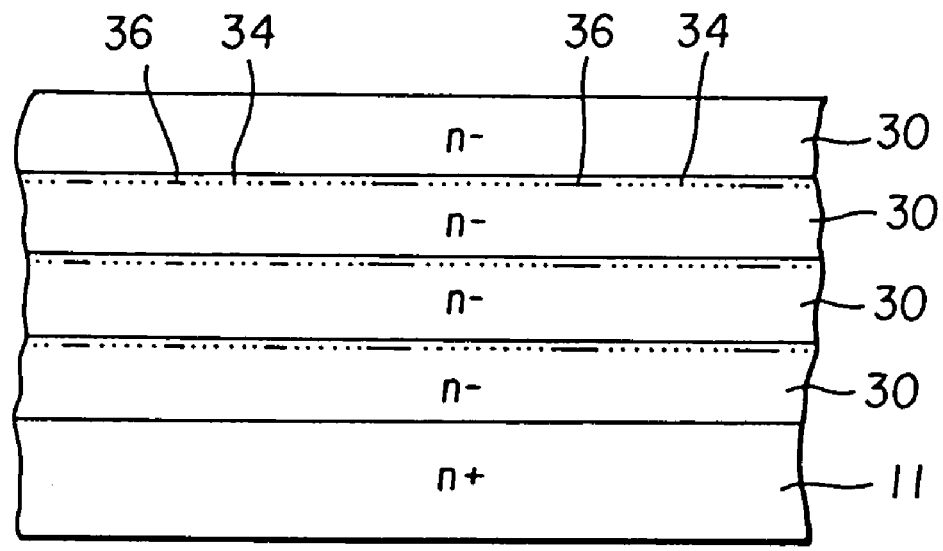

Referring to FIG. 11(d), the steps of epitaxial layer growth (FIG. 11(a)), implantation of the n-type impurity into the entire surface portion of the epitaxial layer (FIG. 11(b)), and selective implantation of the p-type impurity (FIG. 11(c)) are repeated multiple times considering the required breakdown voltage class. Any of the steps of phosphorus ion implantation described with reference to FIG. 11(a) and boron ion implantation described with reference to FIG. 11(c) may be conducted in advance. The windows for the succeeding steps of selectively implanting ions of one conductivity type are located at the preceding window positions. As exemplarily shown in FIG. 11(e), a fourth epitaxial layer 30 for upward diffusion is laminated on the laminate formed of the first through third epitaxial layers 30, 30 and 30. It is preferable for all the epitaxial layers to have the same thickness.

Figure 11E:
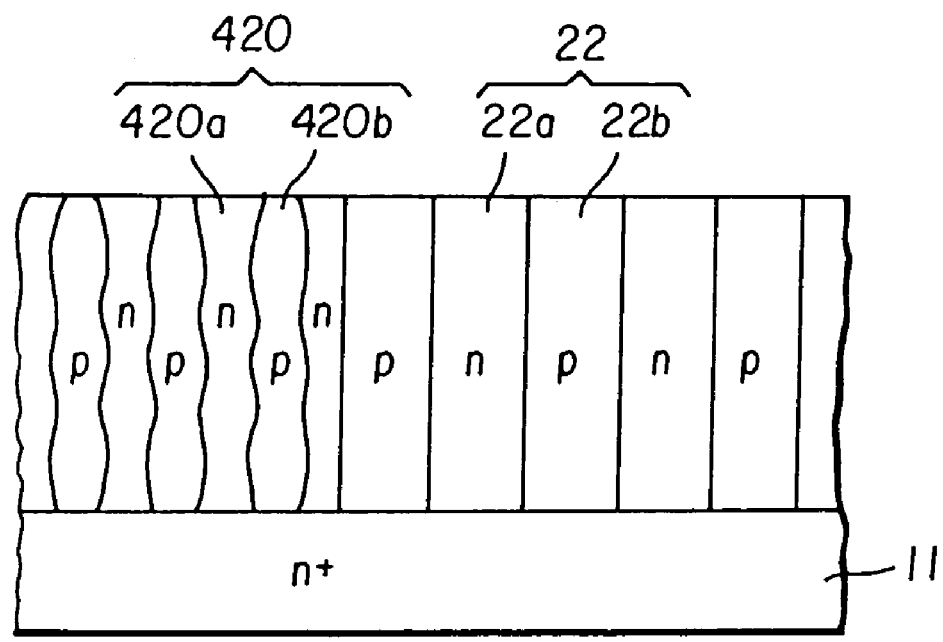

Referring to FIG. 11(e), all the phosphorus atoms 34 implanted in the entire surface portion of each epitaxial layer 30 and boron ions 36 selectively implanted in the surface portion of each epitaxial layer 30 are thermally driven simultaneously from the respective diffusion centers. Although phosphorus atoms 34 diffuse into the entire epitaxial layers, boron ions 36 diffuse from the diffusion centers such that unit diffusion regions are connected vertically with each other. As a result of this simultaneous thermal drive, n drift current path regions 22a and p partition regions 22b in drain drift region 22, n-type regions 420a and p-type regions 420b in breakdown withstanding region 420, and n-type surrounding region 424 are formed simultaneously. Since these vertical regions are formed by connecting the vertically aligned unit diffusion regions with each other vertically, the pn-junctions are flat in drain drift region 22, for that windows 32a for ion implantation is wide and the implanted amount of the impurities are sufficient. The pn-junctions are serpentine in breakdown withstanding region 420, for that windows 32b for ion implantation is narrow, and the impurity atoms distribute around the diffusion centers thereof, thereat the impurity concentration is the highest. For example, when the pitch of repeating P1 in the first alternating conductivity type layer in drain drift region 22 is 16 μm and the pitch of repeating P2 in the second alternating conductivity type layer in breakdown withstanding region 420 is 8 μm, the width of windows 32a and the pitch between windows 32a for boron ion implantation are set at 4 μm and 16 μm, respectively, and the width of the windows and the pitch between the windows for forming the second alternating conductivity type layer are set at 2 μm and 8 μm, respectively, for the phosphorus dose amount of $0.5 \times 10^{13}$ cm$^2$ and the boron dose amount of $2.0 \times 10^{13}$ cm$^2$.

Then, the active region of the device including p-type base regions 13a is formed on the fourth epitaxial layer 30, resulting in a double-diffusion-type MOSFET. The method described above, that forms alternating conductivity type layers including unit diffusion regions connected vertically with each other and the n-type surrounding region by thermally driving the impurities doped in the epitaxial layers at once such that the unit diffusion regions are connected vertically with each other, manufactures super-junction semiconductor devices much more easily than the conventional manufacturing method, that grows epitaxial layers in the trenches dug in a semiconductor substrate.

Sixth Embodiment

Figure 12:
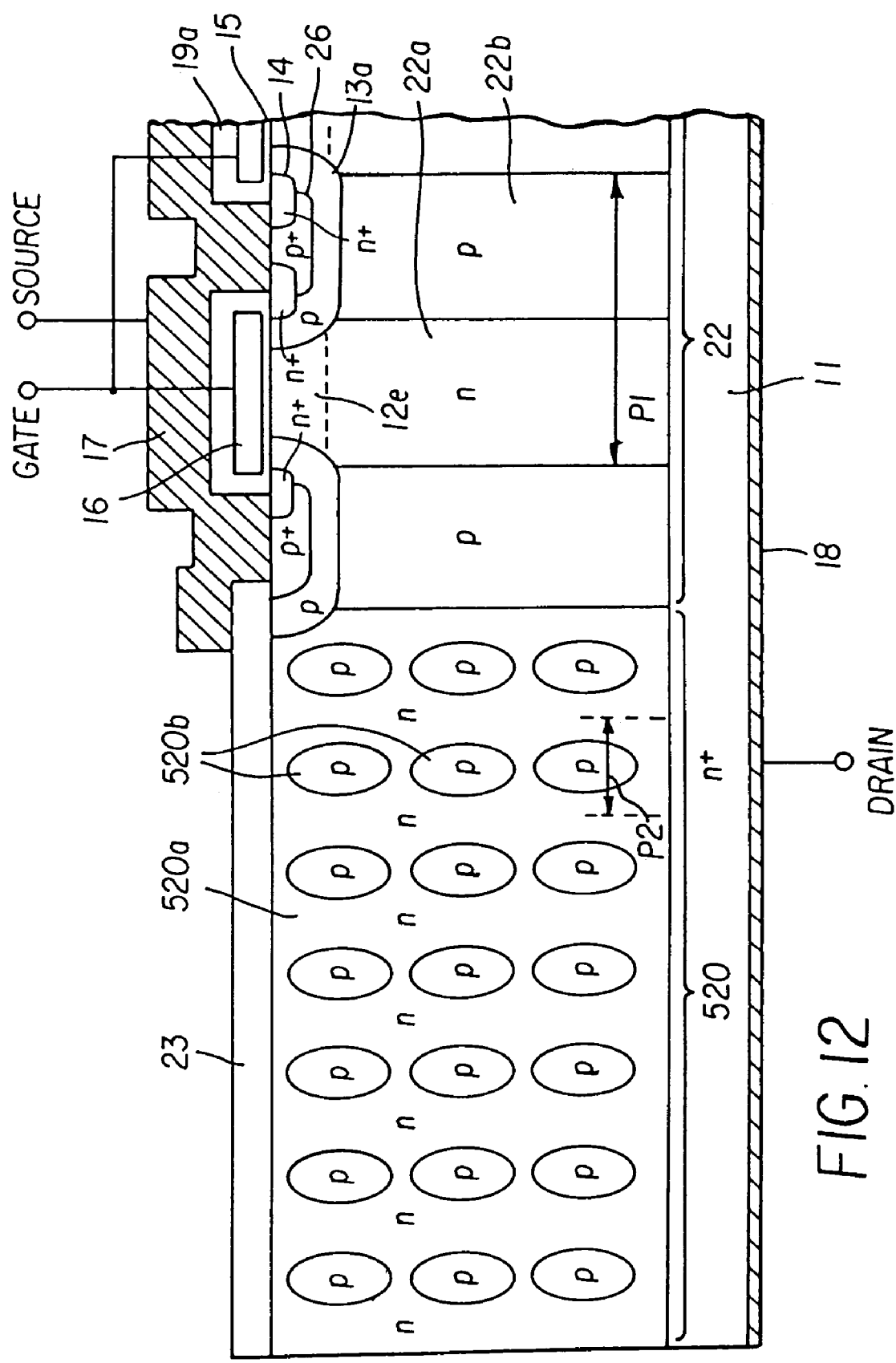
FIG. 12 is a vertical cross sectional view showing a drain drift region and a breakdown withstanding region of a vertical super-junction MOSFET according to the sixth embodiment of the invention.

FIG. 12 is a vertical cross sectional view showing a drain drift region and a breakdown withstanding region of a vertical super-junction MOSFET according to a sixth embodiment of the invention. In FIG. 12, the same reference numerals as used in FIG. 7 are used to designate the same constituent elements and their duplicated explanations are omitted for clarity.

Referring to FIG. 12, p-type regions 520b in the second alternating conductivity type layer in a breakdown withstanding region 520 are not extending continuously. The p-type regions 520b are scattered unit diffusion regions aligned vertically and space apart form each other. The n-type regions in the second alternating conductivity type layer in a breakdown withstanding region 520 are connected with each other vertically and horizontally to form a three-dimensional lattice of n-type region 520a. Since the pn-junction area is increased more by the discontinuous portions of p-type regions 520b than by the serpentine pn-junction area in breakdown withstanding region 420 in FIG. 10, the MOSFET according to the sixth embodiment facilitates obtaining a breakdown voltage higher than by the breakdown voltage of the MOSFET according to the fifth embodiment.

For forming the second alternating conductivity type layer according to the sixth embodiment, windows 32b for boron ion implantation are narrowed. The unit boron diffusion regions are not connected with each other, since the unit boron diffusion regions are shorter than the spacing between the boron diffusion centers.

Seventh Embodiment

Figure 13:
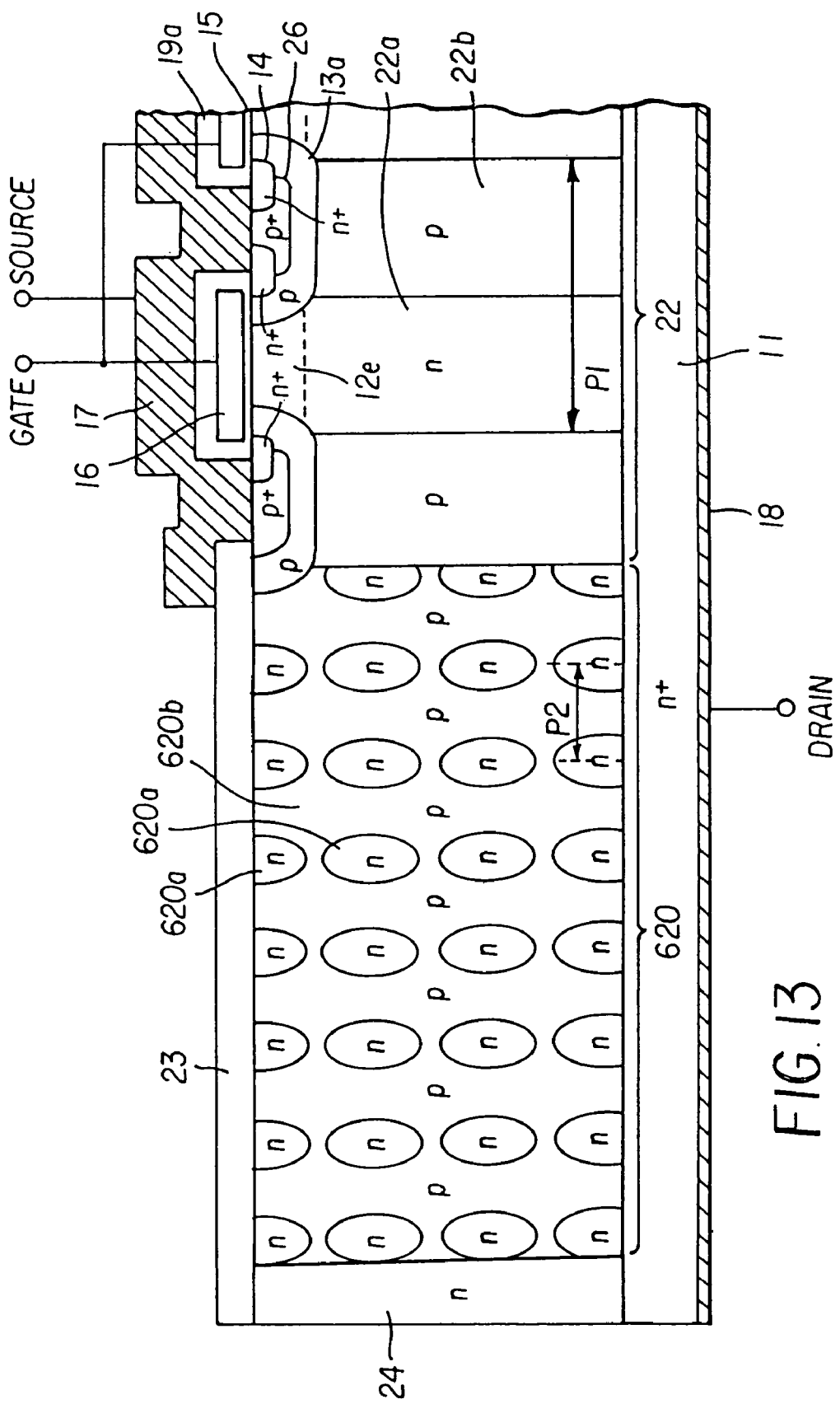
FIG. 13 is a vertical cross sectional view showing a drain drift region and a breakdown withstanding region of a vertical superjunction MOSFET according to the seventh embodiment of the invention.

FIG. 13 is a vertical cross sectional view showing a drain drift region and a breakdown withstanding region of a vertical super-junction MOSFET according to a seventh embodiment of the invention. In FIG. 13, the same reference numerals as used in FIG. 7 are used to designate the same constituent elements and their duplicated explanations are omitted for clarity.

Referring to FIG. 13, n-type regions 620a in the second alternating conductivity type layer in a breakdown withstanding region 620 are not extending continuously. The n-type regions 620a are scattered unit diffusion regions aligned vertically and space apart form each other. The p-type regions in the second alternating conductivity type layer in a breakdown withstanding region 620 are connected with each other vertically and horizontally to form a three-dimensional lattice of p-type region 620b. Since the pn-junction area is increased more by the discontinuous portions of n-type regions 620a than the serpentine pn-junction area in breakdown withstanding region 420 in FIG. 10, the MOSFET according to the seventh embodiment facilitates obtaining a breakdown voltage higher than the breakdown voltage of the MOSFET according to the fifth embodiment.

For forming the second alternating conductivity type layer according to the seventh embodiment, windows 32b for boron ion implantation are widened. The unit boron diffusion regions are connected with each other vertically and horizontally with n-type regions 620a scattered therein, since the unit boron diffusion regions are longer than the spacing between the boron diffusion centers.

Eighth Embodiment

Figure 14:
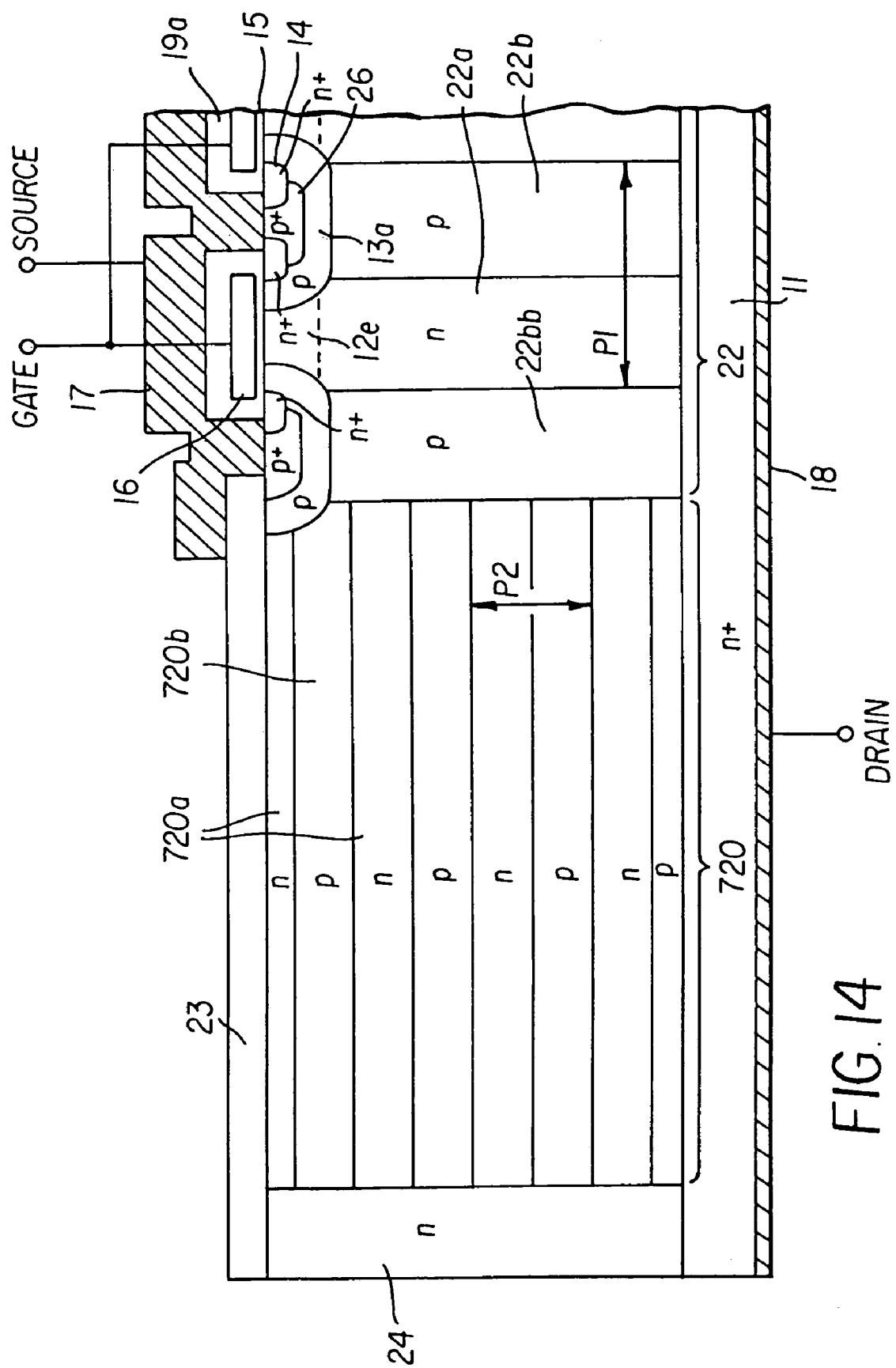
FIG. 14 is a vertical cross sectional view showing a drain drift region and a breakdown withstanding region of a vertical super-junction MOSFET according to the eighth embodiment of the invention.

FIG. 14 is a vertical cross sectional view showing a drain drift region and a breakdown withstanding region of a vertical super-junction MOSFET according to an eighth embodiment of the invention. In FIG. 14, the same reference numerals as used in FIG. 7 are used to designate the same constituent elements and their duplicated explanations are omitted for clarity.

Referring to FIG. 14, the device includes a lateral breakdown withstanding region 720 including lateral n-type regions 720a and lateral p-type regions 720b. The n-type regions 720a and p-type regions 720b extend in parallel or obliquely to the major surfaces of the semiconductor chip and laminated alternately with each other vertically. The pitch of repeating P2 in the second alternating conductivity type layer in breakdown withstanding region 720 is narrower than the pitch of repeating P1 in the first alternating conductivity type layer in drain drift region 22. The p-type regions 720b are electrically connected to source electrode 17 via p-type base region 13a or the outermost p partition region 22bb in drain drift region 22. The n-type regions 720a are electrically connected to drain electrode 18 via n-type surrounding region 24 and n+ drain layer 11. Since the second alternating conductivity type layer is depleted completely by the depletion layers expanding vertically from the pn-junctions in the second alternating conductivity type layer of breakdown withstanding region 720 in the OFF-state of the device, a high breakdown voltage is obtained.

The lateral second alternating conductivity type layer is formed by implanting impurity ions in the entire range, therein breakdown withstanding region 720 is to be formed, or selectively in the entire range, therein breakdown withstanding region 720 is to be formed, while changing the conductivity type of the impurity ions alternately, and by finally driving the implanted impurity atoms such that the resultant second alternating conductivity type layer is formed of lateral n-type regions 720a and lateral p-type regions 720b. Since it is more preferable for the second alternating conductivity type layer to be doped lightly, the concentration control by implanting an n-type impurity may be omitted for growing highly resistive n-type epitaxial layers. The pn-junctions in the second alternating conductivity type layer are not limited to flat ones. Serpentine pn-junctions or discontinuous pn-junctions in the second alternating conductivity type layer do not pose any problem. Since the spatial frequency, for that a pair of a lateral n-type region 720a and a lateral p-type region 720b is repeated, is half the number of epitaxial layers deposited, lateral breakdown withstanding region 720 increases the manufacturing steps. The process for forming drain drift region 22 is not employable for forming lateral breakdown withstanding region 720. Lateral second alternating conductivity type layer may have a three-dimensional lattice structure or a net structure. Serpentine pn-junction planes in lateral breakdown withstanding region 720 pose no problem.

Ninth Embodiment

Figure 15:
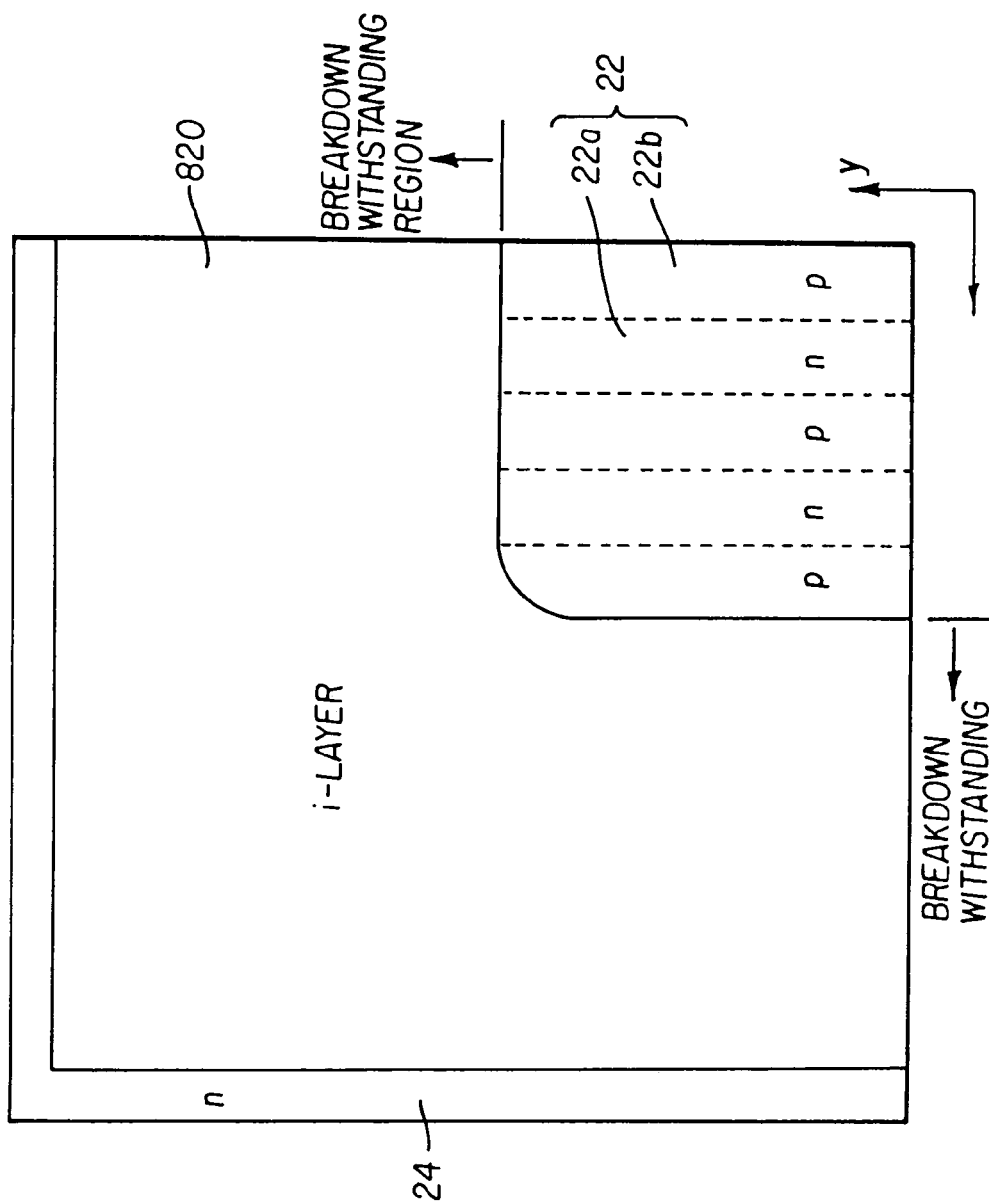
FIG. 15 is a horizontal cross sectional view showing a drain drift region and a breakdown withstanding region of a vertical superjunction MOSFET according to the ninth embodiment of the invention.

FIG. 15 is a horizontal cross sectional view showing a drain drift region and a breakdown withstanding region of a vertical super-junction MOSFET according to a ninth embodiment of the invention. In FIG. 15, the same reference numerals as used in FIG. 6 are used to designate the same constituent elements and their duplicated explanations are omitted for clarity.

Referring to FIG. 15, the device includes a breakdown withstanding region formed of a highly resistive region 820 of an intrinsic semiconductor (i-layer). The i-layer 820 corresponds to a layer including infinitesimally small regions obtained by minimizing the n-type regions and the p-type regions infinitesimally as shown in FIGS. 12 and 13 and by doping an n-type impurity and a p-type impurity into the entire layer at the impurity concentrations, thereat the substantial carrier concentration is zero or almost zero. Since the n-type impurity and the p-type impurity compensate each other, the i-layer is highly resistive. Since the n-type impurity and the p-type impurity in individual n-type regions and p-type regions located very closely to each other compensate each other, the layer including the individual n-type regions and the individual p-type regions is highly resistive. It is preferable for the resistivity of the highly resistive layer described above to be higher than the resistivity of a lightly doped region of one conductivity type. It is more preferable for the resistivity of the highly resistive layer described above to be twice or more as high as the resistivity of the lightly doped region of one conductivity type. Since the highly resistive layer described above is filled with pn-junctions microscopically, the highly resistive region may be deemed as a structure, therein microscopic n-type regions and microscopic p-type regions are mixed. Since the area ratio of the pn-junctions in the unit volume is drastically increased, a high breakdown voltage is obtained.

Highly resistive breakdown withstanding region 820 is formed by repeating implanting impurity ions of one conductivity type into the entire area, therein breakdown withstanding region 820 is to be formed, of the newly laminated epitaxial layer at the concentration, that compensates the impurity of the opposite conductivity type in the preceding epitaxial layer and by finally driving the implanted impurity atoms at once. Alternatively, highly resistive breakdown withstanding region 820 is formed by repeating the steps of growing an epitaxial layer containing the same amounts of a p-type impurity and an n-type impurity.

Tenth Embodiment

Figure 16:
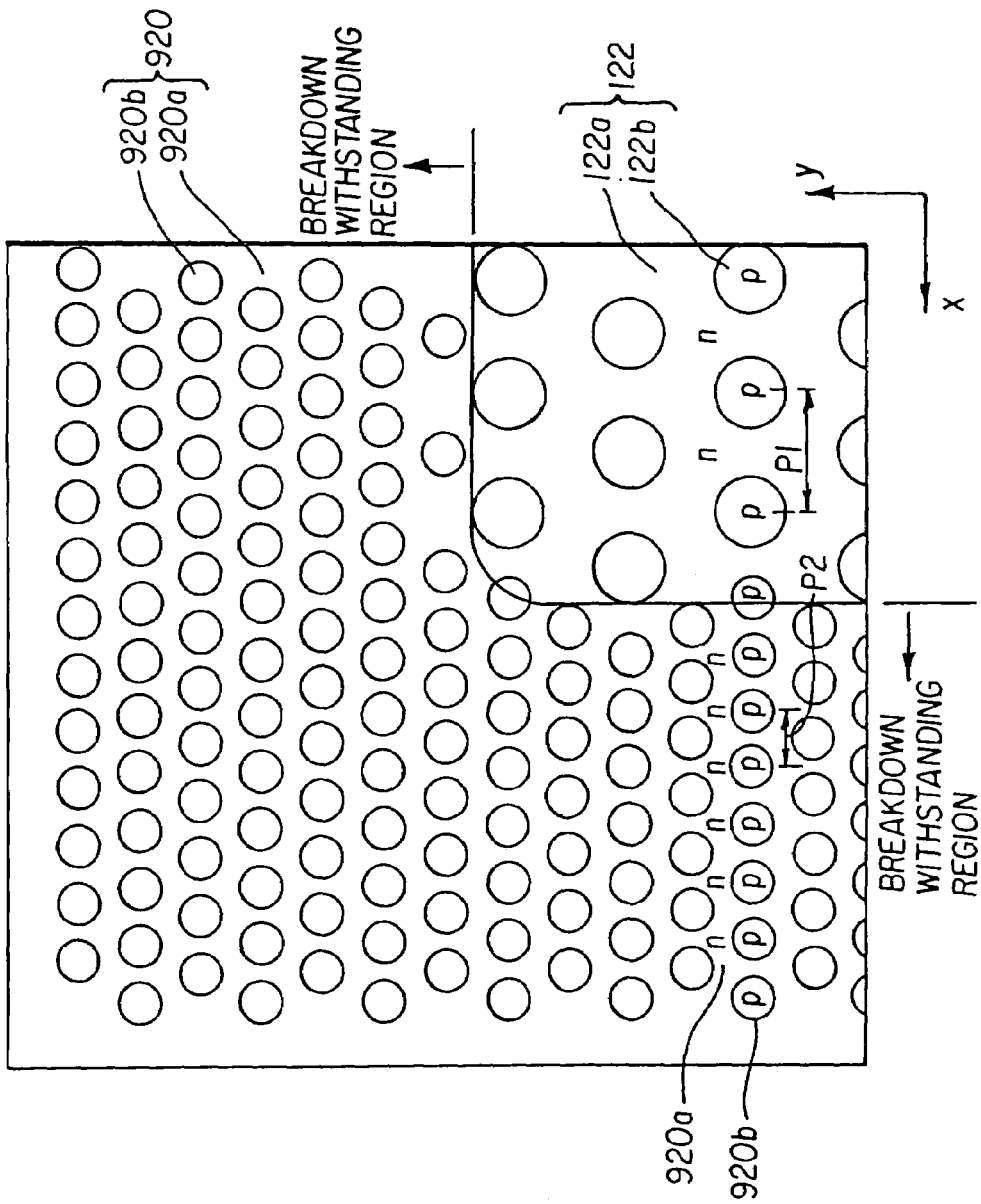
FIG. 16 is a horizontal cross sectional view showing a drain drift region and a breakdown withstanding region of a vertical super-junction MOSFET according to the tenth embodiment of the invention.

FIG. 16 is a horizontal cross sectional view showing a drain drift region and a breakdown withstanding region of a vertical super-junction MOSFET according to a tenth embodiment of the invention. In FIG. 16, the same reference numerals as used in FIG. 6 are used to designate the same constituent elements and their duplicated explanations are omitted for clarity.

Referring to FIG. 16, the first alternating conductivity type layer in a drain drift region 122 of the MOSFET according to the tenth embodiment includes p-type partition regions 122b, each shaped with a circular rod extending in the thickness direction of the semiconductor chip, and an n-type drift current path region 122a surrounding p-type partition regions 122b. The scattered p-type partition regions 122b are located at the lattice points of a planar triangular lattice. Alternatively, p-type partition regions 122b may be located at the lattice points of a planar rectangular lattice or a planar square lattice. The cross sectional area of n-type drift current path region 122a is wider than the total cross sectional area of p-type partition regions 122b. When the total impurity amounts of n-type drift current path region 122a and p-type partition regions 122b are almost the same, the cross sectional area of n-type drift current path region 122a narrower than the total cross sectional area of p-type partition regions 122b poses no problem. Alternatively, a p-type partition region 122b may surround rod-shaped n-type drift current path regions 122a.

The second alternating conductivity type layer in a breakdown withstanding region 920 includes p-type regions 920b, each shaped with a circular rod extending in the thickness direction of the semiconductor chip, and an n-type region 920a surrounding p-type regions 920b. Alternatively, a p-type region 920b may surround rod-shaped n-type regions 920a. The cross sectional area of n-type region 920a is wider than the total cross sectional area of p-type regions 920b. The pitch of repeating P2 in the second alternating conductivity type layer is narrower than the pitch of repeating P1 in the first alternating conductivity type layer. Since the pn-junction area in the second alternating conductivity type layer is twice or more as wide as the pn-junction area in the second alternating conductivity type layer shown in FIG. 6, therein the n-type regions and the p-type regions are shaped with respective plates, a further higher breakdown voltage is obtained when p-type regions 920b are columnar as described in connection with the tenth embodiment.

Eleventh Embodiment

Figure 17:
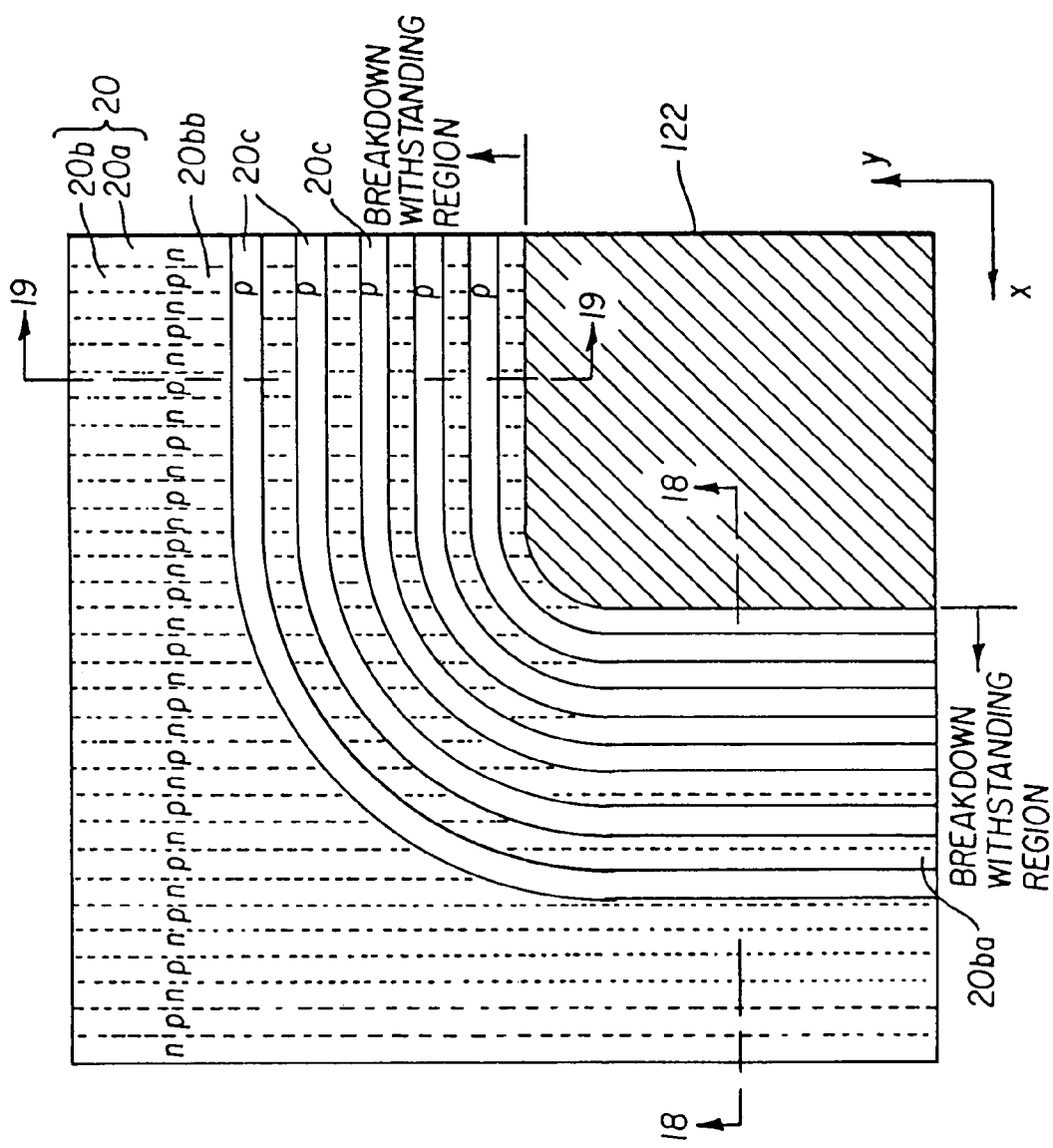
FIG. 17 is a horizontal cross sectional view showing a drain drift region and a breakdown withstanding region of a vertical super-junction MOSFET according to the eleventh embodiment of the invention.
Figure 18:
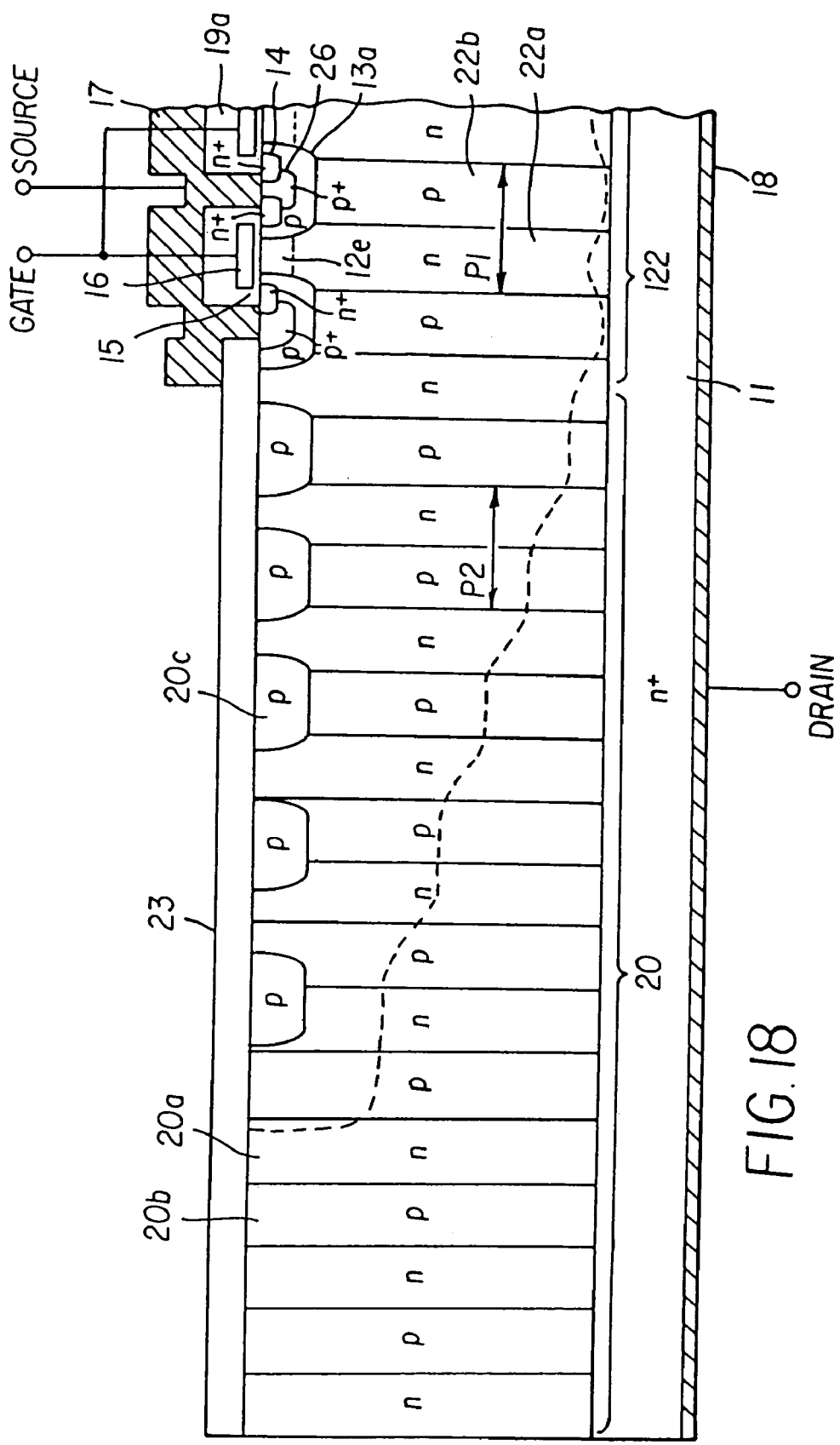
FIG. 18 is the vertical cross sectional view along 18—18 of FIG. 17.
Figure 19:
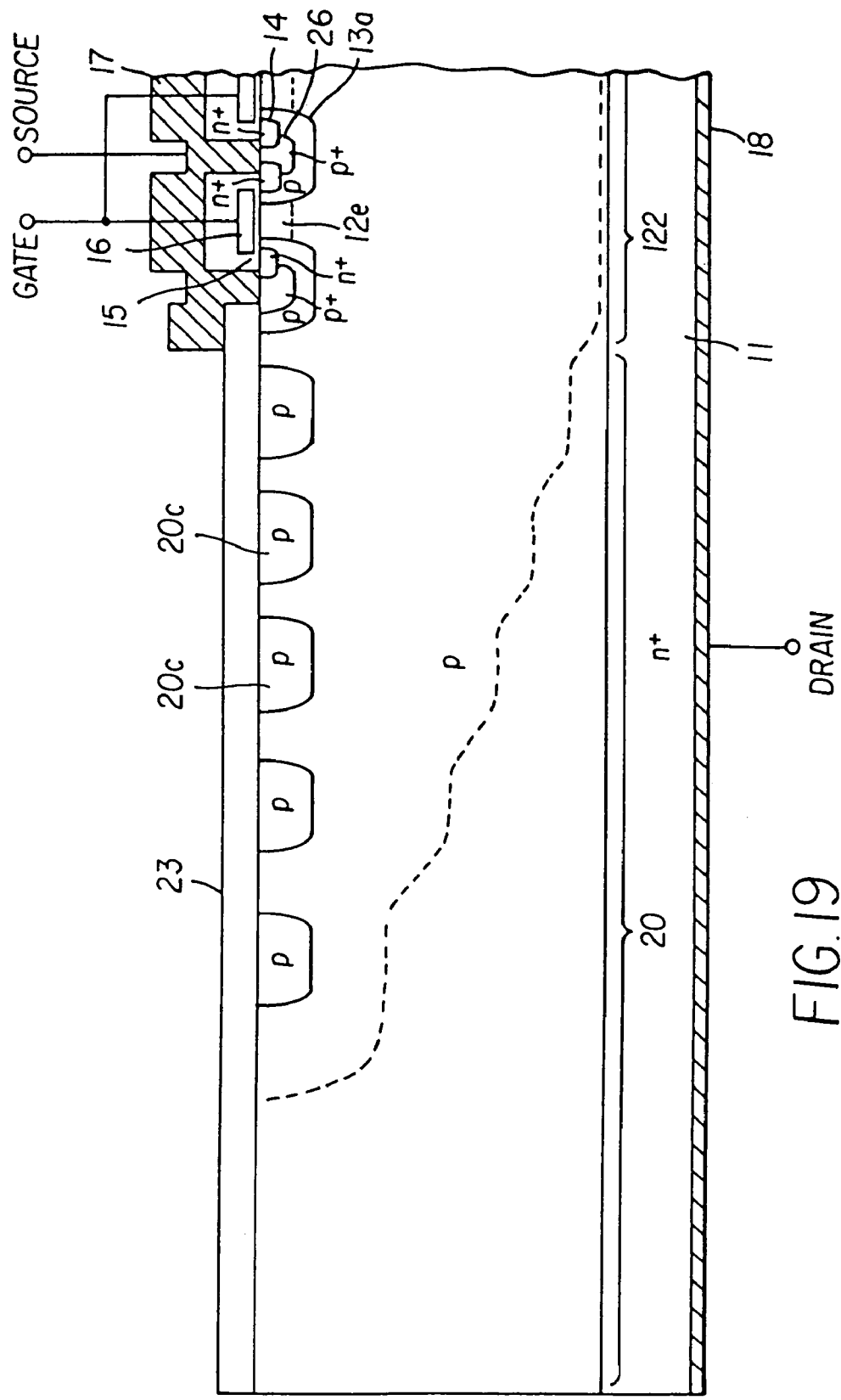
FIG. 19 is the vertical cross sectional view along 19—19 of FIG. 17.

FIG. 17 is a horizontal cross sectional view showing a drain drift region and a breakdown withstanding region of a vertical super-junction MOSFET according to an eleventh embodiment of the invention. FIG. 18 is the vertical cross sectional view along 18—18 of FIG. 17. FIG. 19 is another vertical cross sectional view along 19—19 of FIG. 17. In FIG. 17, a quarter part of the drain drift region is illustrated by hatching. In FIGS. 17 through 19, the same reference numerals as used in FIGS. 6 and 7 are used to designate the same constituent elements and their duplicated explanations are omitted for clarity.

Referring to these figures, the pitch of repeating P1 and the impurity concentrations in the first alternating conductivity type layer in a drain drift region 122 are the same with the pitch of repeating P2 and the impurity concentrations in the second alternating conductivity type layer in a breakdown withstanding region 20. However, p-type voltage equalizing rings 20c, surrounding drain drift region 122, are on breakdown withstanding region 20. The p-type voltage equalizing rings 20c are electrically connected to many p regions 20b in second alternating conductivity type layer. The impurity concentration in p-type voltage equalizing ring 20c is higher than the impurity concentration in p regions 20b.

As the positive drain potential is boosted while the gate and the source are short-circuited with each other, the first alternating conductivity type layer in drain drift region 122 is depleted completely and depletion layers expand from drain drift region 122 to breakdown withstanding region 20. When any voltage equalizing ring 20c is not disposed, depletion layers expand in the Y-direction into p regions 20bb connected directly to p-type base regions 13a. However, since p regions 20ba not connected directly to p-type base regions 13a work only as guard rings in the floating state, the depletion layer expansion into p regions 20ba in the X-direction is not so sufficient, and the electric field strength soon reaches the critical value.

Since the p regions 20ba not connected directly to p-type base regions 13a are connected to p regions 20bb connected directly to p-type base regions 13a via voltage equalizing rings 20c, p regions 20ba are released from the floating state thereof. Since the potential of p regions 20bb is fixed at the source potential, the pn-junctions on p regions 20ba are biased surely at the reverse bias voltage and depletion layers expand in the X-direction. Therefore, a high breakdown voltage is obtained. The broken lines in FIGS. 18 and 19 show the edges of the expanding depletion layers. Since the breakdown withstanding structure is designed independently of the widths of the regions of alternating conductivity types by employing p-type voltage equalizing rings 20c, both a high breakdown voltage and low resistance are realized. Although many p-type voltage equalizing rings 20c are exemplarily shown in FIG. 17, a wide p-type ring may be used for voltage equalization with no problem.

Since the impurity concentration in p-type voltage equalizing ring 20c is higher than the impurity concentration in p region 20b, there remains no possibility that p-type voltage equalizing rings 20c are depleted in association with the depletion of p regions 20b and that p-type rings 20c fail to work as voltage equalizers.

Twelfth Embodiment

Figure 20:
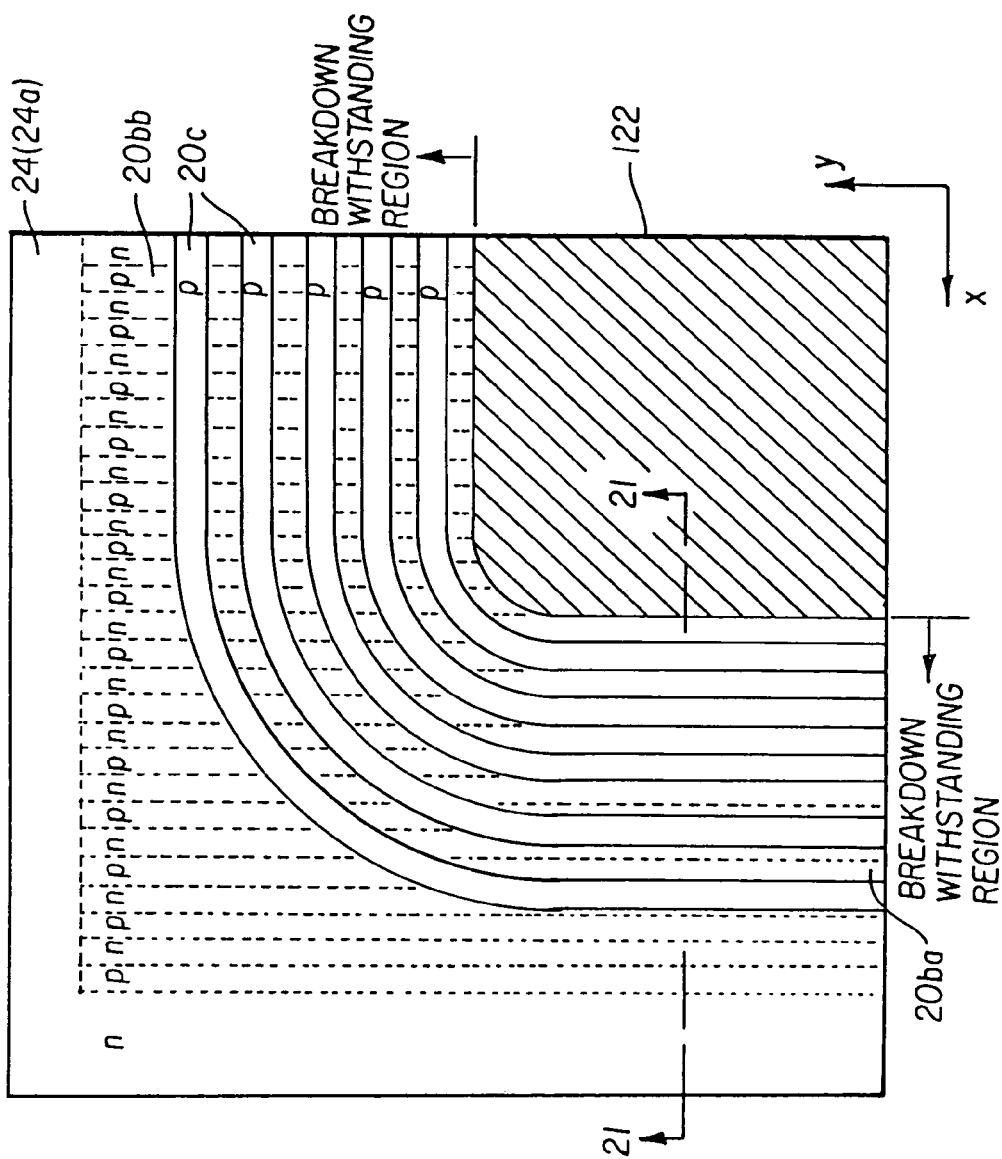
FIG. 20 is a horizontal cross sectional view showing a drain drift region and a breakdown withstanding region of a vertical super-junction MOSFET according to the twelfth embodiment of the invention.
Figure 21:
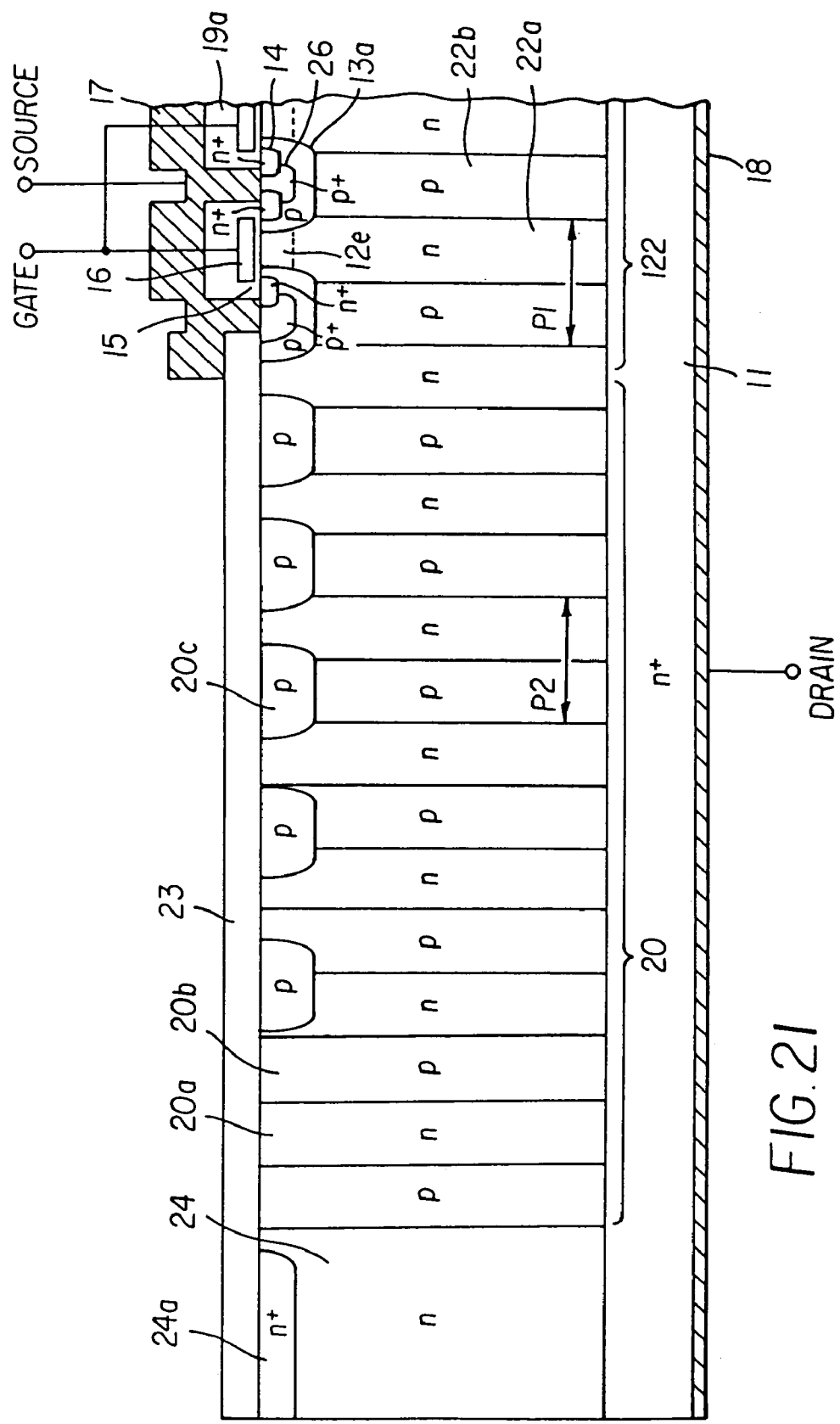
FIG. 21 is the vertical cross sectional view along 21—21 of FIG. 20.

FIG. 20 is a horizontal cross sectional view showing a drain drift region and a breakdown withstanding region of a vertical super-junction MOSFET according to a twelfth embodiment of the invention. FIG. 21 is the vertical cross sectional view taken along the line 21—21 of FIG. 20. In FIG. 20, a quarter part of the drain drift region is illustrated by hatching. In FIGS. 20 and 21, the same reference numerals as used in FIGS. 17 and 18 are used to designate the same constituent elements and their duplicated explanations are omitted for clarity.

Referring to FIGS. 20 and 21, an n-type surrounding region 24 with low electrical resistance is disposed around the second alternating conductivity type layer in breakdown withstanding region 20, and a heavily doped n-type channel stopper 24a is formed on n-type surrounding region 24. Since n-type surrounding region 24 covers the end faces of n-type regions and p-type regions alternately arranged with each other in the second alternating conductivity type layer in breakdown withstanding region 20, a leakage current is prevented from causing. Since the potential of n-type surrounding region 24 is fixed at the drain potential, the widths of the n-type regions and p-type regions in the second alternating conductivity type layer are narrowed and the breakdown voltage of the device is stabilized. It is preferable for n-type surrounding region 24 to be twice or more as wide as n drift current path region 22a or the spacing between p partition regions 22b.

Since the impurity concentration in p-type voltage equalizing ring 20c is higher than the impurity concentration in p region 20b according to the twelfth embodiment, there remains no possibility that p-type voltage equalizing rings 20c are depleted in association with the depletion of p regions 20b and that p-type rings 20c fail to work as voltage equalizers.

Thirteenth Embodiment

Figure 22:
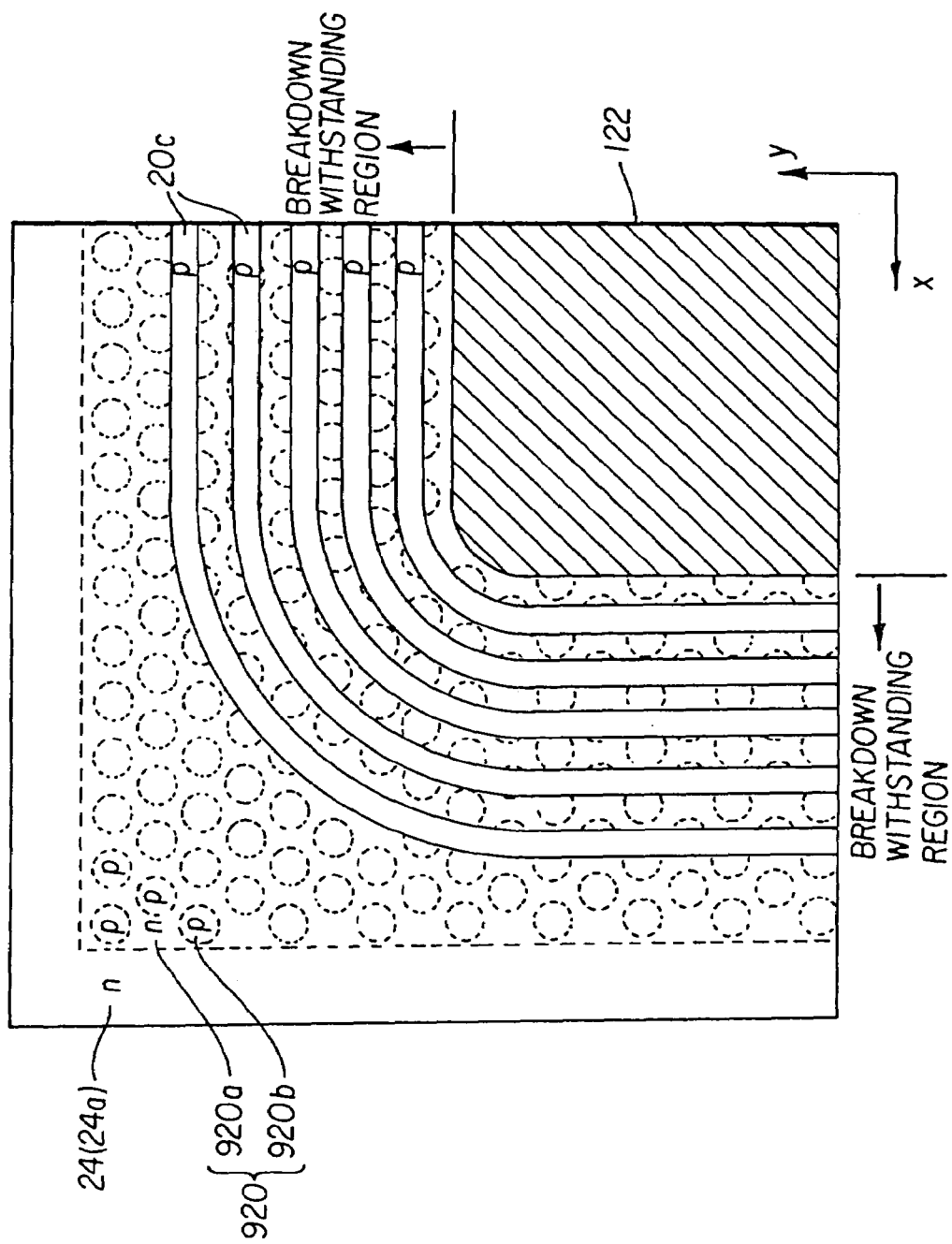
FIG. 22 is a horizontal cross sectional view showing a drain drift region and a breakdown withstanding region of a vertical super-junction MOSFET according to the thirteenth embodiment of the invention.

FIG. 22 is a horizontal cross sectional view showing a drain drift region and a breakdown withstanding region of a vertical super-junction MOSFET according to a thirteenth embodiment of the invention. In FIG. 22, a quarter part of the drain drift region is illustrated by hatching. In FIG. 22, the same reference numerals as used in FIG. 20 are used to designate the same constituent elements and their duplicated explanations are omitted for clarity.

Referring to FIG. 22, the MOSFET according to the thirteenth embodiment includes a breakdown withstanding region 920 including the second alternating conductivity type layer described with reference to FIG. 16. The second alternating conductivity type layer includes p-type regions 920b, each shaped with a circular rod extending in the thickness direction of the semiconductor chip, and an n-type region 920a surrounding p-type regions 920b. The scattered p-type regions 920b are located at the lattice points of a planar triangular lattice. Alternatively, p-type regions 920b may be located at the lattice points of a planar rectangular lattice or a planar square lattice. Many p-type voltage equalizing rings 20c are disposed such that each p-type voltage equalizing rings 20c is electrically connected to many columnar p-type regions 920b in the second alternating conductivity type layer. Although columnar p-type regions 920b are not connected directly to p-type base regions, the potential of p-type regions 920b are fixed at the source potential via p-type voltage equalizing rings 20c. Since depletion layers expand in the X-direction and the Y-direction due to this potential scheme, a high breakdown voltage is obtained.

Since the impurity concentration in p-type voltage equalizing ring 20c is higher than the impurity concentration in p-type region 920b, there remains no possibility that p-type voltage equalizing rings 20c are depleted in association with the depletion of p-type regions 920b and that p-type rings 20c fail to work as voltage equalizers.

Fourteenth Embodiment

Figure 23:
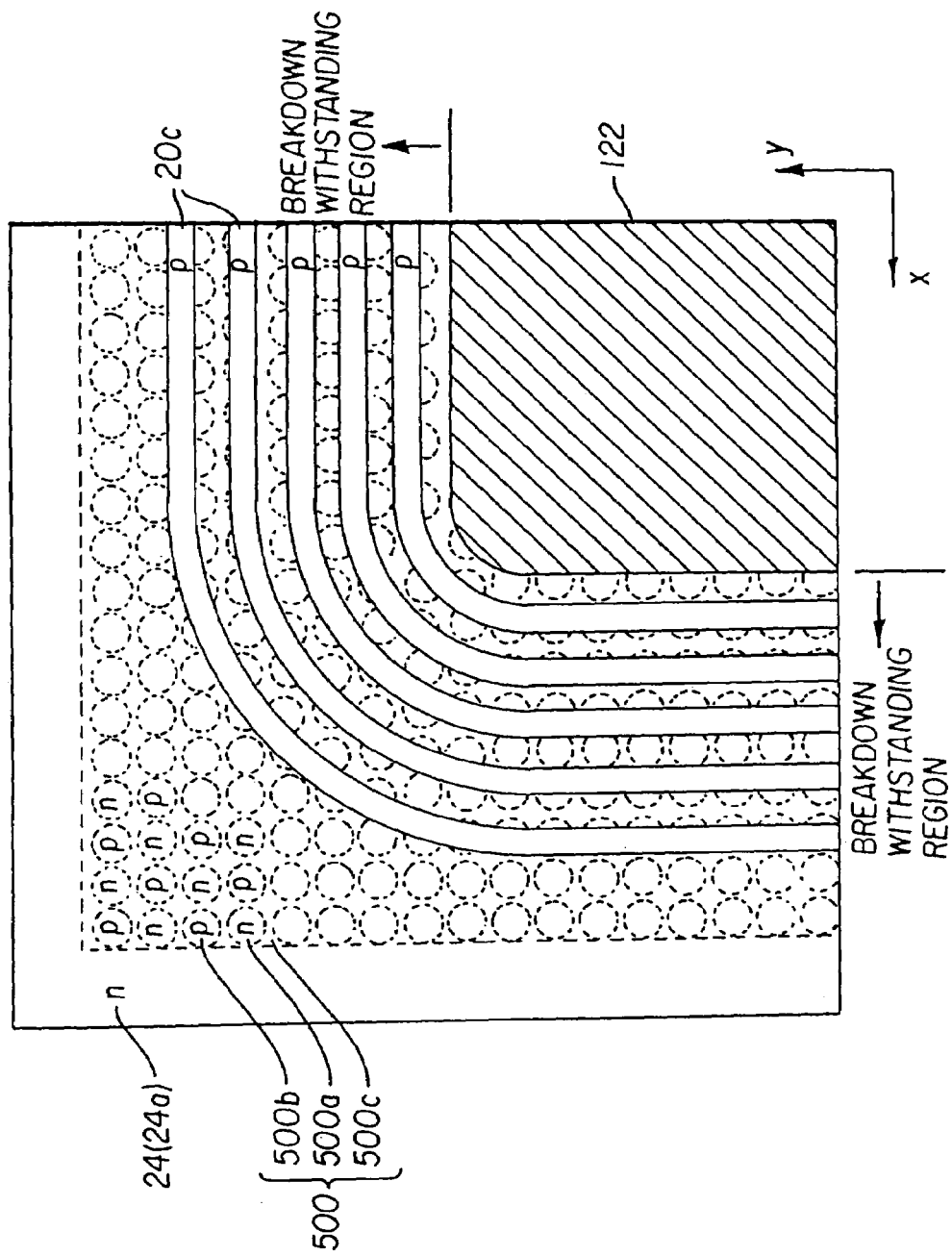
FIG. 23 is a horizontal cross sectional view showing a drain drift region and a breakdown withstanding region of a vertical super-junction MOSFET according to the fourteenth embodiment of the invention.

FIG. 23 is a horizontal cross sectional view showing a drain drift region and a breakdown withstanding region of a vertical super-junction MOSFET according to a fourteenth embodiment of the invention. In FIG. 23, a quarter part of the drain drift region is illustrated by hatching. In FIG. 23, the same reference numerals as used in FIG. 20 are used to designate the same constituent elements and their duplicated explanations are omitted for clarity.

Referring to FIG. 23, the MOSFET according to the fourteenth embodiment includes a breakdown withstanding region 5000 including a second alternating conductivity type layer. The second alternating conductivity type layer includes n-type regions 500a, each shaped with a circular rod extending in the thickness direction of the semiconductor chip, p-type regions 500b, each shaped with a circular rod extending in the thickness direction of the semiconductor chip, and a highly resistive region 500c surrounding n-type regions 500a and p-type regions 500b. The n-type regions 500a and p-type regions 500b are arranged alternately with each other. The n-type regions 500a are located at the lattice points of a planar rectangular lattice and the p-type regions 500b are located at the lattice points of another planar rectangular lattice. Alternatively, n-type regions 500a and the p-type regions 500b are located at the lattice points of respective rectangular lattices or at the lattice points of respective square lattices. Region 500c corresponds to the highly resistive region doped with the same amounts of a p-type impurity and an n-type impurity and filling the breakdown withstanding region according to the ninth embodiment. Since the n-type impurity and the p-type impurity compensate each other, the substantial carrier concentration in region 500c is zero or almost zero. Therefore, region 500c is very resistive. Since very many pn-junctions are densely packed in region 500c, region 500 facilitates obtaining a high breakdown voltage. In the second alternating conductivity type layer, therein columnar n-type regions 500a and columnar p-type regions 500b are arranged alternately with each other, columnar p-type regions 500b are connected to the source potential via p-type voltage equalizing rings 20c, although p-type regions 500b are not connected directly to p-type base regions. Since columnar p-type regions 500b are connected to the source potential via p-type voltage equalizing rings 20c, depletion layers expand evenly to the X-direction and the Y-direction. Therefore, a high breakdown voltage is obtained.

Since the impurity concentration in p-type voltage equalizing ring 20c is higher than the impurity concentration in p-type region 500b, there remains no possibility that p-type voltage equalizing rings 20c are depleted in association with the depletion of p-type regions 500b and that p-type rings 20c fail to work as voltage equalizers. The p-type voltage equalizing ring 20c is covered with an oxide film 23. Alternatively, a field plate may be connected to p-type voltage equalizing ring 20c.

Fifteenth Embodiment

Figure 24:
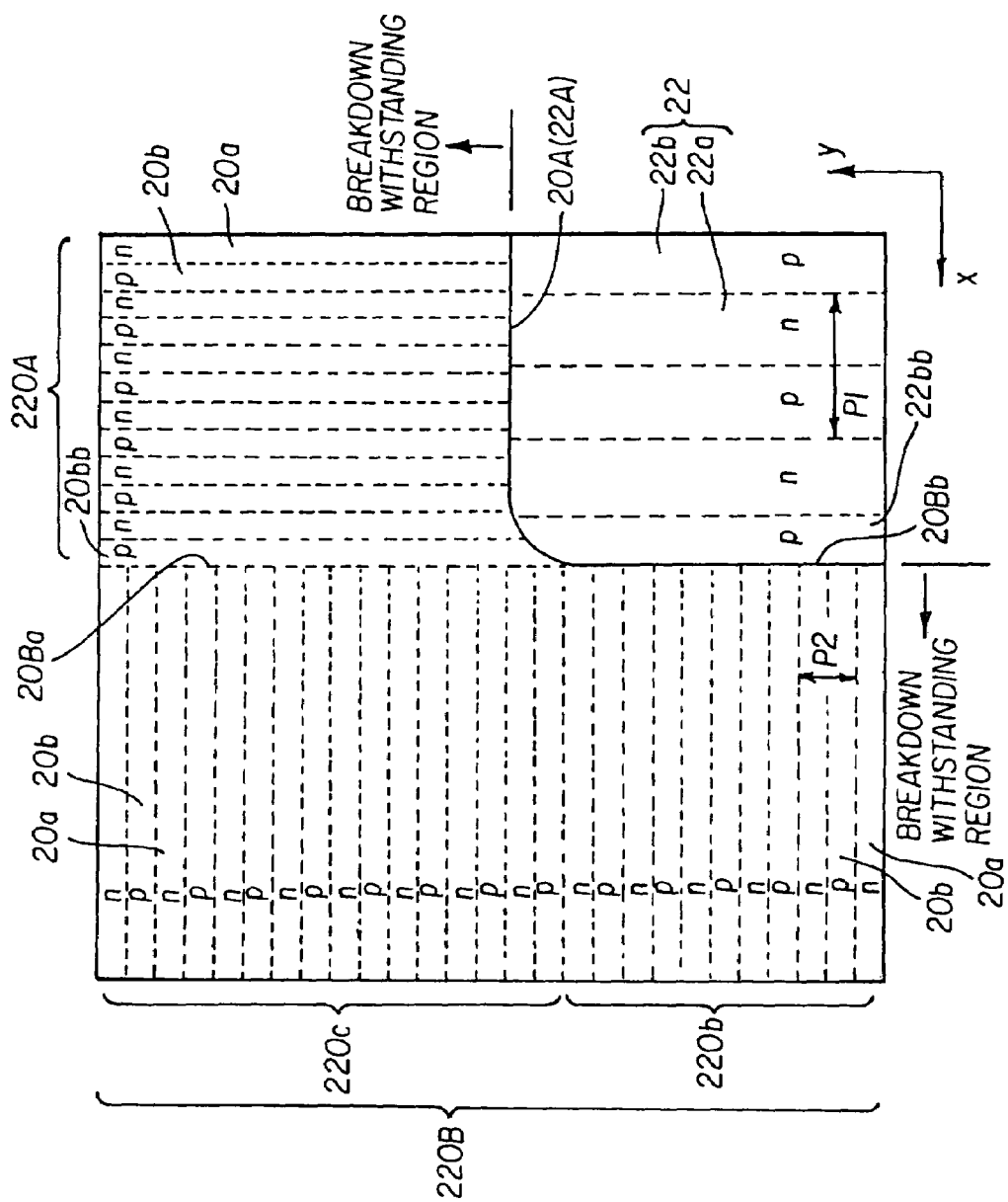
FIG. 24 is a horizontal cross sectional view showing a drain drift region and a breakdown withstanding region of a vertical super-junction MOSFET according to the fifteenth embodiment of the invention.

FIG. 24 is a horizontal cross sectional view showing a drain drift region and a breakdown withstanding region of a vertical super-junction MOSFET according to a fifteenth embodiment of the invention. In FIG. 24, a quarter part of the drain drift region is illustrated by hatching. In FIG. 24, the same reference numerals as used in FIG. 6 are used to designate the same constituent elements and their duplicated explanations are omitted for clarity.

Referring to FIG. 24, the second alternating conductivity type layer of the breakdown withstanding region of a vertical super-junction MOSFET according to the fifteenth embodiment includes a first alternating conductivity type section 220A and a second alternating conductivity type section 220B. The n-type regions and the p-type regions in first section 220A extend almost in parallel to n drift current path regions 22a and p partition regions 22b in drain drift region 22. The n-type regions and the p-type regions in second section 220B extend almost in perpendicular to n drift current path regions 22a and p partition regions 22b in drain drift region 22. The plane 20A, on that the end faces of the n-type regions and the p-type regions in first section 220A are arranged alternately, is bonded to the plane 22A, on that the end faces of n drift current path regions 22a and p partition regions 22b in the drain drift region 22 are arranged alternately. The plane 20Bb, on that the end faces of the n-type regions and the p-type regions in a first subsection 220b of second section 220B are arranged alternately, is bonded to the boundary plane of the outermost p partition region 22bb in drain drift region 22. The plane 20Bc, on that the end faces of the n-type regions and the p-type regions in a second subsection 220c of second section 220B are arranged alternately, is bonded to the boundary plane of the innermost p region 20bb in first section 220A.

In breakdown withstanding region 220 shown in FIG. 6 that includes one single alternating conductivity type layer, the section thereof corresponding to second section 220B in FIG. 24 works only as a guard ring, since p regions 20bb not in contact with drain drift region 22 do not contribute to distributing the source potential. In contrast, the p-type regions in first subsection 220b, the end faces thereof are bonded to the outermost p partition region 22bb, are connected to the source potential. Therefore, all the p regions 20b in first subsection 220b contribute to distributing the source potential. The p-type regions in second subsection 220c, the end faces thereof are bonded to the innermost p region 20bb of first section 220A, are also connected to the source potential. Therefore, all the p regions 20b in second subsection 220c contribute to distributing the source potential. Since the reverse bias voltage is applied to the entire breakdown withstanding region and the entire breakdown withstanding region is depleted quickly due to the structure described above, it is not necessary to dispose any voltage equalizing ring on the breakdown withstanding region. The p regions 20b in first alternating conductivity type section 220A work as a means for distributing the source potential. A voltage equalizing ring disposed on the breakdown withstanding region poses no problem.

Typical dimensions and impurity concentrations for the MOSFET exhibiting a breakdown voltage of the 600 V class are as follows. The specific resistance of drain layer 11 is 0.01 Ωcm. The thickness of drain layer 11 is 350 µm. The impurity concentrations in drift current path region 22a and partition region 22b are $2 \times 10^{15}$ cm$^{-3}$. The thickness of drift current path region 22a and the thickness of partition region 22b are 40 µm. The pitch of repeating, at that a pair of drift current path region 22a and partition region 22b is repeated in the drain drift region, is 16 µm. The impurity concentrations in n region 20a and p region 20b are $5 \times 10^{14}$ cm$^{-3}$. The pitch of repeating, at that a pair of n region 20a and p region 20b is repeated in the breakdown withstanding region, is 8 µm. The width of outermost partition region 22bb is 4 µm.

Sixteenth Embodiment

Figure 25:
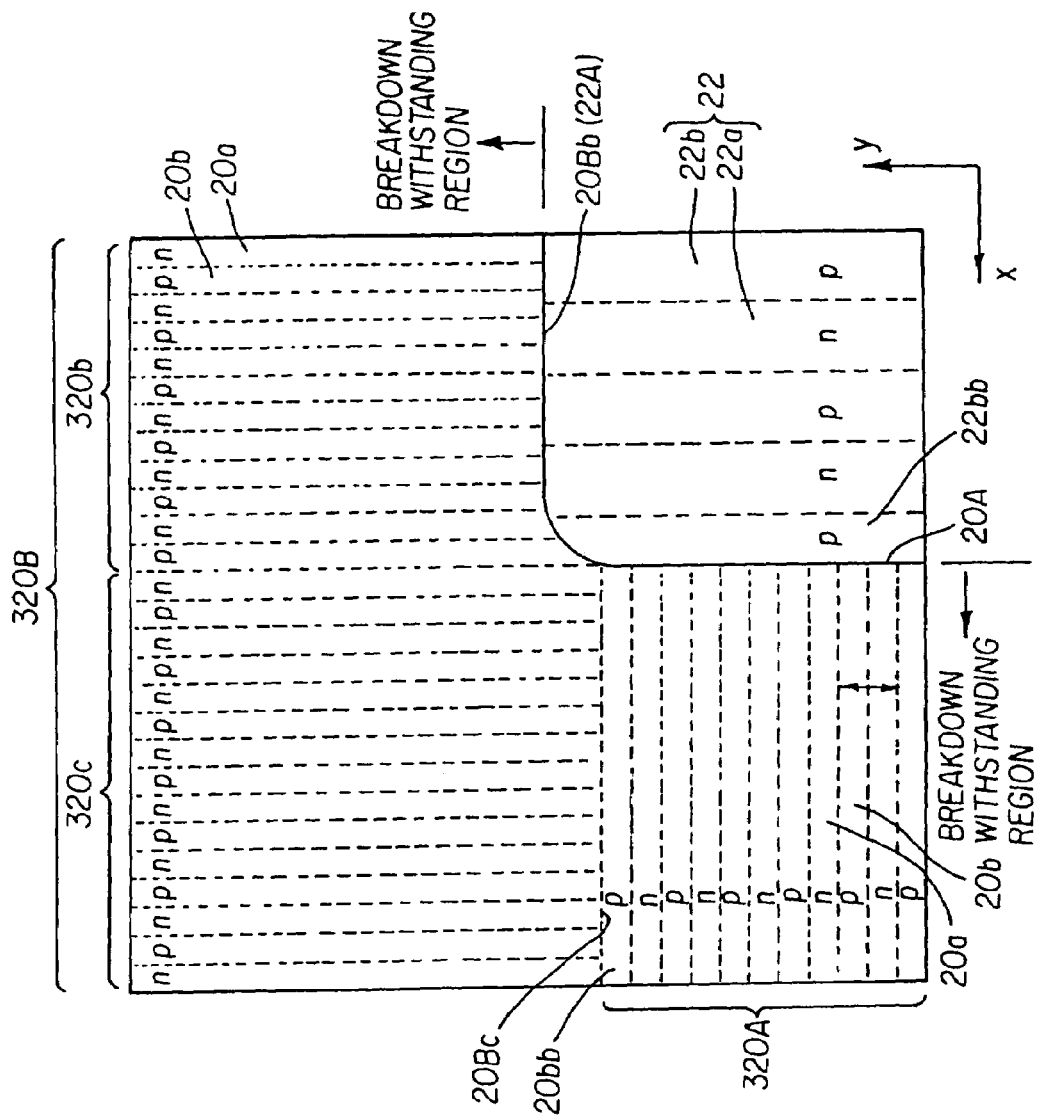
FIG. 25 is a horizontal cross sectional view showing a drain drift region and a breakdown withstanding region of a vertical super-junction MOSFET according to the sixteenth embodiment of the invention.

FIG. 25 is a horizontal cross sectional view showing a drain drift region and a breakdown withstanding region of a vertical super-junction MOSFET according to a sixteenth embodiment of the invention. In FIG. 25, a quarter part of the drain drift region is illustrated by hatching. In FIG. 25, the same reference numerals as used in FIG. 8 are used to designate the same constituent elements and their duplicated explanations are omitted for clarity.

Referring to FIG. 25, the second alternating conductivity type layer of the breakdown withstanding region of a vertical super-junction MOSFET according to the sixteenth embodiment includes a first alternating conductivity type section 320A and a second alternating conductivity type section 320B. The n-type regions and the p-type regions in first section 320A extend almost in perpendicular to n-type drift current path regions 20a and p-type partition regions 20b in drain drift region 22. The n-type regions and the p-type regions in second section 320B extend almost in parallel to the n-type regions and the p-type regions in drain drift layer 22. The plane 20A, on that the end faces of the n-type regions and the p-type regions in first section 320A are arranged alternately, is bonded to the boundary plane of the outermost p partition region 22bb in drain drift region 22. The plane 20Bb, on that the end faces of the n-type regions and the p-type regions in a first subsection 320b of second section 320B are arranged alternately, is bonded to the plane 22A, on that the end faces of the n-type drift current path regions and the p-type regions in the drain drift region 22 are arranged alternately. The plane 20Bc, on that the end faces of the n-type regions and the p-type regions in a second subsection 320c of second section 320B are arranged alternately, is bonded to the boundary plane of the innermost p region 20bb in first section 320A.

In breakdown withstanding region 220 shown in FIG. 8, that includes one single alternating conductivity type layer, the section thereof corresponding to second section 320B in FIG. 25 works only as a guard ring, since p regions 20bb not in contact with drain drift region 22 do not contribute to distributing the source potential. In contrast, since the plane 20Bb of first subsection 320b is connected to the plane 20A, all the p regions 20b in first subsection 320b contribute to distributing the source potential. Since the plane 20Bc of second subsection 320c is connected to the innermost p region 20bb of first alternating conductivity type section 320A, all the p regions 20b in second subsection 320c contribute to distributing the source potential. Since the reverse bias voltage is applied to the entire breakdown withstanding region and the entire breakdown withstanding region is depleted quickly due to the structure described above, it is not necessary to dispose any voltage equalizing ring on the breakdown withstanding region. The p regions 20bb in first alternating conductivity type section 320A work as a means for distributing the source potential. A voltage equalizing ring disposed on the breakdown withstanding region poses no problem.

Seventeenth Embodiment

Figure 26:
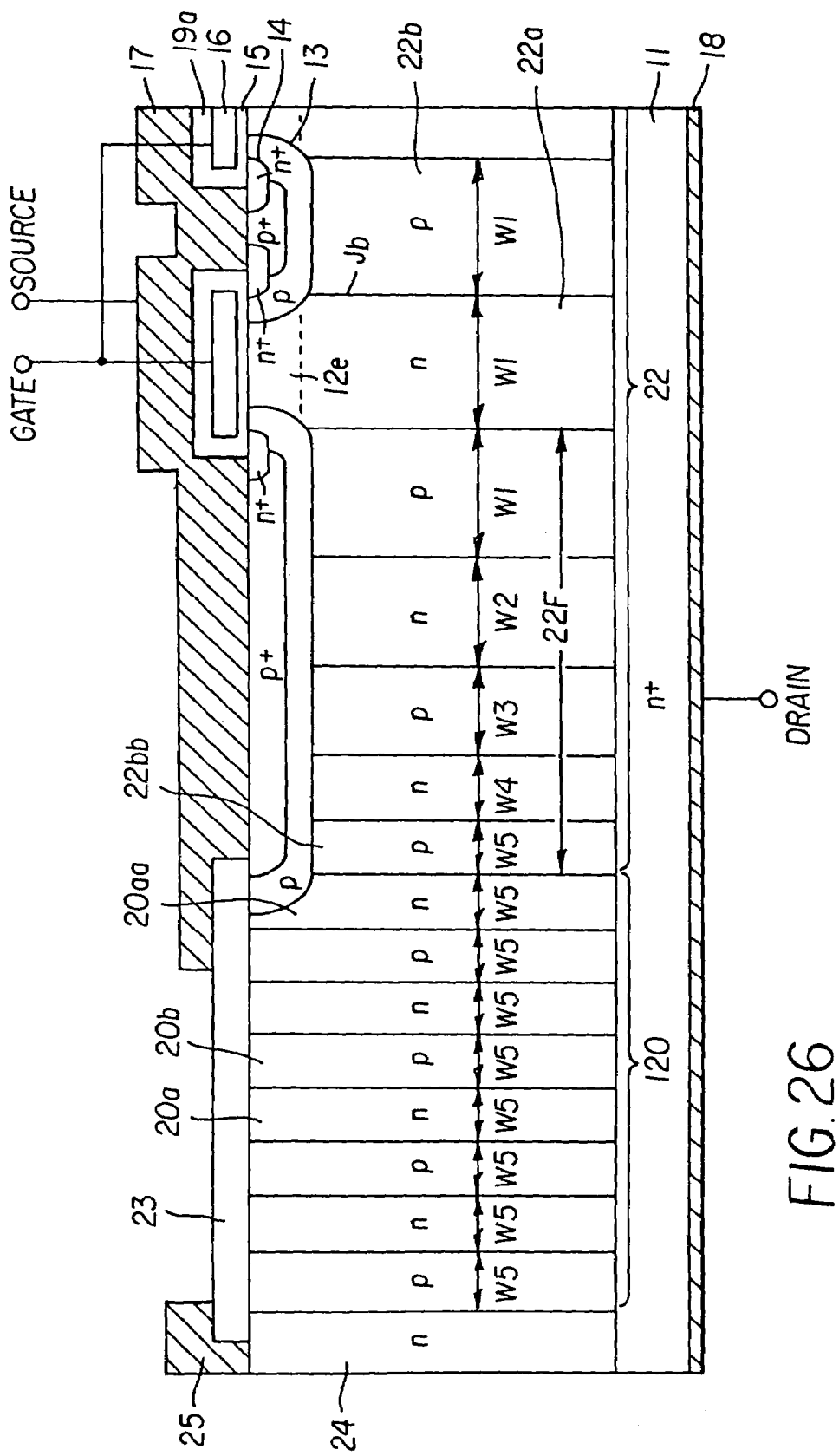
FIG. 26 is a vertical cross sectional view showing a drain drift region and a breakdown withstanding region of a vertical super-junction MOSFET according to the seventeenth embodiment of the invention.

FIG. 26 is a vertical cross sectional view showing a drain drift region and a breakdown withstanding region of a vertical super-junction MOSFET according to the seventeenth embodiment of the invention. In FIG. 26, the same reference numerals as used in FIG. 7 are used to designate the same constituent elements and their duplicated explanations are omitted for clarity.

The vertical super-junction MOSFET according to the seventeenth embodiment is an improvement of the MOSFET according to the third embodiment shown in FIGS. 6 and 7. In the MOSFET according to the third embodiment, pitch of repeating P2, at that a pair of the p-type region and n-type region is repeated in breakdown withstanding region 220, is narrower than pitch of repeating P1, at that a pair of p partition region 22b and n drift current path region 22a is repeated in drain drift region 22. Since there exists a sudden gap between the widths of the outermost partition region 22bb of drain drift region 22 and the innermost n region 20aa of breakdown withstanding region 220, imbalance is caused between the charge amounts in the outermost partition region 22bb and the innermost n region 20aa. Due to the charge imbalance, a high electric field strength is caused across the boundary between the outermost partition region 22bb and the innermost n region 20aa and it is difficult for the MOSFET according to the third embodiment to exhibit a high breakdown voltage.

Referring to FIG. 26, the widths of a region 20a and a region 20b in a breakdown withstanding region 120 are set at $W_5$. Drain drift region 22 includes a first transition region 22F, therein the widths of drift current path regions 22a and partition regions 22b in a breakdown withstanding region 120 decrease gradually from $W_1$ to $W_5$ toward the boundary between drain drift region 22 and breakdown withstanding region 120 such that the width of the outermost partition region 22bb is equal to the width of the innermost n region 20aa of breakdown withstanding region 120. First transition region 22F is below the edge portion of source electrode 17. Since charge balance is realized by equalizing the charge quantities in the regions on both sides of a pn-junction, the electric field across the boundary between breakdown withstanding region 120 and drain drift region 22 is relaxed and a high breakdown voltage is obtained.

Typical dimensions and impurity concentrations for the MOSFET exhibiting a breakdown voltage of the 600 V class are as follows. The specific resistance of drain layer 11 is 0.01 Ωcm. The thickness of drain layer 11 is 350 µm. The impurity concentrations in drift current path region 22a and partition region 22b are $2 \times 10^{15}$ cm$^{-3}$. The thickness of drift current path region 22a and the thickness of partition region 22b are 40 µm. The width $W_1$ is 8 µm, the width $W_2$ 7 µm, the width $W_3$ 6 µm, the width $W_4$ 5 µm, and the width $W_2$ 4 µm. The widths of the windows in the resist mask are 4.0 µm, 3.5 µm, 3.0 µm, 2.5 µm, and 2 µm corresponding to the widths of the regions $W_1$, $W_2$, $W_3$, $W_4$, and $W_5$, respectively.

The regions in the alternating conductivity type layers are not necessarily shaped with respective plates. The regions in the alternating conductivity type layers positioned at the lattice points of a square lattice or serpentine pn-junction planes pose no problem.

Eighteenth Embodiment

Figure 27:
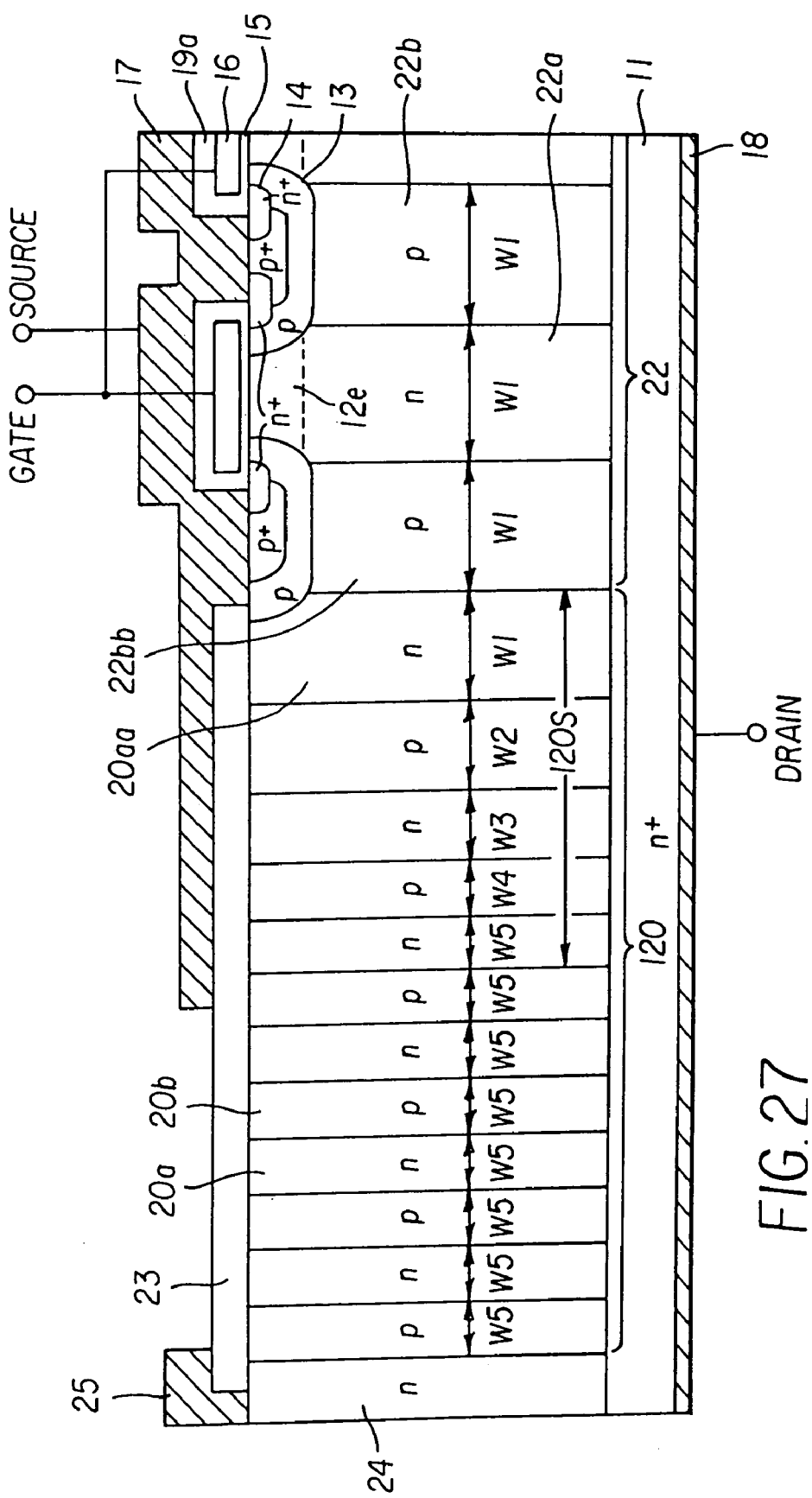
FIG. 27 is a vertical cross sectional view showing a drain drift region and a breakdown withstanding region of a vertical super-junction MOSFET according to the eighteenth embodiment of the invention.
Figure 28:
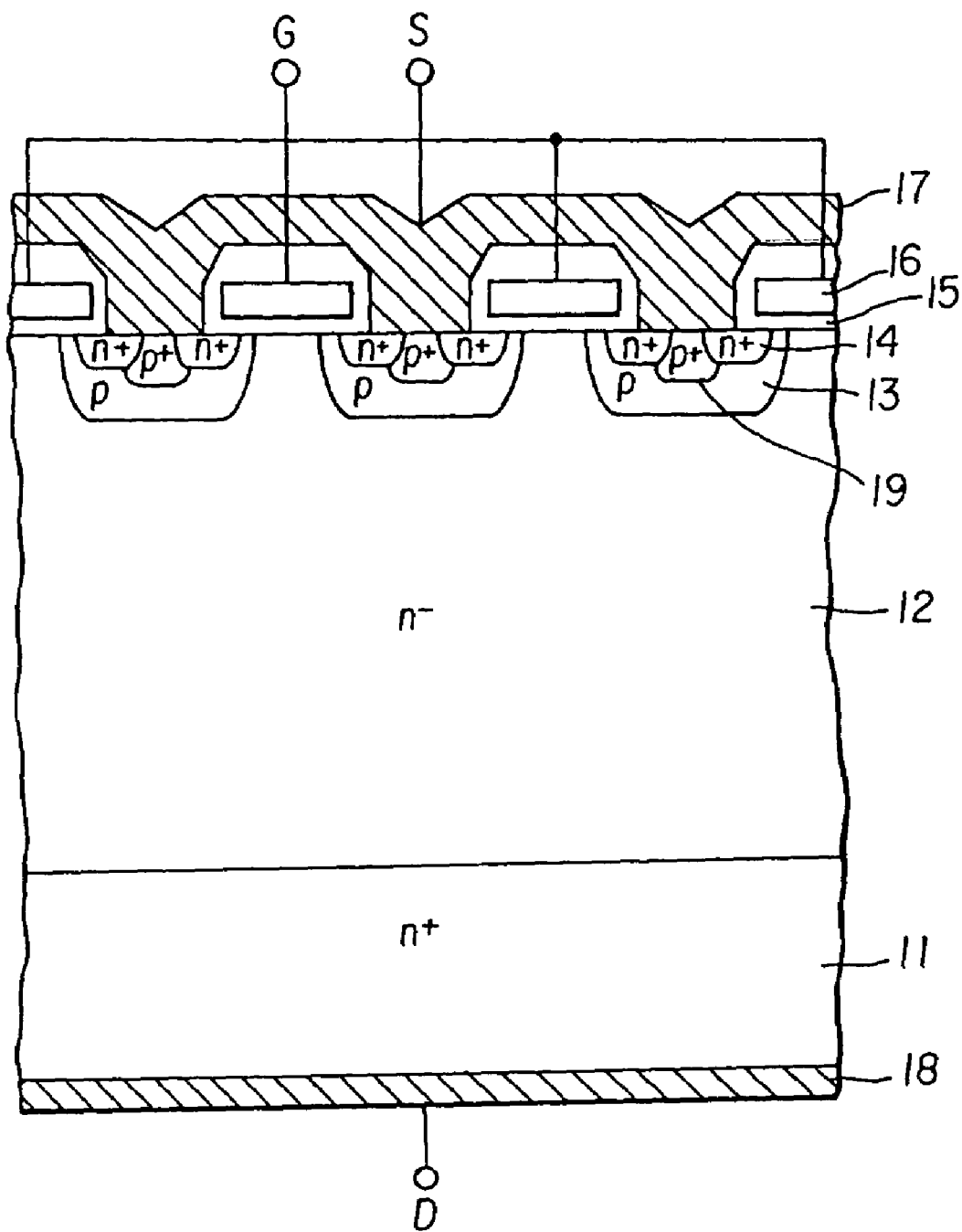
FIG. 28 is a cross sectional view of a conventional planar-type n-channel vertical MOSFET.
Figure 29:
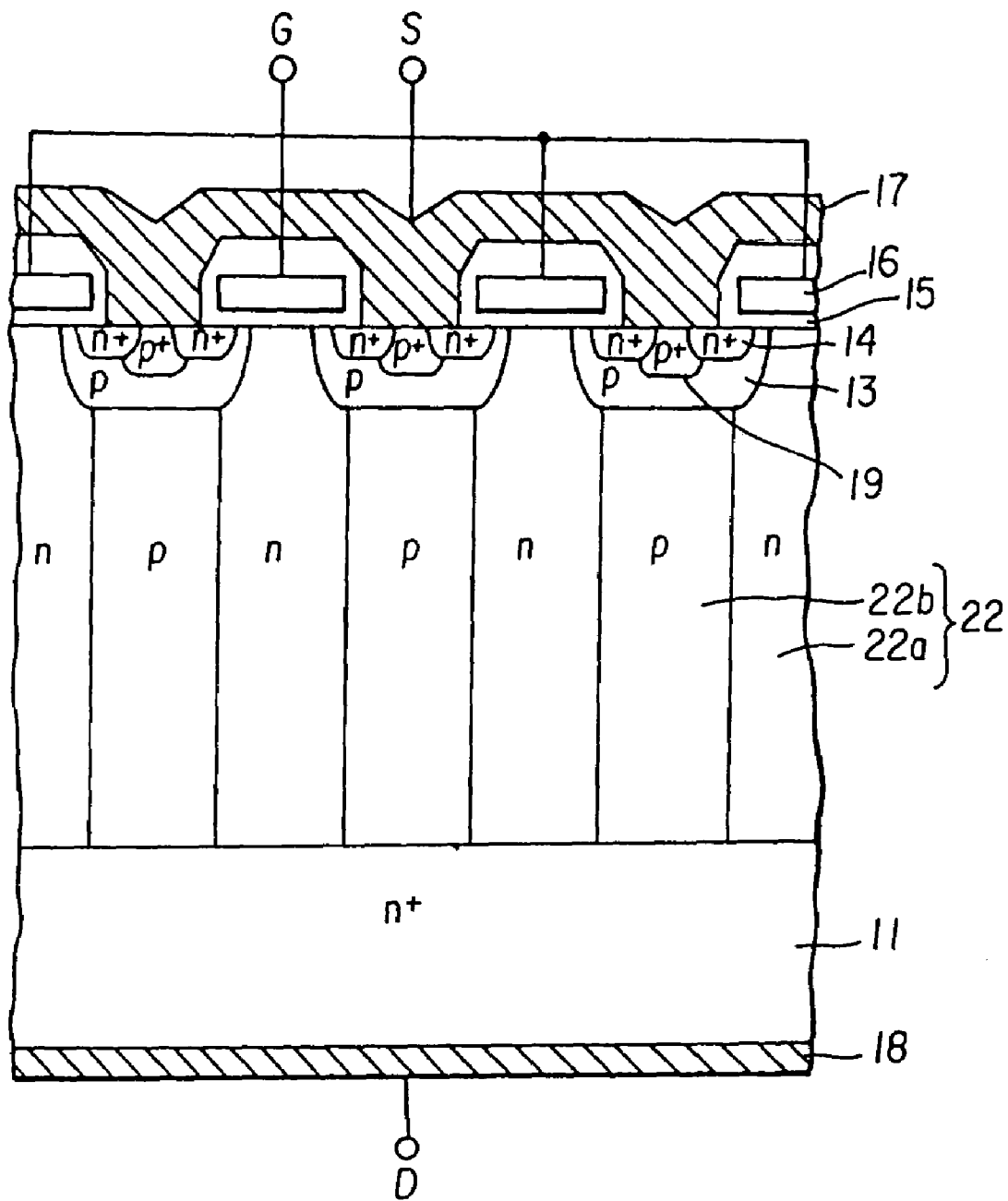
FIG. 29 is a cross sectional view of the vertical MOSFET disclosed in U.S. Pat. No. 5,216,275.

FIG. 27 is a vertical cross sectional view showing a drain drift region and a breakdown withstanding region of a vertical super-junction MOSFET according to an eighteenth embodiment of the invention. In FIG. 27, the same reference numerals as used in FIG. 26 are used to designate the same constituent elements and their duplicated explanations are omitted for clarity.

The MOSFET according to the eighteenth embodiment is different from the MOSFET according to the seventeenth embodiment in that a source electrode 17 is extended onto a part of oxide film 23 on breakdown withstanding region 120. The MOSFET according to the eighteenth embodiment is different from the MOSFET according to the seventeenth embodiment also in that the widths of regions 22a and 22b of drain drift region 22 are set at $W_1$ and the breakdown withstanding region 120 includes a second transition region 120, therein the widths of regions 20a and 20b of breakdown withstanding region 120 increase gradually from $W_5$ to $W_1$ toward drain drift region 22 such that the width of the innermost nregion 20a a is the same with the width of the outermost partition region 22bb. Second transition region 120S is below the extended edge portion of source electrode 17. Since the electric field across the boundary between breakdown withstanding region 120 and drain drift region 22 is relaxed in the same manner as according to the seventeenth embodiment, a high breakdown voltage is obtained according to the eighteenth embodiment. The width of p-type base region 13 may be narrowed according to the eighteenth embodiment.

Although the embodiments described so far include double-diffusion-type vertical MOSFET, the second alternating conductivity type layers are applicable also to IGBT (conductivity-modulation-type MOSFET), bipolar transistors, pn-junction diodes and Schottky diodes. The second alternating conductivity type layers facilitates obtaining a high breakdown voltage in the breakdown withstanding region of the device including a drain drift region not formed of an alternating conductivity type layer but a layer of one conductivity type.

The breakdown withstanding region, that surrounds the drain drift region of a semiconductor device and includes an alternating conductivity type layer or a highly resistive layer, therein an impurity of a first conductivity type and an impurity of a second conductivity type are doped such that the resulting carrier concentration is zero or almost zero, exhibits the following effects.

The alternating conductivity type layer arranged around the drain drift region facilitates expanding depletion layers from the multiple pn-junctions into the n-type regions and the p-type regions alternately arranged with each other, depleting not only the area around the active region but also the outer area of the device and the area on the side of the second major surface. Therefore, a high breakdown voltage is obtained in the breakdown withstanding region, and the breakdown voltage of the breakdown withstanding region is higher than the breakdown voltage of the drain drift region. Since a breakdown voltage higher than that in the drain drift region is obtained in the breakdown withstanding region by forming the breakdown withstanding region of an alternating conductivity type layer even when the drain drift region is formed of an alternating conductivity type layer, the structure of the alternating conductivity type layer in the drain drift region is optimized easily, the design freedoms for designing a super-junction semiconductor device is increased, and, therefore, development of super-junction semiconductor devices is facilitated.

A breakdown voltage higher than the breakdown voltage of the drain drift region is surely obtained and the reliability of the device is improved when the impurity concentrations of the alternating conductivity type layer in the breakdown withstanding region are lower than the impurity concentrations of the alternating conductivity type layer in the drain drift region or when the pitch of repeating in the breakdown withstanding region, at that a pair of an n-type region and a p-type region is repeated, is narrower than the pitch of repeating in the drain drift region, at that a pair of an n-type drift current path region and a p-type partition region is repeated.

When the first regions and the second regions in the breakdown withstanding region are extend vertically and laminated alternately with each other, the manufacturing steps and, therefore, the manufacturing costs are reduced, since the alternating conductivity type layer in the breakdown withstanding region can be formed simultaneously by employing the manufacturing steps for forming the alternating conductivity type layer in the drain drift region.

When at least either the first regions or the second regions of the alternating conductivity type layer in the breakdown withstanding region are formed of unit diffusion regions scattered in the thickness direction of the semiconductor chip and connected vertically with each other, the alternating conductivity type layer is formed easily.

When the boundary planes between the drift current path regions and the partition regions extend vertically and in parallel to each other, the boundary planes between the first regions and the second regions of the breakdown withstanding region may be extended almost in parallel to, almost in perpendicular to, or obliquely to the boundary planes between the drift current path regions and the partition regions. Especially when the boundaries between the first regions and the second regions in the breakdown withstanding region are extended obliquely to the boundaries between the drift current path regions and the partition regions in the drain drift region, all the second regions of the second conductivity type are surely connected to the partition regions or to the active region and the entire breakdown withstanding region is depleted.

The drain drift region is provided with a first transient region, therein the widths of the drift current path regions and the partition regions are decreasing gradually toward the breakdown withstanding region such that the width of the outermost partition region is the same with the width of the innermost first region of the first conductivity type, when the boundary planes between the first regions and the second regions of the breakdown withstanding region extend almost in parallel to the boundary planes between the drift current path regions and the partition regions of the drain drift region, the plane, thereon the end faces of the first regions and the second regions are arranged alternately, is bonded to the plane, thereon the end faces of the drift current path regions and the partition regions are arranged alternately, and the boundary plane of the innermost first region is bonded to the boundary plane of the outermost partition region. Since the charge quantities of the outermost partition region and the innermost first region are equalized and an ideal charge balance is realized, the electric field across the boundary between the outermost partition region and the innermost first region is relaxed and a high breakdown voltage is realized. Alternatively, the breakdown withstanding is provided with a second transient region, therein the widths of the first regions and the second regions are increasing gradually toward the drain drift region such that the width of the innermost first region of the first conductivity type is the same with the width of the outermost partition region.

The alternating conductivity type layer of the breakdown withstanding region includes a first alternating conductivity type section including the first regions and the second regions, the boundary planes therebetween extend almost in parallel to the boundary planes between the drift current path regions and the partition regions of the drain drift region; and a second alternating conductivity type section including the first regions and the second regions, the boundary planes therebetween extend in perpendicular to the boundary planes between the drift current path regions and the partition regions of the drain drift region. In the structure described above, the plane, thereon the end faces of the first regions and the second regions of the first alternating conductivity type section are arranged alternately, is bonded to the plane, thereon the end faces of the drift current regions and the partition regions of the drain drift region are arranged alternately; and the plane, thereon the end faces of the first regions and the second regions of the second alternating conductivity type section are arranged alternately, is bonded to the boundary plane of the outermost partition region of the drain drift region. And, the alternating conductivity type layer of the breakdown withstanding region further includes a third alternating conductivity type section in the corner portion of the breakdown withstanding region defined by the first alternating conductivity type section and the second alternating conductivity type section; the third alternating conductivity type section including the first regions and the second regions; and the plane, thereon the end faces of the first regions and the second regions of the third alternating conductivity type section are arranged alternately, is bonded to the innermost second region of the first alternating conductivity type section or the second alternating conductivity type section. The innermost second region of the second conductivity type of the first alternating conductivity type section or the second alternating conductivity type section is used as an equi-potential region. By electrically connecting the innermost second region and the second regions of the third section branched like comb-teeth from the innermost second region, the entire breakdown withstanding region is depleted quickly without disposing any voltage equalizing ring nor such means on the surface of the semiconductor chip.

When the pn-junctions between the first regions and the second regions of the alternating conductivity type layer in the breakdown withstanding region are serpentine, the alternating conductivity type layer in the breakdown withstanding region is depleted easily and, therefore, a high breakdown voltage is obtained, since the area ratio of the pn-junctions in the unit volume is large.

When a highly resistive region, doped with the same amounts of an impurity of the first conductivity type and an impurity of the second conductivity type, fills the space between the columnar first regions and the columnar second regions, a high breakdown voltage is obtained in the breakdown withstanding region.

The semiconductor device further includes one or more voltage equalizing rings of the second conductivity type on the first major surface and surrounding the drain drift region. Since the second regions not connected directly to the active region are connected to the second regions connected directly to the active region via the voltage equalizing rings, the second regions are released from the floating state thereof. Since the potential of the second regions is fixed at the potential of the active region, depletion layers expand uniformly into the breakdown withstanding region. Therefore, a high breakdown voltage is obtained.

When the impurity concentration in the one or more voltage equalizing rings is higher than the impurity concentration in the second region of the second conductivity type, the one or more voltage equalizing rings of the second conductivity type are not depleted and work as designed.

When at least either the first regions or the second regions of the alternating conductivity type layer in the breakdown withstanding region are unit diffusion regions scattered in the thickness direction of the semiconductor chip and spaced apart from each other, the area ratio of the pn-junctions in the unit volume is increased and a high breakdown voltage is obtained. The highly resistive region, doped with the same amounts of an impurity of the first conductivity type and an impurity of the second conductivity type, may be deemed as a composite of discontinuous infinitesimally small n-type regions and discontinuous infinitesimally small p-type regions. The highly resistive region facilitates providing the breakdown withstanding region with a high breakdown voltage.

The surrounding region of the first conductivity type, between the first major surface and the layer of the first conductivity type with low electrical resistance and surrounding the alternating conductivity type layer of the breakdown withstanding region, facilitates applying the potential of the second main electrode to the edge portion of the breakdown withstanding region, expanding depletion layers outward and preventing a leakage current from causing in the edge portion of the alternating conductivity type layer.

The method of manufacturing the semiconductor device according to a preferred embodiments forms the alternating conductivity type layers through the steps of (a) growing a highly resistive first epitaxial layer of the first conductivity type on a semiconductor substrate with low electrical resistance; (b) selectively implanting an impurity of the first conductivity type into the first epitaxial layer through first windows and selectively implanting an impurity of the second conductivity type into the first epitaxial layer through second windows, the first windows and the second windows being arranged alternately with each other and spaced apart from each other regularly; (c) growing a highly resistive second epitaxial layer of the first conductivity type on the first epitaxial layer; (d) repeating the steps (b) and (c) as many times as necessary; and (e) thermally driving the implanted impurities from the diffusion centers thereof to connect the unit diffusion regions of the same conductivity types vertically. The method, that thermally drives the impurities implanted in the epitaxial layers at once, facilitates forming the first alternating conductivity type layer and the second alternating conductivity type layer.

When the first window and the second window for forming the second alternating conductivity type layer in the breakdown withstanding region are narrower than the first window and the second window for forming the first alternating conductivity type layer in the drain drift region, or when the pitch of repeating, thereat a pair of the first window and the second window is repeated for forming the second alternating conductivity type layer in the breakdown withstanding region, is wider than the pitch of repeating, thereat a pair of the first window and the second window is repeated for forming the first alternating conductivity type layer in the drain drift region, the impurity concentrations in the second alternating conductivity type layer in the breakdown withstanding region are lower than the impurity concentrations in the first alternating conductivity type layer in the drain drift region and, therefore, a higher breakdown voltage is obtained in the breakdown withstanding region of the device.

Another method of manufacturing the semiconductor device according to a preferred embodiment of the invention forms the first alternating conductivity type layer and a second alternating conductivity type layer through the steps of (a) growing a highly resistive first epitaxial layer of the first conductivity type on a semiconductor substrate with low electrical resistance; (b) implanting an impurity of the first conductivity type into the entire surface portion of the first epitaxial layer and selectively implanting an impurity of the second conductivity type into the first epitaxial layer through windows spaced apart from each other regularly; (c) growing a highly resistive second epitaxial layer of the first conductivity type on the first epitaxial layer; (d) repeating the steps (b) and (c) as many times as necessary; and (e) thermally driving the implanted impurities such that unit diffusion regions of the second conductivity type are connected vertically. It is not necessary for this method to employ masking for selectively implanting the impurity of the first conductivity type. The impurity concentrations in the second alternating conductivity type layer of the breakdown withstanding region are almost the same with the impurity concentrations in the first alternating conductivity type layer of the drain drift region when the windows for forming the second alternating conductivity type layer in the breakdown withstanding region are narrower than the windows for forming the first alternating conductivity type layer in the drain drift region, and the pitch of repeating, thereat the windows are repeated for forming the second alternating conductivity type layer in the breakdown withstanding region, is narrower than the pitch of repeating, thereat the windows are repeated for forming the first alternating conductivity type layer in the drain drift region. This method, that sets the pitch between the windows for forming the second alternating conductivity type layer narrower than the pitch between the windows for forming the first alternating conductivity type layer, is effective to obtain a high breakdown voltage in the breakdown withstanding region, since method facilitates obtaining serpentine pn-junctions in the breakdown withstanding region or leaving the unit diffusion regions discontinuous.

Table of Reference Characters:
11: $n^+$-type drain layer
12e: Channel region
13a: Heavily doped p-type base region (p-type well)
14: $n^+$-type source region
15: Gate insulation film
16: Gate electrode layer
17: Source electrode
18: Drain electrode
19a: Interlayer insulation film
20, 120, 220, 320, 420, 500, 520, 620, 720, 820, 920: Breakdown withstanding region of the device
20a, 20aa, 20ab, 20bb, 420a, 500a, 520a, 620a, 720a, 920a: n-type region or n-type region
20b, 20ba, 22bb, 420b, 500b, 520b, 620b, 720b, 920b: p-type region or p-type region
20c: p-type voltage equalizing ring
20A, 20B, 20Bb, 20Bc: Boundary plane of the alternating conductivity type layer
22: Drain drift region
22a, 122a: n-type drift current path region
22b, 122b: p-type partition region
23: Oxide film
24, 424: n-type surrounding region with low resistance
24a: Channel stopper region
25: Peripheral electrode
26: $p^+$-type contact region
30: Highly resistive n-type epitaxial layer
32, 37: Resist mask
32a, 32b, 32c, 37a, 37b: Window for ion implantation
33: Phosphorus ions
34: Phosphorus atoms
35: Boron ions
36: Boron atoms 500c: Highly resistive region
220A,320A: First alternating conductivity type section
220B,320B: Second alternating conductivity type section
P1, P2: Pitch of repeating
$W_1 \ldots W_5$: Layer width Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of Applicants' general inventive concept. The invention is defined in the following claims.

The invention claimed is:

1. A semiconductor device comprising:
a semiconductor chip having a first major surface and a second major surface opposing the first major surface;
an active region on a side of the first major surface;
a layer of a first conductivity type on a side of the second major surface, the layer of the first conductivity type exhibiting relatively low electrical resistance;
a first main electrode electrically connected to the active region;
a second main electrode electrically connected to the layer of the first conductivity type;
a drain drift region between the active region and the layer of the first conductivity type, the drain drift region providing a vertical drift current path in the ON-state of the device and being depleted in the OFF-state of the device; and
a breakdown withstanding region around the drain drift region and between the first major surface and the layer of the first conductivity type,
wherein the breakdown withstanding region substantially does not provide any current path in the ON-state of the device and is depleted in the OFF-state of the device,
wherein the breakdown withstanding region comprises an alternating conductivity type layer comprising first regions of the first conductivity type and second regions of a second conductivity type arranged alternately with each other, and
wherein the breakdown withstanding region further includes a surrounding region of the first conductivity type extending in a thickness direction of the semiconductor chip and around the alternating conductivity type layer, wherein
the drain drift region comprises an alternating conductivity type layer comprising vertical drift current path regions of the first conductivity type and vertical partition regions of the second conductivity type, wherein the drift current path regions and the partition regions extend in the thickness direction of the semiconductor chip, wherein the drift current path regions and the partition regions are arranged alternately with each other, and wherein the width of the surrounding region is wider than the width of the drift current path region.

2. A semiconductor device comprising:
a semiconductor chip having a first major surface and a second major surface opposing the first major surface;
an active region on a side of the first major surface;
a layer of a first conductivity type on a side of the second major surface, the layer of the first conductivity type exhibiting relatively low electrical resistance;
a first main electrode electrically connected to the active region;
a second main electrode electrically connected to the layer of the first conductivity type;
a drain drift region between the active region and the layer of the first conductivity type, the drain drift region providing a vertical drift current path in the ON-state of the device and being depleted in the OFF-state of the device; and
a breakdown withstanding region around the drain drift region and between the first major surface and the layer of the first conductivity type,
wherein the breakdown withstanding region substantially does not provide any current path in the ON-state of the device and is depleted in the OFF-state of the device,
wherein the breakdown withstanding region comprises an alternating conductivity type layer comprising first regions of the first conductivity type and second regions of a second conductivity type arranged alternately with each other and
wherein the breakdown withstanding region further includes a surrounding region of the first conductivity type extending in a thickness direction of the semiconductor chip and around the alternating conductivity type layer, wherein
the drain drift region comprises an alternating conductivity type layer comprising vertical drift current path regions of the first conductivity type and vertical partition regions of the second conductivity type, wherein the drift current path regions and the partition regions extend in the thickness direction of the semiconductor chip, wherein the drift current path regions and the partition regions are arranged alternately with each other, and wherein the width of the surrounding region is wider than the spacing between the partition regions.

* * * * *